(12) United States Patent
Jinta

(10) Patent No.: US 8,436,800 B2
(45) Date of Patent: May 7, 2013

(54) SHIFT REGISTER CIRCUIT, DISPLAY PANEL, AND ELECTRONIC APPARATUS

(75) Inventor: Seiichiro Jinta, Aichi (JP)

(73) Assignee: Sony Corporation, Tokyo (JP)

( * ) Notice: Subject to any disclaimer, the term of this patent is extended or adjusted under 35 U.S.C. 154(b) by 661 days.

(21) Appl. No.: 12/379,526

(22) Filed: Feb. 24, 2009

(65) Prior Publication Data

US 2009/0251443 A1 Oct. 8, 2009

(30) Foreign Application Priority Data

Apr. 3, 2008 (JP) ................................. 2008-096716

(51) Int. Cl.
*G09G 3/30* (2006.01)
(52) U.S. Cl.
USPC .......................................................... 345/100
(58) Field of Classification Search ........................ None
See application file for complete search history.

(56) References Cited

U.S. PATENT DOCUMENTS

| | | | | |
|---|---|---|---|---|
| 7,623,110 B2 * | 11/2009 | Lee | ................ | 345/100 |
| 7,663,593 B2 * | 2/2010 | Jinta | ................ | 345/100 |
| 8,031,141 B2 * | 10/2011 | Shin | ................ | 345/76 |

FOREIGN PATENT DOCUMENTS

| | | |
|---|---|---|
| JP | 06-505605 T | 6/1994 |
| JP | 2002-335153 A | 11/2002 |
| JP | 2003-043976 A | 2/2003 |
| JP | 2003-273228 A | 9/2003 |
| JP | 2004-005904 A | 1/2004 |
| JP | 2004-226429 A | 8/2004 |
| JP | 2005-149624 | 6/2005 |
| JP | 2005-251348 A | 9/2005 |
| JP | 2006-276409 A | 10/2006 |
| JP | 2006-277789 | 10/2006 |

OTHER PUBLICATIONS

Japanese Office Action issued Mar. 2, 2010 for corresponding Japanese Application No. 2008-096716.
Japanese Office Action issued Nov. 9, 2010 for corresponding Japanese Application No. 2008-096716.

* cited by examiner

*Primary Examiner* — Joseph Haley
(74) *Attorney, Agent, or Firm* — Rader, Fishman & Grauer PLLC

(57) ABSTRACT

Disclosed herein is a shift register circuit that is formed on an insulating substrate with thin film transistors having channels of the same conductivity type and includes shift stages, each of the shift stages including: a first thin film transistor; a second thin film transistor; a 3(1)-th thin film transistor; a 3(2)-th thin film transistor; a 4(1)-th thin film transistor; a 4(2)-th thin film transistor; a fifth thin film transistor; and a sixth thin film transistor.

10 Claims, 75 Drawing Sheets k: EVEN NUMBER
N: INTEGER

FIG.19A CKA
FIG.19B CKB
FIG.19C A(1)
FIG.19D B(1)
FIG.19E out(1)
FIG.19F A(2)
FIG.19G B(2)
FIG.19H out(2)
FIG.19I A(3)
FIG.19J B(3)
FIG.19K out(3)

RELATED ART

FIG. 31
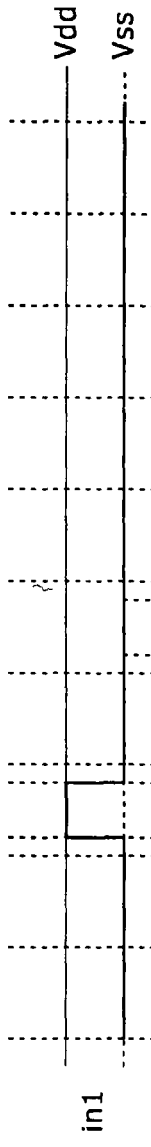
FIG.31A in1
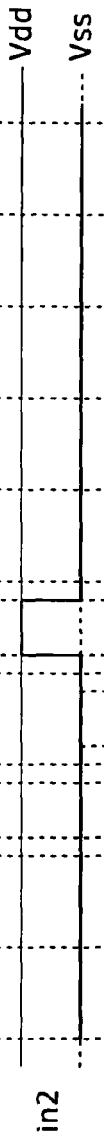
FIG.31B in2
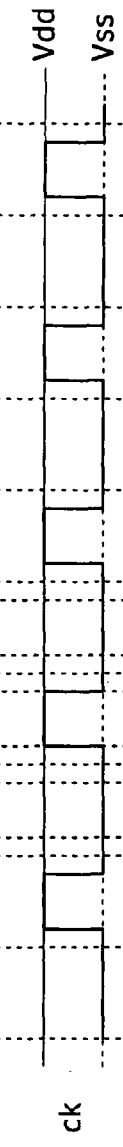
FIG.31C ck
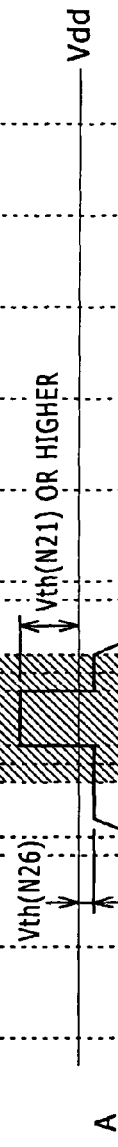
FIG.31D A
FIG.31E B
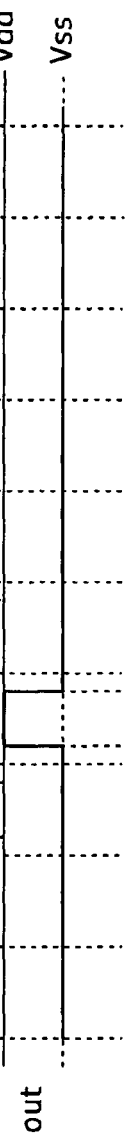
FIG.31F out FIG. 34
FIG. 34A in1
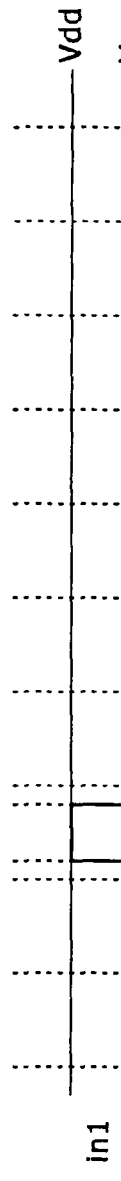
FIG. 34B in2
FIG. 34C ck
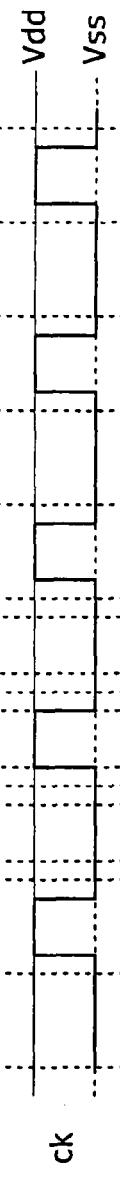
FIG. 34D A
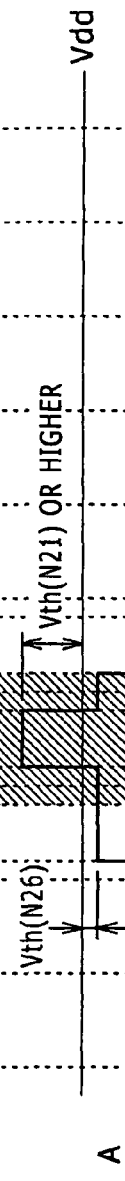
FIG. 34E B
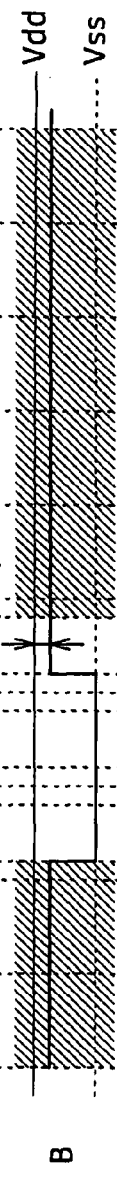
FIG. 34F out
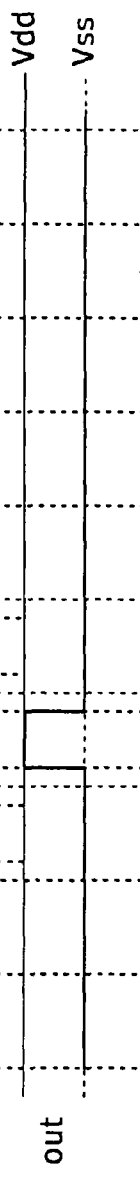

W/L(P25)>W/L(P23(1)), W/L(P23(2))

NMOS

DASHED LINE:
DOUBLE-SIDED GATE

SOLID LINE:
SINGLE-SIDED GATE

PMOS

DASHED LINE:
DOUBLE-SIDED GATE

SOLID LINE:
SINGLE-SIDED GATE

N25 HAS SINGLE-SIDED GATE STRUCTURE.
N23(1) AND N23(2) HAVE DOUBLE-SIDED GATE STRUCTURE.

P25 HAS SINGLE-SIDED GATE STRUCTURE.
P23(1) AND P23(2) HAVE DOUBLE-SIDED GATE STRUCTURE.

LDD LENGTH OF N25 < LDD LENGTH OF N23(1) AND N23(2)

$$Vin-Vth(N26)+\frac{C1+C(N21)}{C1+C(N21)+Cpa} \times (Vdd)-Vdd > Vth(N21)$$

Vin > Vth(N25)　　Vin-Vth(N26) > Vth(N23(2))
Vin > Vth(N26)　　Vin-Vth(N25) > Vth(N24(2))
Vin > Vth(N23(1))
Vin > Vth(N24(1))

NMOS

DASHED LINE:
DOUBLE-SIDED GATE

SOLID LINE:
SINGLE-SIDED GATE

PMOS

DASHED LINE:
DOUBLE-SIDED GATE

SOLID LINE:
SINGLE-SIDED GATE

FIG. 59
FIG.59A in1
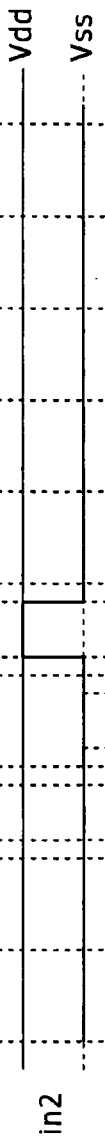
FIG.59B in2
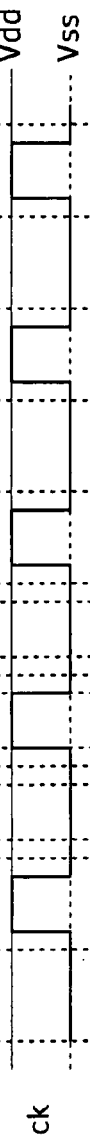
FIG.59C ck
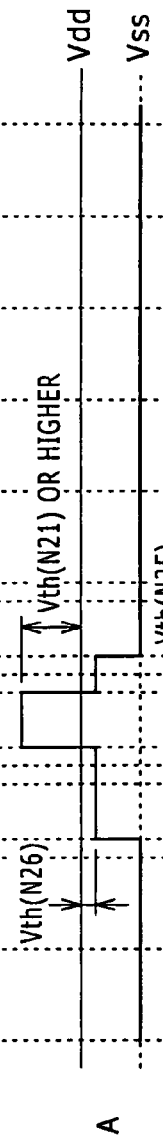
FIG.59D A
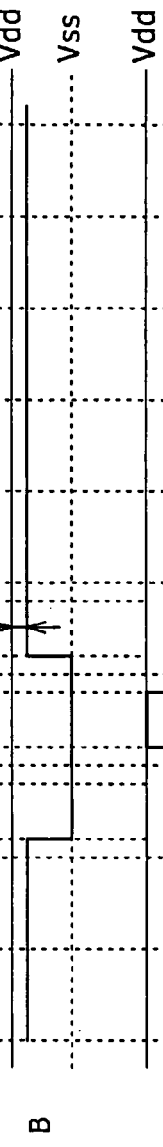
FIG.59E B
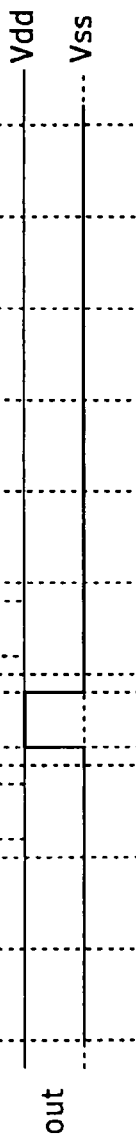
FIG.59F out

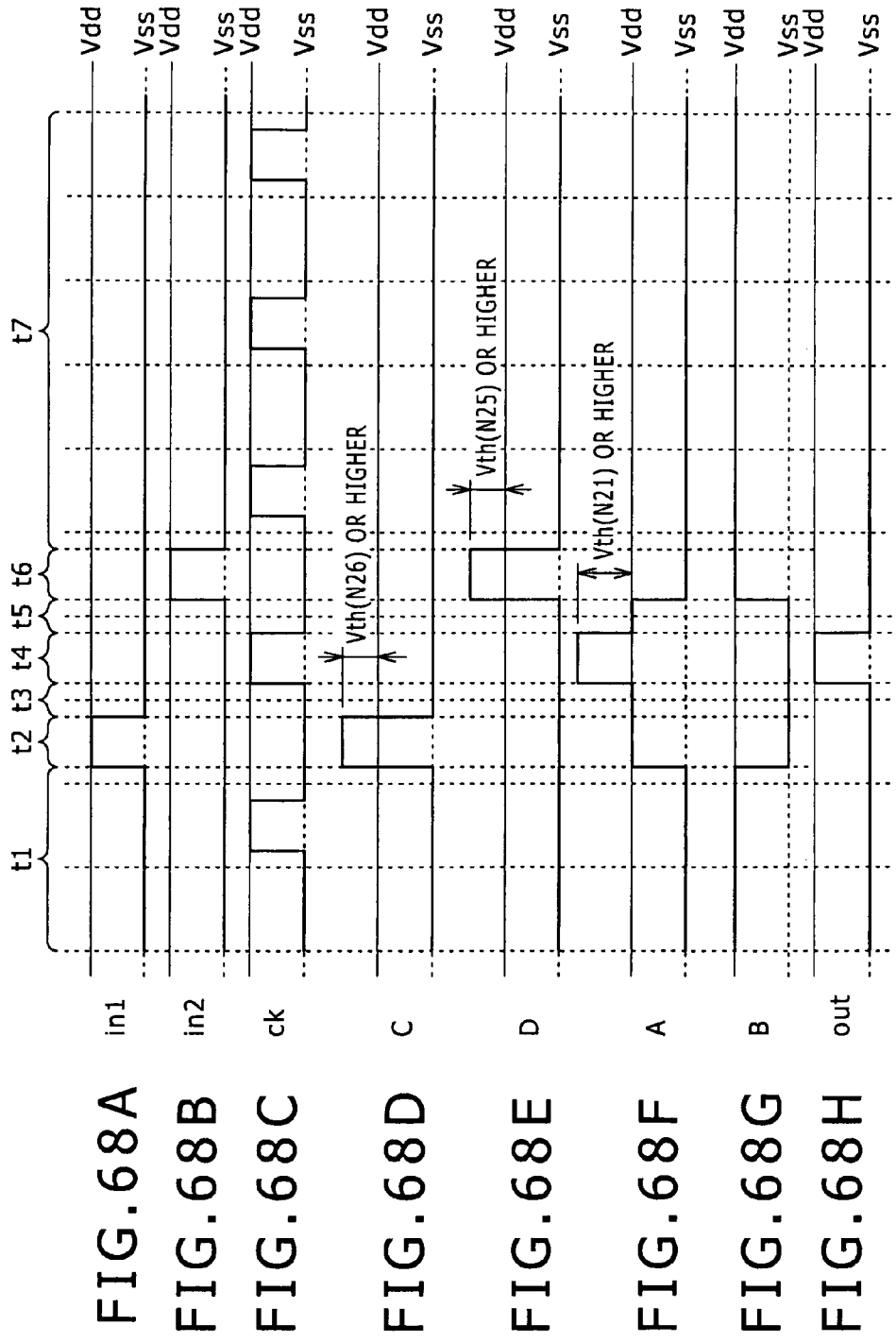

FIG.69A
Vg > Vdd + Vth(N26)
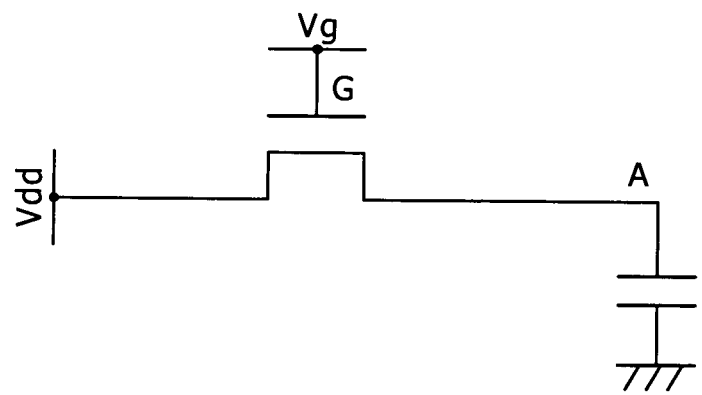
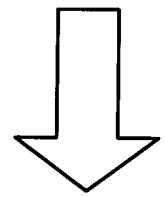
FIG.69B
Vg > Vdd + Vth(N26)
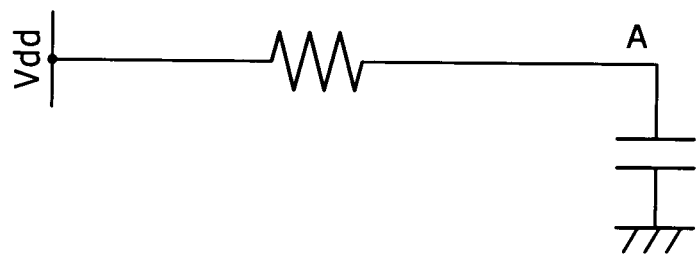

SHIFT REGISTER CIRCUIT, DISPLAY PANEL, AND ELECTRONIC APPARATUS

BACKGROUND OF THE INVENTION

1. Field of the Invention

The invention to be described in this specification relates to a shift register circuit formed on an insulating substrate with thin film transistors including channels of the same conductivity type. The invention to be described in this specification has modes as a shift register circuit, a display panel, and electronic apparatus.

2. Description of the Related Art

A low-temperature poly-silicon (LTPS) process allows circuit formation with both an NMOS thin film transistor (TFT) and a PMOS thin film transistor. Therefore, it is general to manufacture a circuit (so-called CMOS circuit) with these two kinds of thin film transistors in the low-temperature poly-silicon process.

However, the manufacturing of the CMOS circuit inevitably involves increase in the number of steps because two kinds of thin film transistors are used. This increase in the number of steps causes the lowering of the productivity and increase in the manufacturing cost.

Therefore, it is desired that, if possible, a circuit having the same functions as those of the CMOS circuit is achieved with merely thin film transistors including channels of the same conductivity type (with merely NMOS or PMOS thin film transistors) even when the poly-silicon process is used.

This kind of same-conductivity-type channel circuit can be applied also to circuit formation with amorphous silicon or an organic semiconductor.

For example, with amorphous silicon, circuits other than ones including merely NMOS thin film transistors may not be manufactured. As for the organic TFT, circuits other than ones including merely PMOS thin film transistors may not be manufactured.

Because of this background, it is desired to achieve a circuit having the same functions as those of the CMOS circuit with merely thin film transistors including channels of the same conductivity type (with merely NMOS or PMOS thin film transistors).

In this specification, attention will be paid on a shift register circuit particularly. It is obvious that the shift register circuit is a general-purpose circuit incorporated in a wide variety of circuits. Therefore, the shift register circuit is not limited to the specific application basically. However, the following description is based on the premise of application to a drive circuit for driving a display panel, for convenience.

The following description will deal with a related-art example of a shift register circuit used for an active-matrix driven organic EL (electroluminescence) panel.

FIG. 1 shows a system configuration example of an organic EL panel. In an organic EL panel 1 shown in FIG. 1, a pixel array part 3, a signal line driver 5, a first control line driver 7, and a second control line driver 9 are disposed on a panel substrate.

In the pixel array part 3, sub-pixels 11 are arranged in a matrix corresponding to the display resolution. FIGS. 2 and 3 show examples of the equivalent circuit of the sub-pixel 11. In both the circuit examples of the sub-pixel 11 shown in these diagrams, all of thin film transistors are formed of NMOS thin film transistors.

In the diagrams, N1 denotes a sampling transistor, N2 denotes a drive transistor, N3 denotes a lighting control transistor, and Cs denotes a hold capacitor. Furthermore, WSL, LSL, and PSL denote a write control line, a lighting control line, and a current supply line, respectively.

FIG. 2 corresponds to a circuit configuration in the case of employing a drive system that achieves the lighting operation and lighting-stop operation of an organic EL element OLED through the on/off-control of the lighting control transistor N3.

On the other hand, FIG. 3 corresponds to a circuit configuration in the case of employing a drive system that achieves the lighting operation and lighting-stop operation of the organic EL element OLED through potential change of the lighting control line LSL. In the configuration of FIG. 3, the lighting control line LSL functions also as the current supply line.

FIG. 4 shows a timing chart of writing of a signal potential Vsig (Data) to the sub-pixel 11 shown in FIGS. 2 and 3. FIG. 4A shows the drive waveform of a signal line DTL. The signal potential Vsig dependent on the pixel grayscale Data is supplied to the signal line DTL. The magnitude of a drive current supplied through the drive transistor N2 depends on the magnitude of the signal potential Vsig. The organic EL element OLED is a current-driven element, and larger drive current therefor provides higher luminance thereof.

FIG. 4B shows the drive waveform of the write control line WSL. During the period of the H level thereof, the sampling transistor N1 is turned on and the potential of the signal line DTL is written to the gate electrode of the drive transistor N2.

FIG. 4C shows the drive waveform of the lighting control line LSL. The lighting control line LSL is driven with binary values of the H level and the L level. By this potential switching, the lighting and lighting-stop of the organic EL element OLED are switch-controlled.

The sub-pixel 11 shown in FIG. 2 is different from that shown in FIG. 3 in the control amplitude of the lighting control line LSL. This is because it is sufficient for the lighting control line LSL to be capable of driving the lighting control transistor N3 in the circuit of FIG. 2, whereas it is necessary for the lighting control line LSL to supply the operating voltage of the drive transistor N2 and the organic EL element OLED in the circuit of FIG. 3.

As shown in FIG. 4, after the end of the writing of the signal potential Vsig, the lighting of the organic EL element OLED is achieved when the lighting control line LSL is at the H level, whereas the lighting of the organic EL element OLED is stopped when the lighting control line LSL is at the L level.

The peak luminance level can be controlled by varying the ratio (Duty) of the lighting period to the one-field period.

The lighting control line LSL (FIG. 4C) is used also for adjustment of the moving-image characteristics. For the adjustment of the moving-image characteristics, it is desired to adjust the number of times of lighting in a one-field period and the timing of the lighting period.

Therefore, it is desired for the second control line driver 9 to be capable of outputting plural kinds of pulses.

In addition, in the case of an active-matrix drive system and a general line-sequential writing system, these pulse waveforms need to be line-sequentially transferred.

That is, it is desired for this kind of control line driver to have the following two functions: the function capable of freely designing the pulse length of the control pulse; and the function capable of line-sequentially transferring the control pulse to the next stage.

In the sub-pixel 11 shown in FIGS. 2 and 3, for the above-described operation of writing the signal potential Vsig, threshold correction operation and mobility correction operation for the drive transistor N2 are carried out in some cases. FIG. 5 shows a timing chart of the sub-pixel 11 corresponding to FIG. 2. FIG. 6 shows a timing chart of the sub-pixel 11 corresponding to FIG. 3. The difference between the sub-pixel 11 shown in FIG. 2 and that shown in FIG. 3 is whether or not initialization operation and light-emission period control are separated from each other.

For the light-emission period control, operation of varying the ratio (Duty) of the light-emission period to the lighting-stop period is desired in order to adjust the peak luminance. Furthermore, for the light-emission period control, operation of changing the number of times of switching between the light-emission period and the lighting-stop period in the one-field period is desired in order to adjust the moving-image displaying characteristics. For these purposes, the circuit configuration of the second control line driver 9 is generally complex.

Therefore, the circuit configuration of FIG. 2, in which the supply line for the initialization pulse and the supply line for the lighting-period control pulse, different in the transfer timing of the output pulse, are separately provided, is advantageous in simplification of the control interface. However, as shown in FIG. 2, three control lines are desired: the write control line WSL, the lighting control line LSL, and the current supply line PSL.

In the following, the control operation of the sub-pixel 11, including the threshold correction operation, the mobility correction operation, and the light-emission period control, will be described below for the case of the pixel circuit shown in FIG. 3. Therefore, the description will be made with reference to FIG. 6.

As described above, the control operation used in the pixel circuit shown in FIG. 2 is the same as that used in the pixel circuit shown in FIG. 3 except for the separation of the initialization operation from the light-emission period control.

FIG. 6A shows the drive waveform of the write control line WSL. For example, during the period of the H level thereof, the sampling transistor N1 is turned on and the potential of the signal line DTL is written to the gate electrode of the drive transistor N2.

The first H-level period in FIG. 6 is used to correct variation in the threshold voltage Vth of the drive transistor N2.

On the other hand, the second H-level period in FIG. 6 is used to write the signal potential Vsig dependent on the pixel grayscale and correct variation in the mobility μ of the drive transistor N2.

The purpose of the inclination of the falling waveform of the pulse corresponding to the second H-level period is to set the optimum mobility correction period for all of the grayscales from the highest-luminance grayscale (highest signal potential) to the lowest-luminance grayscale (lowest signal potential).

The mobility correction refers to operation for correcting mobility difference between the drive transistor N2 having higher mobility p and the drive transistor N2 having lower mobility p, and the correction time thereof is determined depending on the length of the H-level period of the write control line WSL. As this correction period, a longer period is necessary for lower luminance (lower signal potential) in principle.

FIG. 6B shows the drive waveform of the signal line DTL. Two kinds of potentials are applied to the signal line DTL. An offset potential Vofs is used for threshold correction for the drive transistor N2. The signal potential Vsig is the potential that provides the pixel grayscale. The magnitude of the drive current supplied through the drive transistor N2 depends on the magnitude of the signal potential Vsig. The organic EL element OLED is a current-driven element, and larger drive current therefor provides higher luminance thereof.

FIG. 6C shows the drive waveform of the lighting control line LSL. The lighting control line LSL is driven with binary values of the H level and the L level. The first L-level period in FIG. 6 is used to provide an initialization period. The second L-level period in FIG. 6 is used to provide a lighting-stop period after the start of light emission.

The initialization operation is to set the gate-source voltage Vgs of the drive transistor N2 higher than the threshold voltage Vth thereof. This operation is necessary before execution of the threshold correction. Hereinafter, this operation will be referred to as the correction preparatory operation.

After the correction preparatory operation, the potential of the lighting control line LSL is switched to the H level, with the offset potential Vofs continuously applied to the gate electrode of the drive transistor N2. The operation with this potential relationship is the threshold correction operation. Upon the start of the threshold correction operation, the source potential Vs of the drive transistor N2 gradually increases. The increase in the source potential Vs stops at the timing when the gate-source voltage Vgs of the drive transistor N2 reaches the threshold voltage Vth thereof.

At the end of the writing of the signal potential Vsig, the light-emission period starts and continues until the next writing period. In the light-emission period, the lighting of the organic EL element OLED is achieved when the lighting control line LSL is at the H level, whereas the lighting of the organic EL element OLED is stopped when the lighting control line LSL is at the L level. The peak luminance level can be controlled by varying the ratio of the lighting period length in the one-field period.

FIG. 6D shows the potential Vg of the gate electrode of the drive transistor N2. FIG. 6E shows the potential Vs of the source electrode of the drive transistor N2 (the potential of the anode of the organic EL element OLED).

As described above, the pulse lengths of the write control signal (FIG. 6A) and the lighting control signal (FIG. 6C) need to differ depending on the purpose of the drive operation.

For example, for the former signal, the length of the pulse for the threshold correction operation needs to be different from that of the pulse for the signal writing and mobility correction operation. For the latter signal, the length of the pulse corresponding to the period of the correction preparatory operation needs to be different from that of the pulse for the control of lighting/lighting-stop in the light-emission period.

Therefore, it is desired for each of the first control line driver 7 and the second control line driver 9 to be capable of outputting pulses of plural lengths. In addition, in the case of an active-matrix drive system and a general line-sequential writing system, these pulse waveforms need to be line-sequentially transferred. That is, it is desired for this kind of control line driver to have the following two functions: the function capable of freely designing the pulse length of the control pulse; and the function capable of line-sequentially transferring the control pulse to the next stage.

FIG. 7 shows a structure example of a shift register circuit that is suitable for use in the control line drive circuit that satisfies the above-described drive conditions. The shift register circuit shown in FIG. 7 has a configuration obtained by cascade-connecting 2N shift stages SR(1) to SR(2N). In this shift register circuit, each shift stage carries out operation of outputting a clock signal ck1 or ck2 input thereto as an output pulse o(k) to the control line of this shift stage by using, as drive pulses, the output pulses o(k−1) and o(k+1) of other shift stages at the previous and subsequent stages.

FIG. 8 shows drive pulse waveforms of the shift register circuit. The pulse waveforms of FIG. 8 correspond to the shift register circuit formed with merely NMOS thin film transistors.

FIG. 8A shows a start pulse st for driving the first shift stage, and FIG. 8B shows an end pulse 'end' for driving the 2N-th shift stage. FIG. 8C shows the clock signal ck1 for the even-numbered shift stages.

FIG. 8D shows the clock signal ck2 for the odd-numbered shift stages. FIG. 8E shows the output pulse o1 of the first shift stage SR(1). FIG. 8F shows the output pulse o(k−1) of the (k−1)-th shift stage SR(k−1). Similarly, FIGS. 8G to 8I show the output pulses o of the shift stages corresponding to the symbols shown in the diagram.

FIG. 9 shows an internal circuit example of the k-th shift stage SR. In the circuit of FIG. 9, all of the thin film transistors included in the shift stage SR are NMOS thin film transistors. The output stage of this shift stage SR is composed of NMOS thin film transistors N11 and N12 that are connected in series to each other between a power supply VSS and a clock input terminal ck and NMOS thin film transistors N13 to N16 that form a logic gate stage. The connecting midpoint between the thin film transistors N11 and N12 is connected to an output node 'out.'

A complementary capacitor C1 is connected between the gate electrode of the thin film transistor N11 and the output terminal 'out.' This complementary capacitor C1 is a capacitor for complementing bootstrap operation, and is used if the gate capacitance of the thin film transistor N11 is insufficient. The complementary capacitor C1 is used also as a hold capacitor for a node A equivalent to the control interconnect of the thin film transistor N11.

On the other hand, a complementary capacitor C2 is connected between the gate electrode of the thin film transistor N12 and the power supply VSS. The complementary capacitor C2 serves as a hold capacitor for the potential of a node B equivalent to the control interconnect of the thin film transistor N12. The capacitance of the complementary capacitor C2 depends on the off-leakage amount of the transistor part and the holding period, and is used if the gate capacitance of the thin film transistor N12 is insufficient.

FIG. 10 shows the potential relationship among the input and output pulses, the node A, and the node B relating to the shift stage SR shown in FIG. 9. FIG. 10A shows the waveform of the drive pulse input to a first input terminal in1(k) (the output pulse out(k−1) of the previous register stage). FIG. 10B shows the waveform of the drive pulse input to a second input terminal in2(k) (the output pulse out(k+1) of the subsequent register stage).

FIG. 10C shows the waveform of the clock signal ck. FIG. 10D shows the waveform of the potential of the node A (the gate potential of the thin film transistor N11). FIG. 10E shows the waveform of the potential of the node B (the gate potential of the thin film transistor N12). FIG. 10F shows the waveform of the output pulse that appears at the output node 'out.'

As shown in FIG. 10, the potentials of the node A and the node B are switched in a complementary manner at each of the timing of the rising of the potential of the first input terminal in1(k) to the H level and the timing of the rising of the potential of the second input terminal in2(k) to the H level.

This complementary operation is achieved by the function of the logic circuit composed of the thin film transistors N13 to N16.

For example, when the first input terminal in1(k) is at the H level and the second input terminal in2(k) is at the L level, the thin film transistors N13 and N16 are in the on-state and the thin film transistors N14 and N15 are in the off-state. When the first input terminal in1(k) is at the L level and the second input terminal in2(k) is at the H level, the thin film transistors N14 and N15 are in the on-state and the thin film transistors N13 and N16 are in the off-state.

During the period when the node A is at the H level, the complementary capacitor C1 and the gate capacitor of the thin film transistor N11 are charged. Thus, if the clock signal ck is switched to the H level and Vdd appears at the output node out(k) in the period during which the node A is at the H level, the potential of the node A changes in such a manner as to be raised by the potential equal to the voltage charged in the complementary capacitor C1 and so on. At this time, a voltage equal to or higher than the threshold voltage Vth(N11) of the thin film transistor N11 is ensured as the gate-source voltage Vgs thereof due to bootstrap operation, and thus the waveform having the same amplitude as that of the clock signal ck appears at the output node out(k).

That is, the shift register circuit shown in FIG. 7 operates to extract the clock signal ck and output it from the output node sequentially from the first register stage. The periods indicated by shaded areas in the waveform diagrams of FIGS. 10D and 10E correspond to the periods during which the nodes A and B are in the floating state. The floating period of the node A is indispensable for the bootstrap operation.

Examples of documents about the related art include Japanese Patent Laid-open No. 2005-149624 and Japanese Patent Laid-open No. 2006-277789.

SUMMARY OF THE INVENTION

It can be expected that the shift stage SR having the circuit configuration shown in FIG. 9 carries out favorable shift operation basically. However, in mounting thereof, the influence of off-leakage and coupling needs to be taken into consideration. In particular, the characteristics of the thin film transistors vary on a production-by-production basis, and the variation in the characteristics is found even on the same substrate. Therefore, it is desired to achieve a shift register circuit that is capable of highly-reliable drive operation even with this kind of characteristic variation.

Some of the problems that will be involved in the shift stage having the circuit configuration shown in FIG. 9 will be exemplified below.

Initially, with use of FIGS. 11 and 12, the influence of off-leakage currents of the thin film transistors on the holding of the potentials of the nodes A and B will be described below. FIGS. 11 and 12 show the state in which the potential of the node B in the floating state gradually decreases toward the L-level potential (VSS) due to the influence of off-leakage currents that flow through the thin film transistors N13 and N15.

As shown in FIG. 12E, the potential decrease of the node B gradually progresses. If the potential of the node B becomes lower than the threshold voltage Vth(N14) of the thin film transistor N14 in this process, the operation state of the thin film transistor N14 is switched from the on-state to the off-state. The switching of the thin film transistor N14 to the off-state precludes the supply of the L-level potential (VSS) to the node A, so that the node A is also shifted to the floating state. In FIG. 12D, the floating state of the node A arising due to the leakage currents is indicated by darker shaded areas.

If the node A becomes the floating state in this manner, the following phenomenon occurs. Specifically, as shown in FIG. 13, the clock signal ck that should not be used for this shift stage comes in the node A through the diffusion capacitance (coupling capacitance) of the transistor N11, and fluctuates the potential of the node A toward the H level. This phenomenon will be described below with reference to FIG. 14. FIGS. 14A to 14F correspond to FIGS. 12A to 12F, respectively.

In the period during which the node A is in the floating state, pulse-like potential fluctuations occur at the node A as shown by the arrowheads of FIG. 14D. If the amount of this potential change of the node A is even slightly larger than the threshold voltage Vth(N11) of the thin film transistor N11, the thin film transistor N11 is turned on. That is, erroneous operation occurs. As a result, as shown in FIG. 14F, a false pulse waveform appears at the output node 'out' in a period different from the period of the clock signal ck that should be output originally. This false pulse waveform possibly causes erroneous transferring in the shift register circuit.

The change in the node potential due to off-leakage will occur also at the node A. FIGS. 15 and 16 show the state in which the potential of the node A in the floating state is lowered toward the L-level potential VSS due to the influence of off-leakage currents that flow through the thin film transistors N14 and N16.

As shown in FIG. 16D, the occurrence of this kind of off-leakage precludes the bootstrap operation of the node A. This results in insufficiency in the gate voltage of the thin film transistor N11, and hence a problem that the output pulse having the maximum amplitude may not be obtained as shown in FIG. 16F. The waveforms shown in FIGS. 16A to 16F correspond to those shown in FIGS. 12A to 12F, respectively.

For the shift stage SR having the circuit configuration shown in FIG. 9, anti-load countermeasures specific to the connection structure of the shift register circuit are also desired.

As shown in FIG. 17, the output pulse of the shift stage SR needs to drive not merely the control line corresponding to this shift stage SR (e.g. the write control line WSL, the lighting control line LSL) but also the first input terminal in1 of the subsequent shift stage SR and the second input terminal in2 of the previous shift stage SR.

FIG. 18 shows drive pulse waveforms of the shift register circuit. FIG. 18A shows a clock signal CKA for the odd-numbered shift stages. FIG. 18B shows a clock signal CKB for the even-numbered shift stages. FIG. 18C shows a start pulse ST for driving the first shift stage, and FIG. 18D shows an output pulse o1 of the first shift stage SR(1). FIG. 18E shows an output pulse o2 of the second shift stage SR(2). FIG. 18F shows an output pulse oE of the final shift stage SR(E). FIG. 18G shows an end pulse END for driving the final shift stage.

As above, each shift stage SR is desired to drive both the node B of the previous shift stage and the node A of the subsequent shift stage, in addition to the control line corresponding to this shift stage SR.

This characteristic is shown in FIG. 19. FIG. 19 shows the relationship among the internal potentials of the shift stages from the first shift stage to the third shift stage.

FIG. 19A shows the clock signal CKA for the odd-numbered shift stages. FIG. 19B shows the clock signal CKB for the even-numbered shift stages.

FIGS. 19C, 19D, and 19E show the waveforms of the potential of the node A, the potential of the node B, and the output pulse, respectively, of the first shift stage. FIGS. 19F, 19G, and 19H show the waveforms of the potential of the node A, the potential of the node B, and the output pulse, respectively, of the second shift stage.

FIGS. 19I, 19J, and 19K show the waveforms of the potential of the node A, the potential of the node B, and the output pulse, respectively, of the third shift stage.

As shown by the arrowheads in FIG. 19, the output pulse of the second shift stage (FIG. 19H) is used to charge the node B of the first shift stage and the node A of the third shift stage to the H level.

Specifically, the output pulse is used to charge the interconnect capacitors of the nodes A and B. Therefore, the clock signal CK is desired to have such drive ability as to drive this high load capacitance. Specifically, it is desired to increase the size of the buffer circuit that supplies the clock signal.

However, the enhancement in the drive ability causes increase in the power consumption and narrowing of the drive margin at high frequencies.

As described above, the technical problems that should be solved still remain in the shift stage that has been proposed as the related art.

To address the problems, the present inventors propose a shift register circuit having a shift stage that allows elimination of at least one of these technical problems.

(A) Shift Register Circuit (A-1) First Solution

The present inventors propose to employ the following structures for each of shift stages that are cascade-connected in a shift register circuit formed on an insulating substrate with thin film transistors having channels of the same conductivity type.

(a) a first thin film transistor configured to have one main electrode connected to a clock input terminal and the other main electrode connected to an output terminal;

(b) a second thin film transistor configured to have one main electrode connected to the output terminal and the other main electrode connected to a first power supply;

(c) a 3(1)-th thin film transistor configured to have one main electrode connected to the first power supply and the other main electrode connected to the control interconnect of the second thin film transistor;

(d) a 3(2)-th thin film transistor configured to have one main electrode connected to the first power supply, the other main electrode connected to the control interconnect of the second thin film transistor, and a control electrode connected to the control interconnect of the first thin film transistor;

(e) a 4(1)-th thin film transistor configured to have one main electrode connected to the first power supply and the other main electrode connected to the control interconnect of the first thin film transistor;

(f) a 4(2)-th thin film transistor configured to have one main electrode connected to the first power supply, the other main electrode connected to the control interconnect of the first thin film transistor, and a control electrode connected to the control interconnect of the second thin film transistor;

(g) a fifth thin film transistor configured to have one main electrode connected to a second power supply, the other main electrode connected to the control interconnect of the second thin film transistor, and a control electrode connected to the control interconnect of the 4(1)-th thin film transistor and a second input terminal; and (h) a sixth thin film transistor configured to have one main electrode connected to the second power supply, the other main electrode connected to the control interconnect of the first thin film transistor, and a control electrode connected to the control interconnect of the 3(1)-th thin film transistor and a first input terminal.

In the shift stage according to this solution, drive signals are coupled to merely the control terminal of the 3(1)-th thin film transistor, the control terminal of the 4(1)-th thin film transistor, the control terminal of the fifth thin film transistor, and the control terminal of the sixth thin film transistor. That is, it is sufficient for the drive signals to have an ability to drive the load capacitors of the control terminals. Because the capacitance of the load capacitors that should be driven is low, a shift register circuit that allows high-frequency driving and reduction in the power consumption simultaneously can be achieved.

Furthermore, in the shift stage according to this solution, the 3(1)-th thin film transistor and the 4(1)-th thin film transistor act to promote switching of the control potentials of the first thin film transistor and the second thin film transistor.

In addition, in the shift stage according to this solution, the 3(2)-th thin film transistor and the 4(2)-th thin film transistor act to hold the control potentials of the first thin film transistor and the second thin film transistor.

These operations are effective for prevention of leakage in a bootstrap period and reduction in through-current. The reduction in through-current is effective also for achievement of high-frequency driving and lower power consumption.

(A-2) Second Solution

The present inventors propose to set the signal amplitude of a start pulse and an end pulse smaller than that of a clock signal output from the output terminal of each of the shift stages, if the following connection forms (a) to (c) are employed for the shift register circuit according to the first solution.

(a) for each of the shift stages included in the shift register circuit except for the first shift stage and the final shift stage, the output terminal of the previous shift stage is connected to the first input terminal and the output terminal of the subsequent shift stage is connected to the second input terminal.
(b) the start pulse is input to the first input terminal of the first shift stage.
(c) the end pulse is input to the second input terminal of the final shift stage.

In this manner, this solution achieves a decrease in the amplitude of the start pulse and the end pulse by utilizing the bootstrap operation of the shift stage. The decrease in the amplitude of the drive pulses allows reduction in the power consumption.

(A-3) Third Solution

The present inventors propose a structure in which control electrodes are formed on both the sides of a channel layer in the first thin film transistor in the shift register circuit according to the second solution.

In this structure, the gate capacitance of the first thin film transistor is increased, which can enhance the bootstrap gain. This allows a corresponding further decrease in the amplitude of the start pulse and the end pulse.

(A-4) Fourth Solution

Furthermore, the present inventors propose a structure in which W/L (W denotes the channel width and L denotes the channel length) of the fifth thin film transistor is equal to or larger than W/L of the 3(1)-th and 3(2)-th thin film transistors in the shift register circuit according to the above-described solution.

In this structure, the off-leakage amount of the fifth thin film transistor is relatively larger than that of the 3(1)-th and 3(2)-th thin film transistors. The fifth thin film transistor is connected to the second power supply, which supplies the same potential as the potential that should be held. Thus, potential change of the control interconnect, which causes erroneous operation, can be minimized even when characteristic variation remains.

(A-5) Fifth Solution

In another structure proposed by the present inventors, in the shift register circuit according to the above-described solution, the control electrode is formed on merely one side of a channel layer in the fifth thin film transistor. On the other hand, control electrodes are formed on both the sides of a channel layer in each of the 3(1)-th and 3(2)-th thin film transistors.

In this structure, the off-leakage amount of the fifth thin film transistor is relatively larger than that of the 3(1)-th and 3(2)-th thin film transistors. The fifth thin film transistor is connected to the second power supply, which supplies the same potential as the potential that should be held. Thus, potential change of the control interconnect, which causes erroneous operation, can be minimized even when characteristic variation remains.

(A-6) Sixth Solution

In another structure proposed by the present inventors, in the shift register circuit according to the above-described solution, the source-shield length of the fifth thin film transistor is smaller than that of the 3(1)-th and 3(2)-th thin film transistors.

In this structure, the off-leakage amount of the fifth thin film transistor is relatively larger than that of the 3(1)-th and 3(2)-th thin film transistors. The fifth thin film transistor is connected to the second power supply, which supplies the same potential as the potential that should be held. Thus, potential change of the control interconnect, which causes erroneous operation, can be minimized even when characteristic variation remains.

(A-7) Seventh Solution

In another structure proposed by the present inventors, in the shift register circuit according to the above-described solution, the length of a lightly doped drain (LDD) region of the fifth thin film transistor is smaller than the length of an LDD region of the 3(1)-th and 3(2)-th thin film transistors.

In this structure, the off-leakage amount of the fifth thin film transistor is relatively larger than that of the 3(1)-th and 3(2)-th thin film transistors. The fifth thin film transistor is connected to the second power supply, which supplies the same potential as the potential that should be held. Thus, potential change of the control interconnect, which causes erroneous operation, can be minimized even when characteristic variation remains.

(A-8) Eighth Solution

Furthermore, the present inventors propose to employ the following connection forms (a) and (b) for the shift register circuit according to the first solution.

(a) a start pulse is input to the first input terminal of the first shift stage of the shift stages, and the first input terminal of each of the shift stages except the first shift stage is connected to the output terminal of the previous shift stage.
(b) two kinds of clock signals having phases adjacent to each other, of three kinds of clock signals having phases different from each other, are supplied to the clock input terminal and the second input terminal of each of the shift stages in such a way that the phase combination of these two kinds of clock signals is cyclically shifted on a stage-by-stage basis.

The shift register circuit according to this solution operates based on three kinds of clocks. In this case, the interconnects among the shift stages can be simplified. Furthermore, because the drive pulse is periodically input to the second input terminal, the period during which the control potential of the second thin film transistor is in the floating state can be shortened. This is effective for enhancement in the operation reliability.

(A-9) Ninth Solution

Furthermore, the present inventors propose to employ the following structures for each of shift stages that are cascade-connected in a shift register circuit formed on an insulating substrate with thin film transistors having channels of the same conductivity type.

(a) a first thin film transistor configured to have one main electrode connected to a clock input terminal and the other main electrode connected to an output terminal;
(b) a second thin film transistor configured to have one main electrode connected to the output terminal and the other main electrode connected to a first power supply;
(c) a 3(1)-th thin film transistor configured to have one main electrode connected to the first power supply, the other main electrode connected to the control interconnect of the second thin film transistor, and a control electrode connected to a first input terminal;
(d) a 3(2)-th thin film transistor configured to have one main electrode connected to the first power supply, the other main electrode connected to the control interconnect of the second thin film transistor, and a control electrode connected to the control interconnect of the first thin film transistor;
(e) a 4(1)-th thin film transistor configured to have one main electrode connected to the first power supply, the other main electrode connected to the control interconnect of the first thin film transistor, and a control electrode connected to a second input terminal;
(f) a 4(2)-th thin film transistor configured to have one main electrode connected to the first power supply, the other main electrode connected to the control interconnect of the first thin film transistor, and a control electrode connected to the control interconnect of the second thin film transistor;
(g) a fifth thin film transistor configured to have one main electrode connected to the second power supply and the other main electrode connected to the control interconnect of the second thin film transistor;
(h) a sixth thin film transistor configured to have one main electrode connected to the second power supply and the other main electrode connected to the control interconnect of the first thin film transistor;
(i) a seventh thin film transistor configured to have one main electrode connected to the control interconnect of the fifth thin film transistor, the other main electrode connected to the second input terminal, and a control electrode connected to the second power supply; and
(j) an eighth thin film transistor configured to have one main electrode connected to the control interconnect of the sixth thin film transistor, the other main electrode connected to the first input terminal, and a control electrode connected to the second power supply.

In the shift stage according to this solution, the control electrodes of the first and second thin film transistors can be rapidly charged due to the bootstrap operation of the control electrodes of the fifth and sixth thin film transistors. This makes it possible to enhance the drive frequency.

Furthermore, the start potentials in the bootstrap operation of the first and second thin film transistors can be set higher than those in the first solution in the case of an NMOS-type shift stage, and can be set lower than those in the first solution in the case of a PMOS-type shift stage. Thus, the necessary bootstrap amount can be decreased. This allows reduction in the capacitance of the capacitor for complementing bootstrap operation and is effective for decreasing the layout area.

(A-10) Tenth Solution

Furthermore, the present inventors propose to employ the following structures for each of shift stages that are cascade-connected in a shift register circuit formed on an insulating substrate with thin film transistors having channels of the same conductivity type.
(a) a first thin film transistor configured to have one main electrode connected to a clock input terminal and the other main electrode connected to an output terminal;
(b) a second thin film transistor configured to have one main electrode connected to the output terminal and the other main electrode connected to a first power supply;
(c) a third thin film transistor configured to have one main electrode connected to the first power supply and the other main electrode connected to the control interconnect of the second thin film transistor;
(d) a fourth thin film transistor configured to have one main electrode connected to the first power supply, the other main electrode connected to the control interconnect of the first thin film transistor, and a control electrode connected to the control interconnect of the second thin film transistor;
(e) a fifth thin film transistor configured to have one main electrode connected to the second power supply, the other main electrode connected to the control interconnect of the second thin film transistor, and a control electrode connected to a second input terminal; and
(f) a sixth thin film transistor configured to have one main electrode connected to the second power supply, the other main electrode connected to the control interconnect of the first thin film transistor, and a control electrode connected to the control interconnect of the third thin film transistor and a first input terminal.

In the shift stage according to this solution, drive signals are coupled to merely the control terminal of the third thin film transistor, the control terminal of the fifth thin film transistor, and the control terminal of the sixth thin film transistor. That is, it is sufficient for the drive signals to have an ability to drive the load capacitors of the control terminals. Because the capacitance of the load capacitors that should be driven is low, a shift register circuit that allows high-frequency driving and reduction in the power consumption simultaneously can be achieved.

(A-11) Eleventh Solution

Furthermore, the present inventors propose to employ the following structures for each of shift stages that are cascade-connected in a shift register circuit formed on an insulating substrate with thin film transistors having channels of the same conductivity type.
(a) a first thin film transistor configured to have one main electrode connected to a clock input terminal and the other main electrode connected to an output terminal;
(b) a second thin film transistor configured to have one main electrode connected to the output terminal and the other main electrode connected to a first power supply;
(c) a third thin film transistor configured to have one main electrode connected to the first power supply, the other main electrode connected to the control interconnect of the second thin film transistor, and a control electrode connected to the control interconnect of the first thin film transistor;
(d) a fourth thin film transistor configured to have one main electrode connected to the first power supply, the other main electrode connected to the control interconnect of the first thin film transistor, and a control electrode connected to the control interconnect of the second thin film transistor;
(e) a fifth thin film transistor configured to have one main electrode connected to the second power supply, the other main electrode connected to the control interconnect of the second thin film transistor, and a control electrode connected to a second input terminal; and
(f) a sixth thin film transistor configured to have one main electrode connected to the second power supply, the other main electrode connected to the control interconnect of the first thin film transistor, and a control electrode connected to a first input terminal.

In the shift stage according to this solution, drive signals are coupled to merely the control terminal of the fifth thin film transistor and the control terminal of the sixth thin film transistor. That is, it is sufficient for the drive signals to have an ability to drive the load capacitors of the control terminals. Because the capacitance of the load capacitors that should be driven is low, a shift register circuit that allows high-frequency driving and reduction in the power consumption simultaneously can be achieved.

In addition, in the shift stage according to this solution, the third thin film transistor and the fourth thin film transistor act to hold the potentials of the control interconnects of the first thin film transistor and the second thin film transistor. This operation is effective for prevention of leakage in a bootstrap period and can enhance the stability of the operation.

(A-12) Twelfth Solution

Moreover, the present inventors propose that the respective shift register circuits according to the above-described solutions are incorporated in a display panel as at least a part of a drive circuit included in the display panel.

In addition, the present inventors propose electronic apparatus including a display panel having this kind of drive circuit. The electronic apparatus includes the display panel, a system controller that controls the operation of the entire system, and an operation input unit that accepts an operation input to the system controller.

The above-described shift register circuits based on thin film transistors with channels of the same conductivity type are less susceptible to the influence of characteristic variation due to manufacturing variation and allow higher-speed operation and lower power consumption compared with the related-art circuit.

BRIEF DESCRIPTION OF THE DRAWINGS

FIG. 31 is a diagram showing drive waveforms of the shift stage shown in FIG. 30;

FIG. 34 is a diagram showing drive waveforms of the shift stage shown in FIG. 33;

FIG. 59 is a diagram showing drive waveforms of a shift stage when the connection form shown in FIG. 57 is employed (NMOS type);

FIG. 64 is a diagram showing an equivalent circuit when the thin film transistor connected to first and second input terminals is turned on;

FIG. 68 is a diagram showing drive waveforms of the shift stage shown in FIG. 67;

FIGS. 69A and 69B are diagrams showing an equivalent circuit when the thin film transistor connected to first and second input terminals in the shift stage of FIG. 67 is turned on;

DETAILED DESCRIPTION OF THE PREFERRED EMBODIMENTS

The following description will deal with an example in which an embodiment of the present invention proposed by this specification is applied to a drive circuit in an active-matrix driven display panel.

Well-known or publicly-known techniques in the related-art technical field are applied to part that is not particularly illustrated or described in the present specification.

It should be noted that the form examples to be described below is merely one embodiment example of the present invention and the present invention is not limited thereto.

(A) System Configuration of Display Panel

Figure 1:
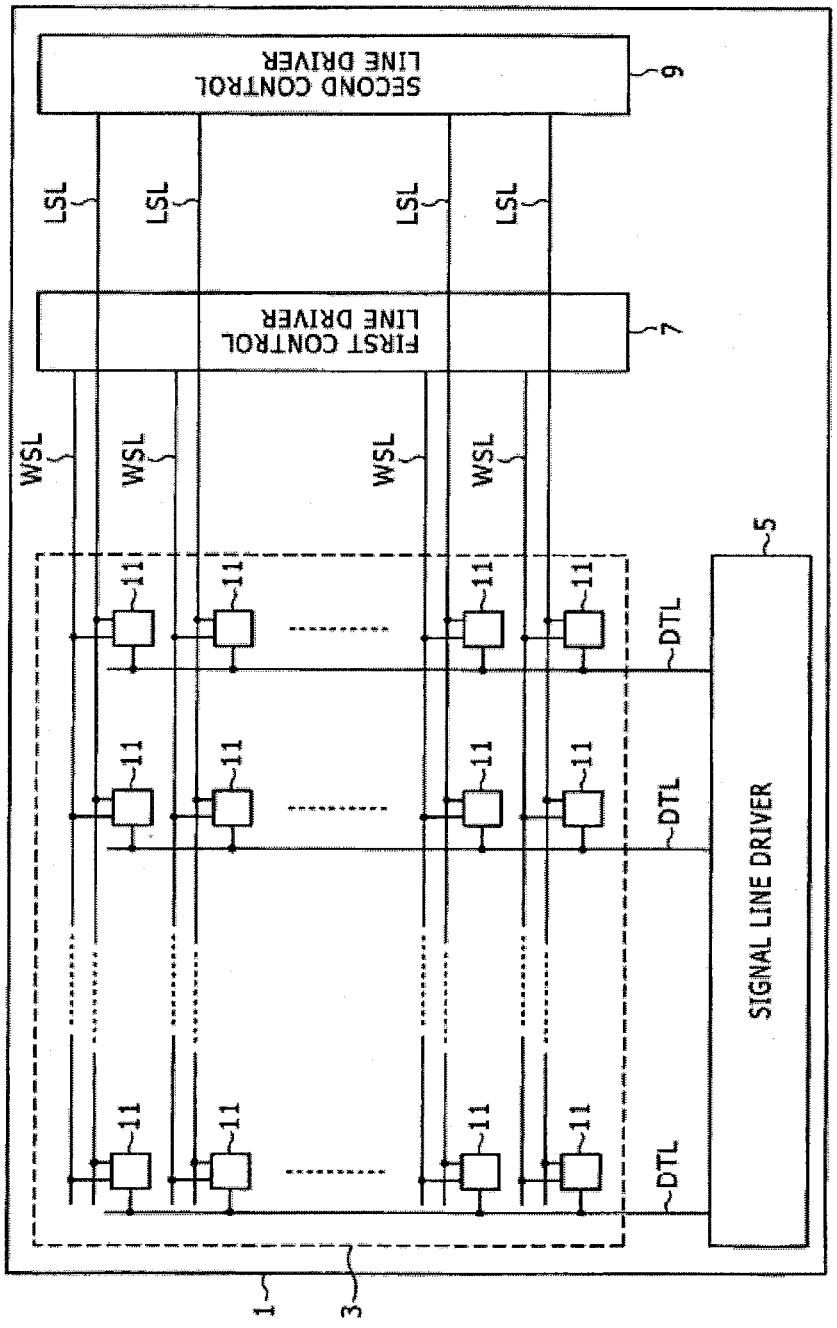
FIG. 1 is a diagram showing a system configuration example of an organic EL panel.
Figure 20:
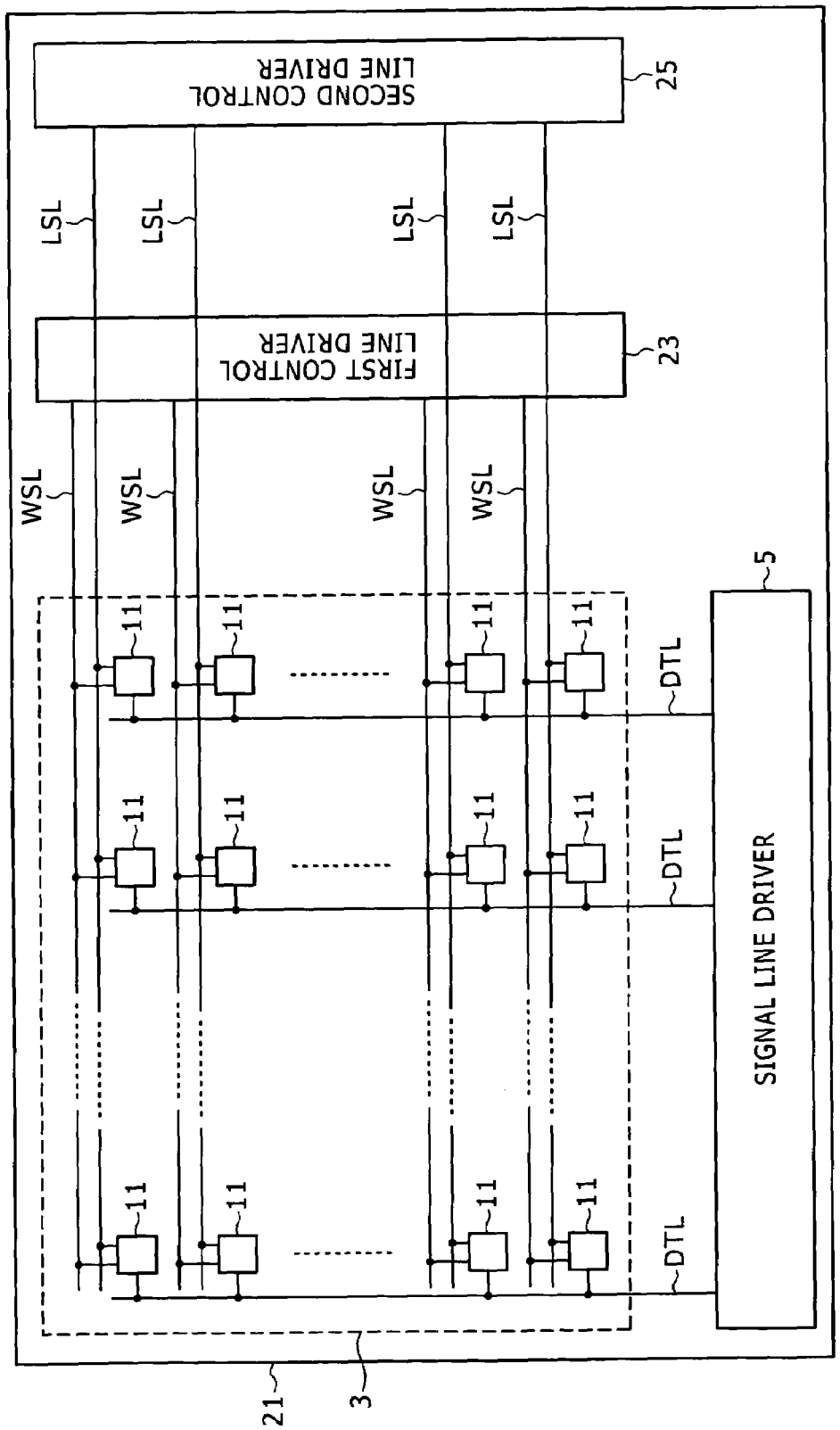
FIG. 20 is a diagram showing a system configuration example of an organic EL panel according to a form example.

The following form example relates to an organic EL panel. FIG. 20 shows a system configuration example of an organic EL panel according to the form example. The same parts in FIG. 20 as those in FIG. 1 are given the same numerals and symbols.

An organic EL panel 21 according to the form example includes a pixel array part 3, a signal line driver 5, a first control line driver 23, and a second control line driver 25 on a panel substrate.

Figure 21:
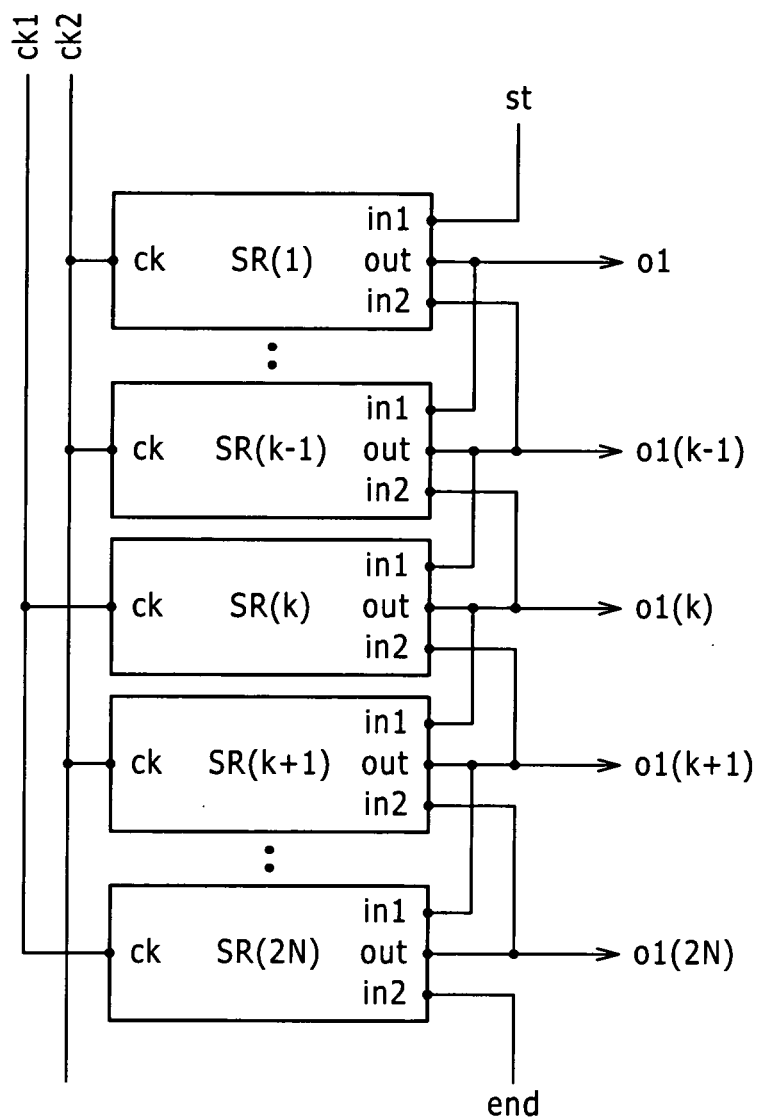
FIG. 21 is a diagram showing one example of the connection form of a shift register circuit according to the form example.

A shift register circuit that transfers a drive pulse in the vertical direction of the display panel is used for the first and second control line drivers 23 and 25 according to the form example. FIG. 21 shows the basic circuit configuration of the shift register circuit used for the control line drivers.

In this shift register circuit, each shift stage operates to extract a clock signal ck1 or ck2 input thereto at a predetermined timing by use of the output pulses of the previous and subsequent shift stages as drive pulses. In the case of the shift register circuit shown in FIG. 21, input of a start pulse st to the first shift stage and input of an end pulse 'end' to the final shift stage are necessary.

(B) Configuration Example of Shift Register Circuit

The following description will deal with two cases: the case in which the shift register circuit proposed by the present inventors is formed with merely NMOS thin film transistors; and the case in which it is formed with merely PMOS thin film transistors. The connection relationship among the respective thin film transistors is the same between these two cases, irrespective of the difference in the conductivity type of the semiconductor serving as the channel. However, the potential relationship of the drive waveforms and the input/output waveforms is reversed between these two cases.

(B-1) First Form Example of Shift Stage (a) NMOS type

Figure 22:
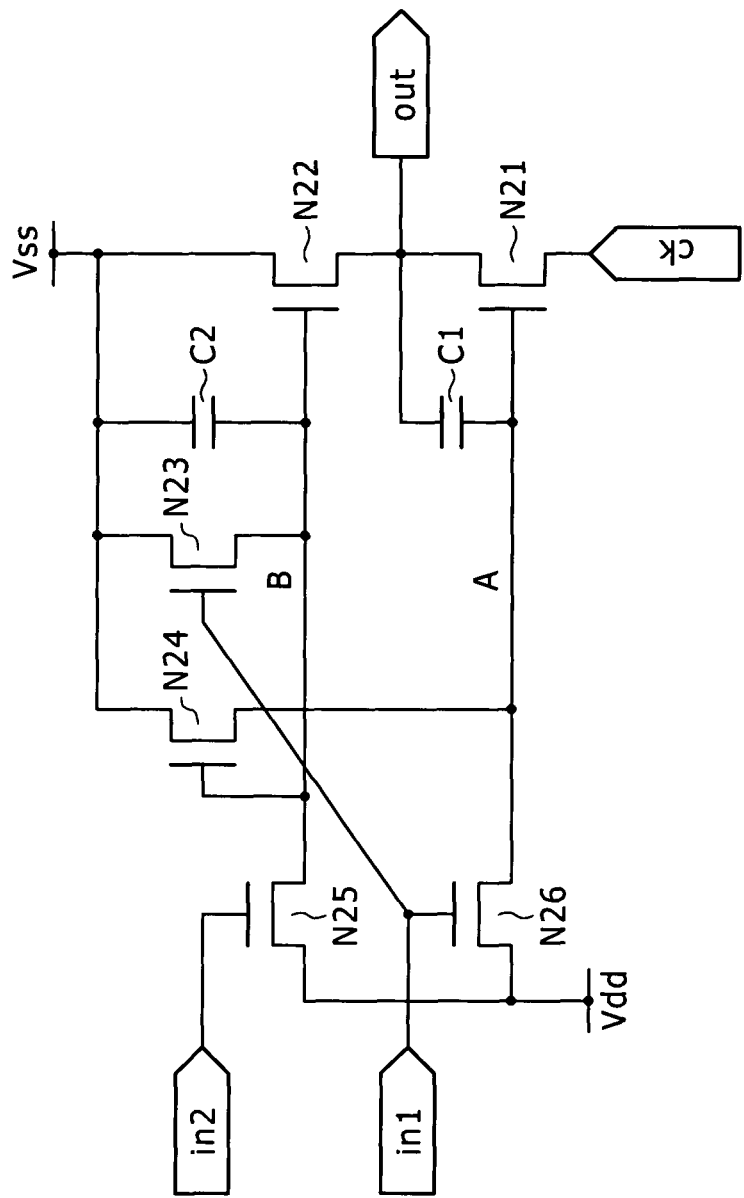
FIG. 22 is a diagram showing a form example of a shift stage (NMOS type)
Figure 23:
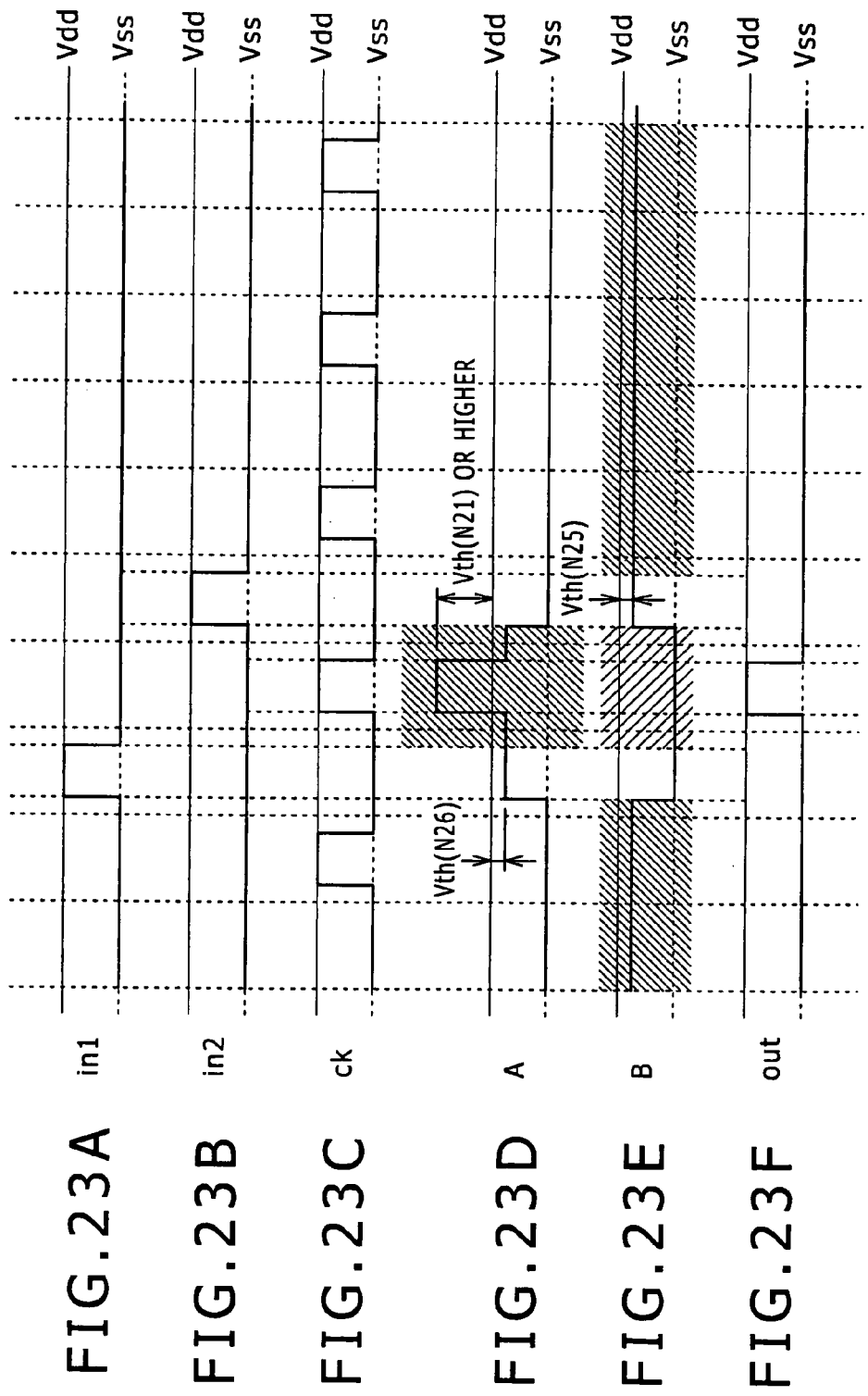
FIG. 23 is a diagram showing drive waveforms of the shift stage shown in FIG. 22.

FIG. 22 shows a first form example of the shift stage included in the shift register circuit. FIG. 23 shows the corresponding drive waveforms.

The shift stage shown in FIG. 22 is composed of an output stage including thin film transistors N21 and N22 and a logic gate stage including thin film transistors N23 to N26. This form example is defined by the logic gate stage, which drives the output stage.

Initially, the configuration of the output stage will be described below. The output stage is composed of the thin film transistors N21 and N22 that are connected in series to each other between a first power supply (lower potential VSS)

and a clock input terminal CK. The connecting midpoint between the thin film transistors N21 and N22 serves as an output node OUT.

To the clock input terminal CK, the clock signal ck1 or ck2 of FIG. 21 is supplied depending on the position of the shift stage. The potential of the clock signal is either the lower potential VSS or a higher potential Vdd.

In this form example, a complementary capacitor C1 is connected between the gate electrode of the thin film transistor N21 and the output node OUT. This complementary capacitor C1 is a capacitor for complementing bootstrap operation, and is used if the gate capacitance of the thin film transistor N21 is insufficient. The complementary capacitor C1 is used also as a hold capacitor for a node A.

On the other hand, a complementary capacitor C2 is connected between the gate electrode of the thin film transistor N22 and the first power supply (VSS). The complementary capacitor C2 is a hold capacitor for the potential of a node B. The capacitance of the complementary capacitor C2 depends on the off-leakage amount of the thin film transistor N22 and the potential holding period, and is used if the gate capacitance of the thin film transistor N22 is insufficient.

Next, the configuration of the logic gate stage will be described below. The logic gate stage is composed of the thin film transistors N23 to N26.

For the thin film transistor N23, one main electrode thereof is connected to the first power supply (lower potential VSS), and the other main electrode thereof is connected to the control interconnect of the thin film transistor N22 (i.e. to the node B).

The gate electrode of the thin film transistor N23 is connected also to a first input terminal in1. This connection allows the thin film transistor N23 to carry out operation of supplying the lower potential VSS to the node B during the period when the first input terminal in1 is at the H level.

For the thin film transistor N24, one main electrode thereof is connected to the first power supply (lower potential VSS), and the other main electrode thereof is connected to the control interconnect of the thin film transistor N21 (i.e. to the node A). The gate electrode of the thin film transistor N24 is connected to the control interconnect of the thin film transistor N22 (i.e. to the node B). This connection allows the thin film transistor N24 to carry out operation of supplying the lower potential VSS to the node A during the period when the node B is at the H level.

For the thin film transistor N25, one main electrode thereof is connected to a second power supply (higher potential Vdd), and the other main electrode thereof is connected to the control interconnect of the thin film transistor N22 (i.e. to the node B). The gate electrode of the thin film transistor N25 is connected to a second input terminal in2. This connection allows the thin film transistor N25 to carry out operation of supplying the higher potential Vdd to the node B during the period when the second input terminal in2 is at the H level.

For the thin film transistor N26, one main electrode thereof is connected to the second power supply (higher potential Vdd), and the other main electrode thereof is connected to the control interconnect of the thin film transistor N21 (i.e. to the node A). The gate electrode of the thin film transistor N26 is connected to the gate electrode of the thin film transistor N23 and the first input terminal in1. This connection allows the thin film transistor N26 to carry out operation of supplying the higher potential Vdd to the node A during the period when the first input terminal in1 is at the H level.

FIG. 23 shows the drive waveforms of the shift stage according to this form example. FIG. 23A shows the input waveform of the first input terminal in1. FIG. 23B shows the input waveform of the second input terminal in2. FIG. 23C shows the input waveform of the clock signal ck. FIG. 23D shows the drive waveform of the node A. FIG. 23E shows the drive waveform of the node B. FIG. 23F shows the signal waveform of the output pulse that appears at the output node OUT.

As shown in FIG. 23, at the timing when the H-level potential is input to the first input terminal in1, the potential of the node A rises up to the H level (=the higher potential Vdd−Vth (N26)) and the potential of the node B falls down to the L level (=the lower potential VSS). This turns the thin film transistor N21 to the state of being capable of capturing the clock signal. During the period when the first input terminal in1 is at the H level, the gate capacitor of the thin film transistor N21 and the complementary capacitor C1 are charged. Therefore, also after the potential of the first input terminal in1 has fallen down to the L level, the node A and the node B keep the potentials held immediately before this potential falling of the first input terminal in1, in the floating state.

If the clock signal is input in this state, the potential of the node A is raised by bootstrap operation as shown in FIG. 23D. As a result, the higher potential Vdd, which is the same as the potential of the clock signal, appears at the output node OUT. The floating state of the nodes A and B is continued until the H-level potential is input to the second input terminal in2.

Upon the input of the H-level potential to the second input terminal in2, the potential of the node B rises up to the H level (the higher potential Vdd−Vth(N25)). In linkage with this potential change of the node B, the thin film transistor N24 is switched to the on-state, so that the potential of the node A is forcibly lowered to the L level (lower potential VSS).

Figure 9:
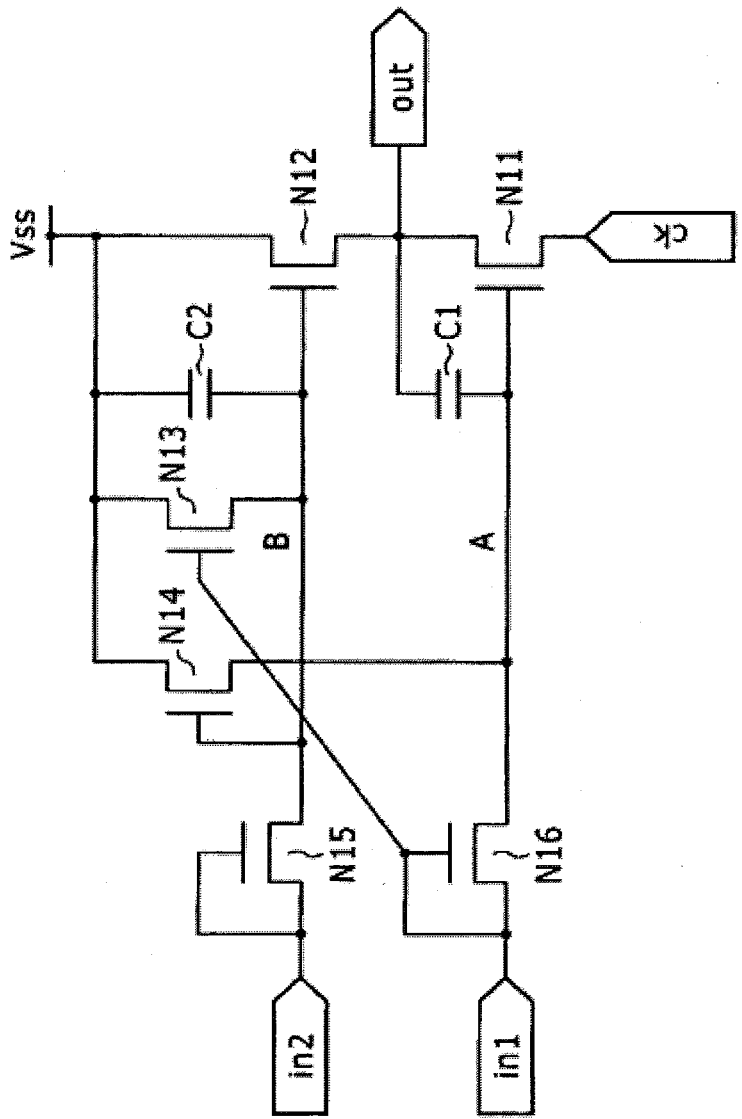
FIG. 9 is a diagram for explaining the internal structure of a shift stage with a bootstrap function.
Figures 10A, 10B, 10C, 10D, 10E, 10F:
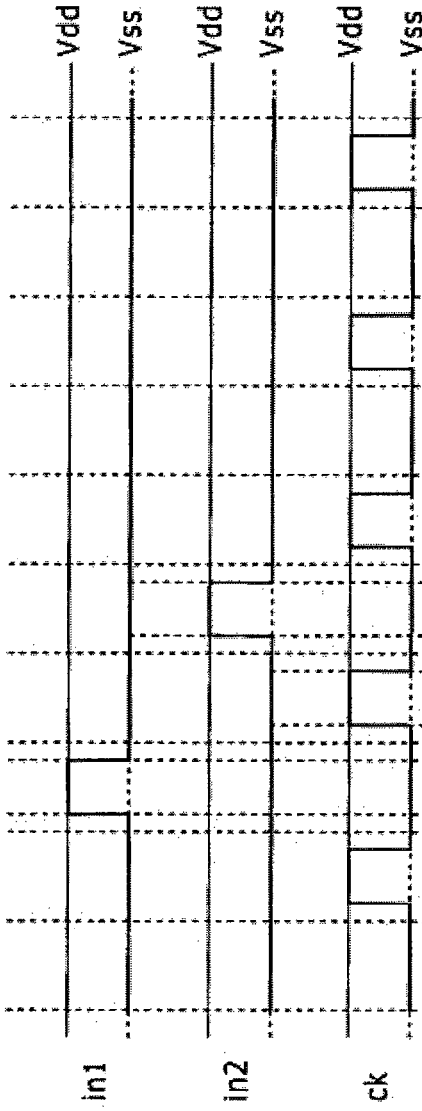
FIG. 10 is a diagram for explaining drive waveforms in the shift stage.
Figure 11:
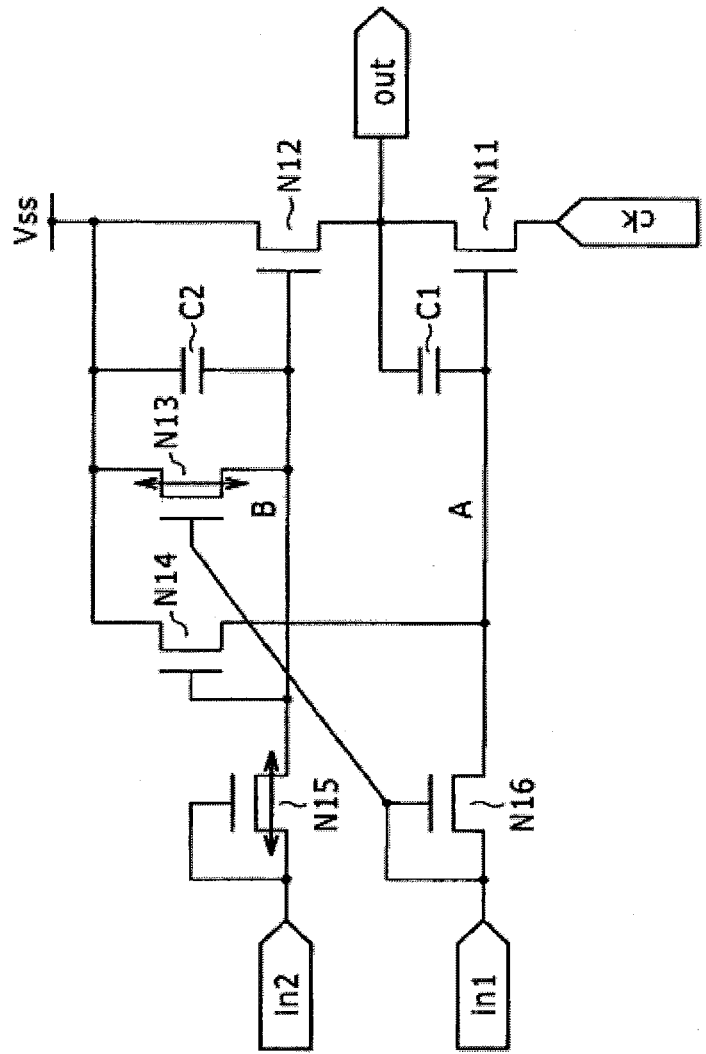
FIG. 11 is a diagram for explaining off-leakage paths.
Figures 12A, 12B, 12C, 12D, 12E, 12F:
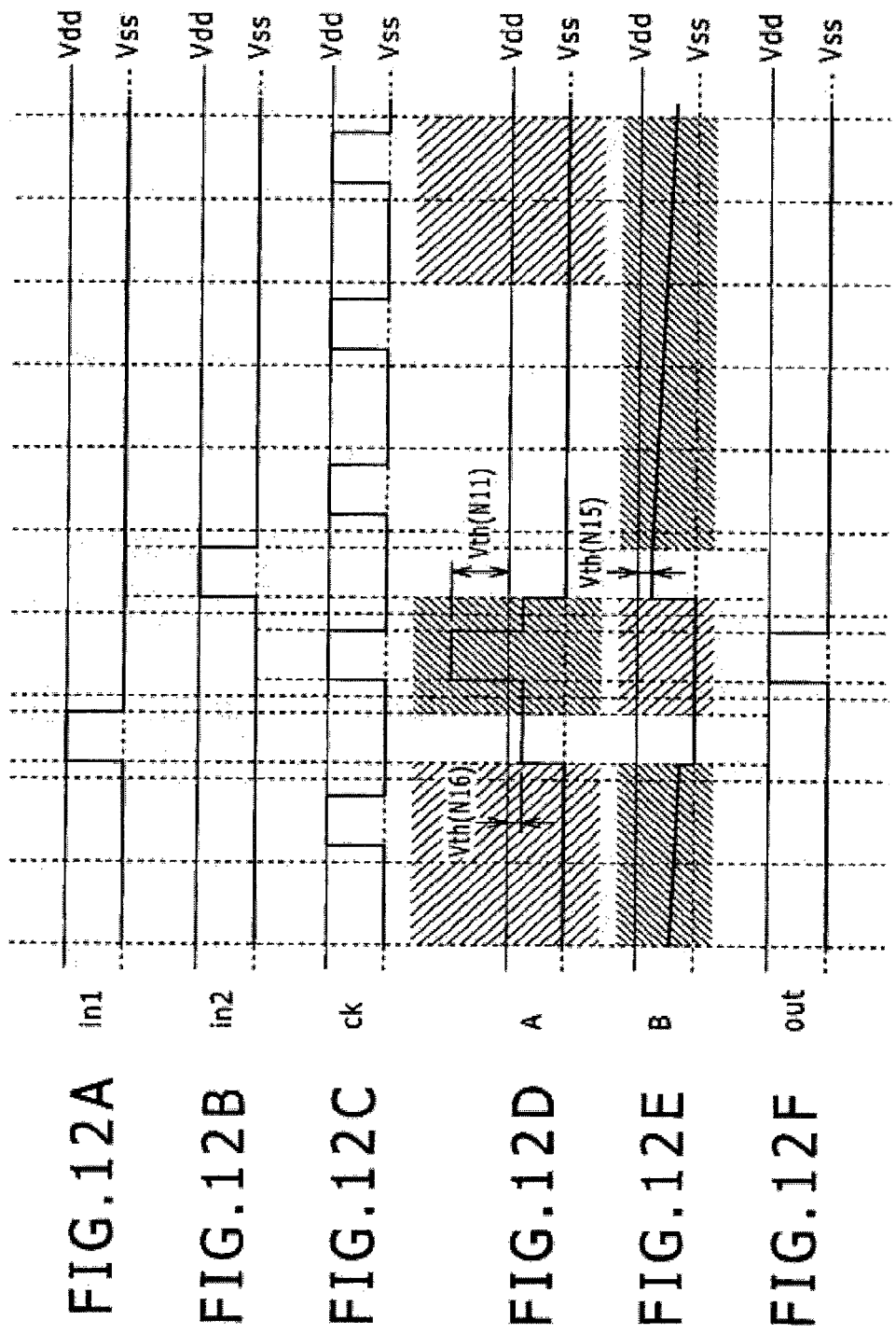
FIG. 12 is a diagram for explaining the influence of the off-leakage on the potential held by a node B.
Figure 13:
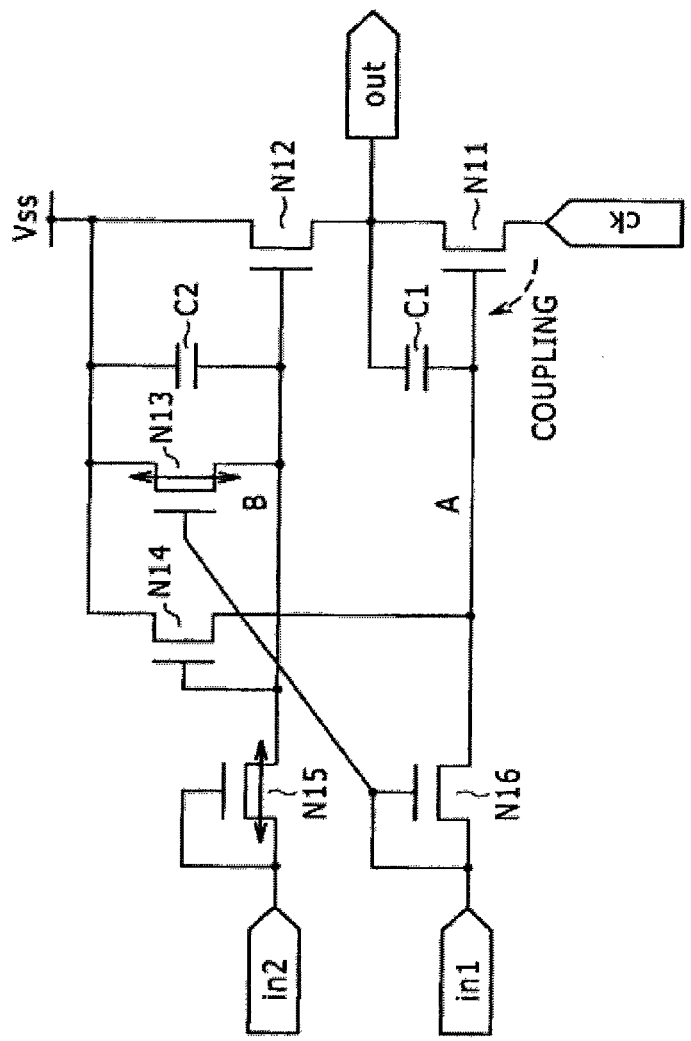
FIG. 13 is a diagram for explaining off-leakage paths and a coupling path.

The above-described operation is carried out in each shift stage. In this form example, the first and second input terminals in1 and in2 should just drive the gate electrodes of the thin film transistors N25 and N26. That is, they do not need to drive the nodes A and B (interconnect capacitors) unlike the related-art example shown in FIG. 9.

Therefore, the load of the input terminals in1 and in2 is reduced compared with the related-art example. As a result, the load of the transfer pulse is reduced. This allows driving at a higher frequency compared with the shift register circuit according to the related-art example.

(b) PMOS Type

Figure 2:
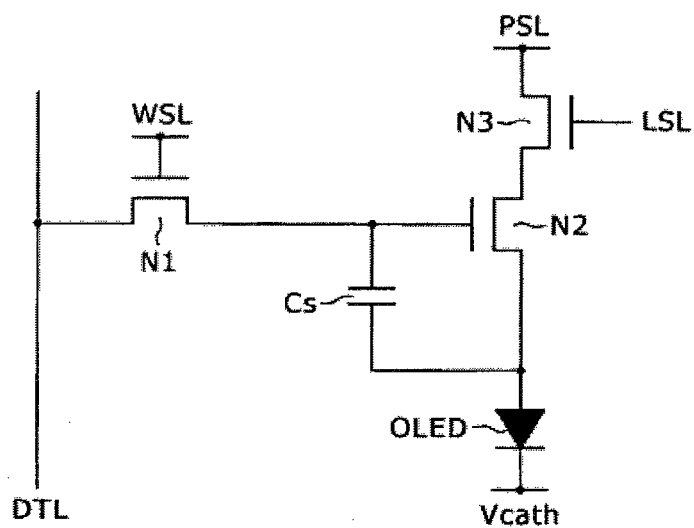
FIG. 2 is a diagram showing an equivalent circuit of a sub-pixel (NMOS type)
Figure 3:
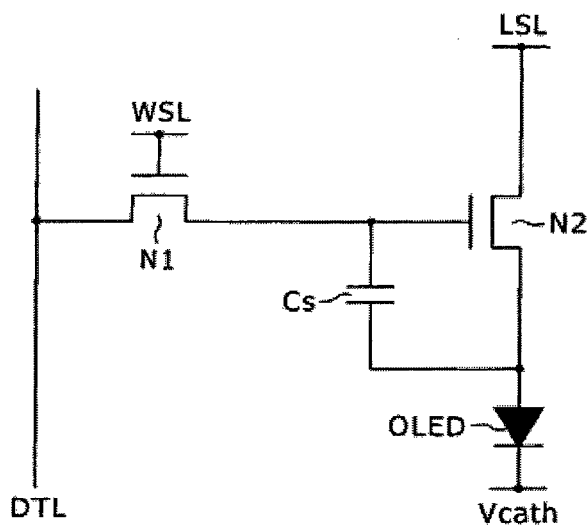
FIG. 3 is a diagram showing an equivalent circuit of the sub-pixel (NMOS type)

The above-described NMOS-type shift stage is used if the sub-pixels 11 in the pixel array part 3 have the NMOS-type circuit configuration shown in FIG. 2 or FIG. 3.

Figure 24:
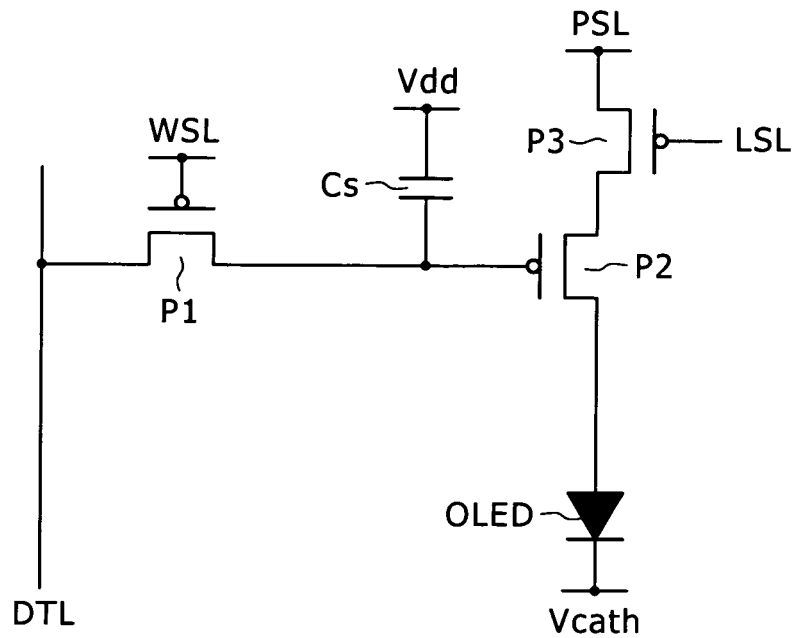
FIG. 24 is a diagram showing an equivalent circuit of a sub-pixel (PMOS type)
Figure 25:
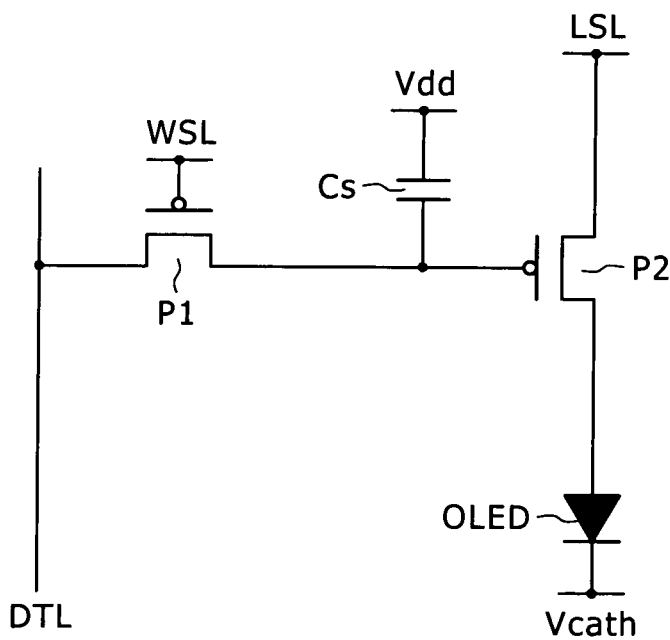
FIG. 25 is a diagram showing an equivalent circuit of the sub-pixel (PMOS type)

Therefore, if the sub-pixels 11 in the pixel array part 3 have the PMOS-type circuit configuration shown in FIG. 24 or FIG. 25, a shift register circuit including PMOS-type shift stages should be used.

Figure 4:
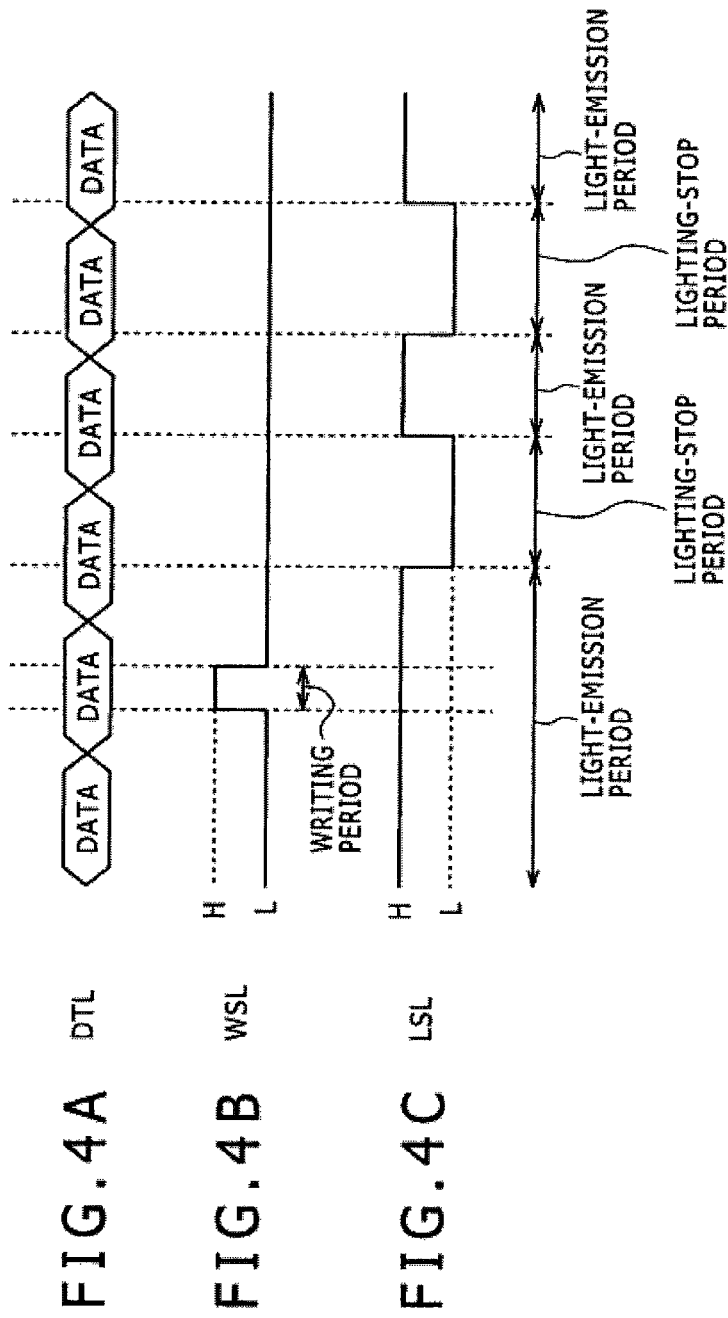
FIG. 4 is a diagram for explaining drive timings of the sub-pixel.
Figure 5:
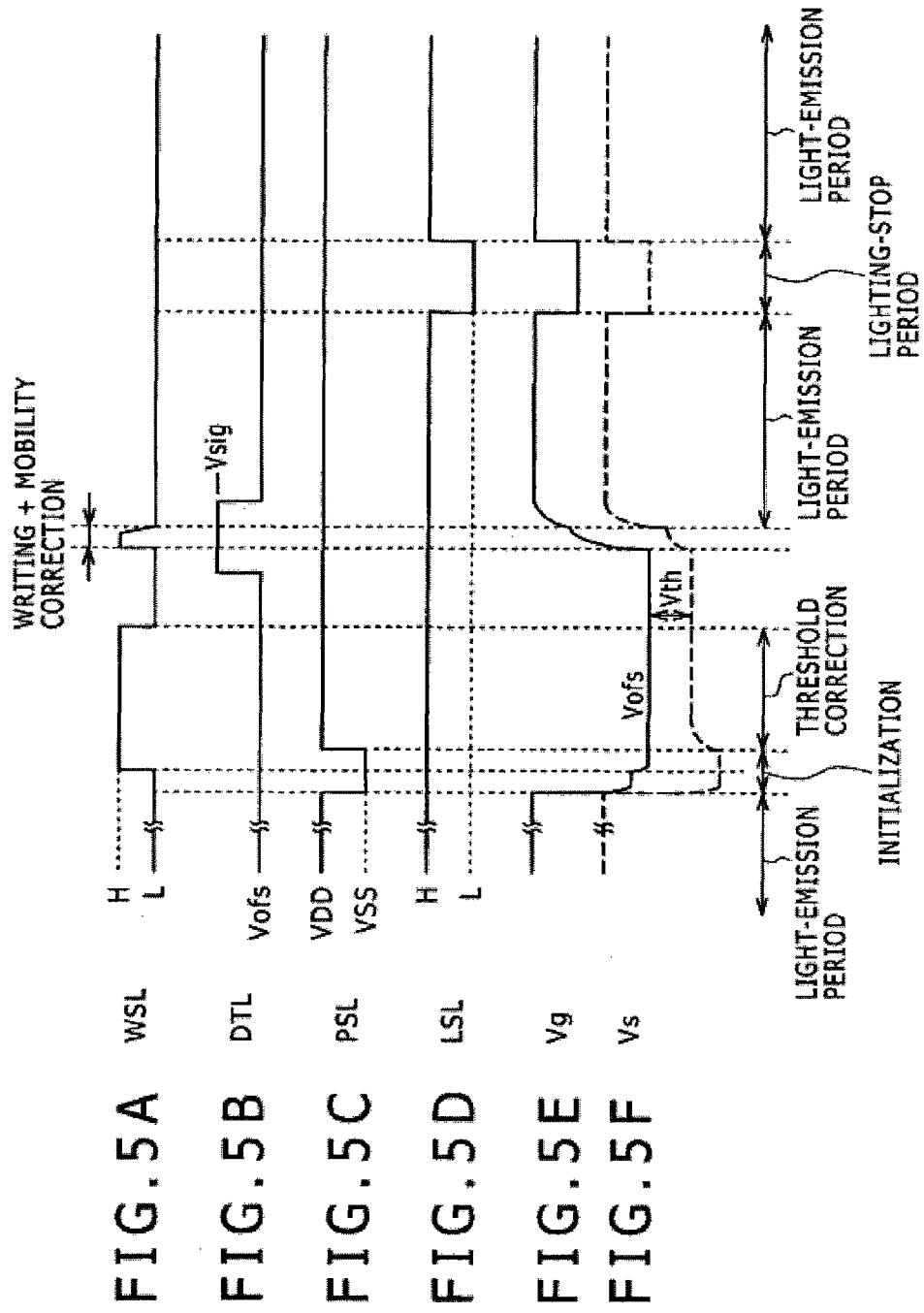
FIG. 5 is a diagram showing drive waveforms corresponding to FIG. 2.
Figure 6:
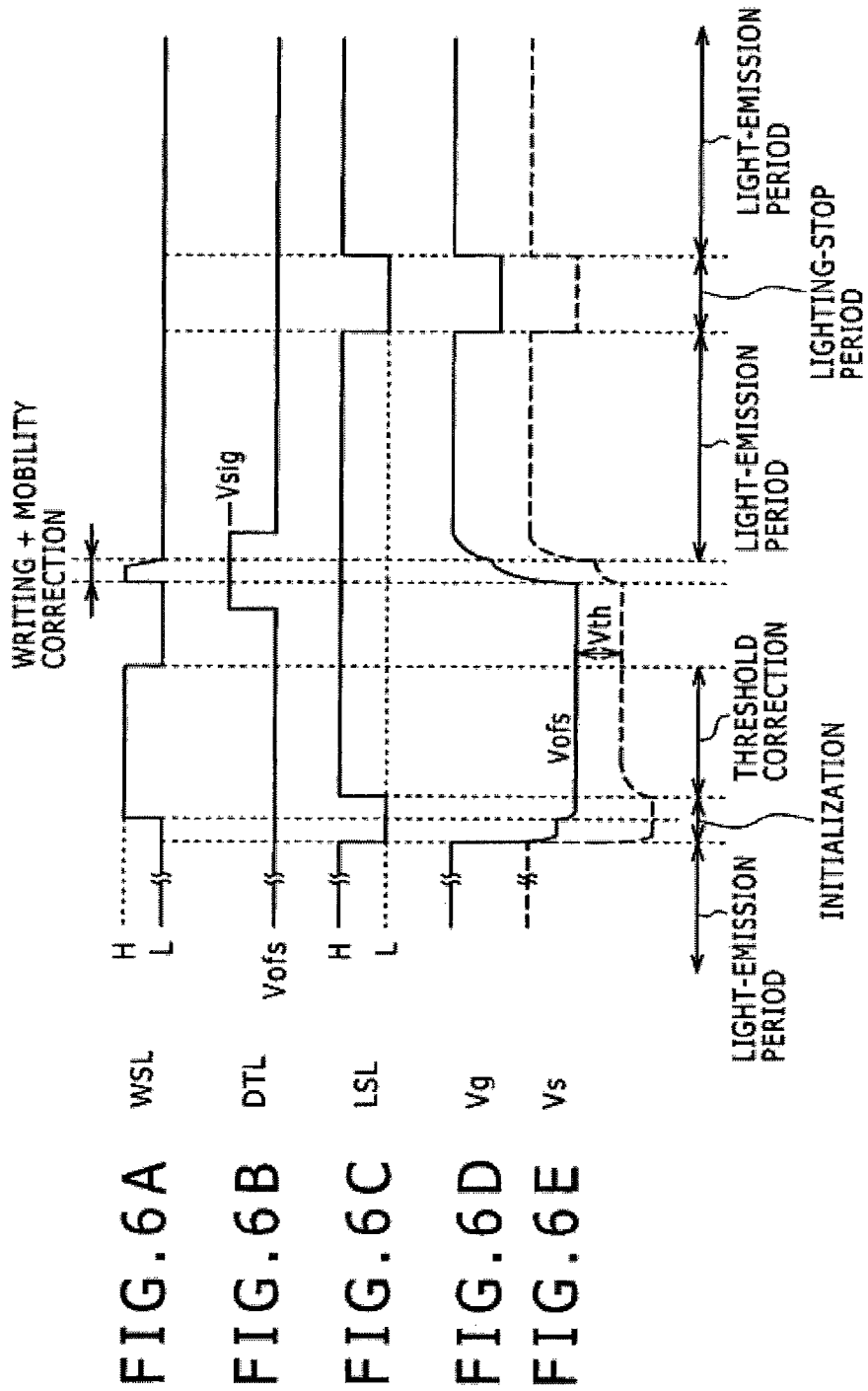
FIG. 6 is a diagram showing drive waveforms corresponding to FIG. 3.
Figure 7:
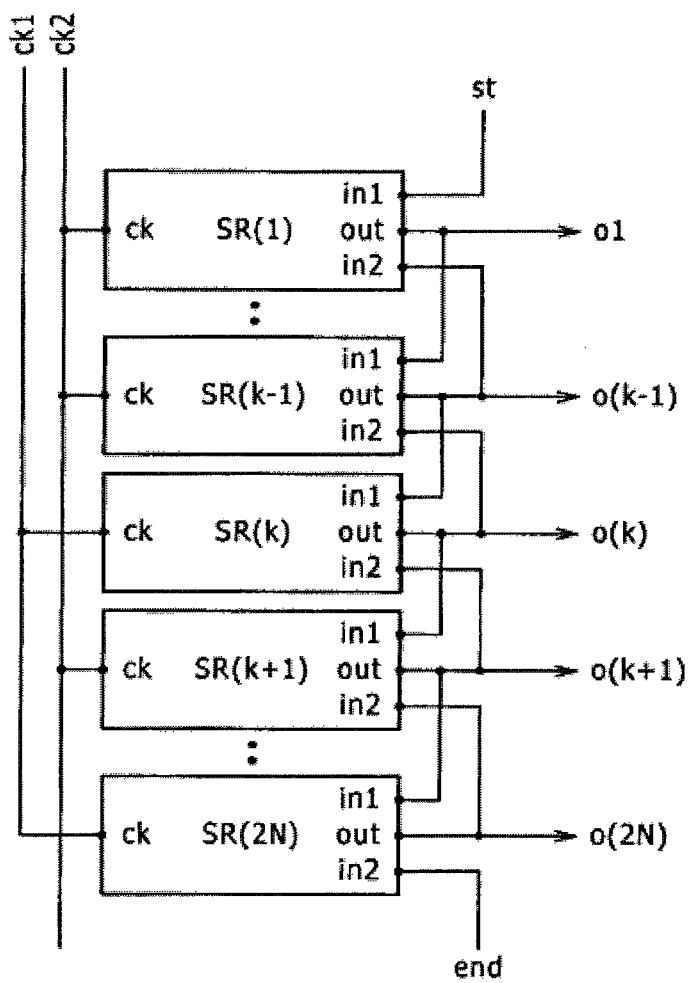
FIG. 7 is a diagram showing a circuit example of a shift register circuit (scanner)
Figure 8:
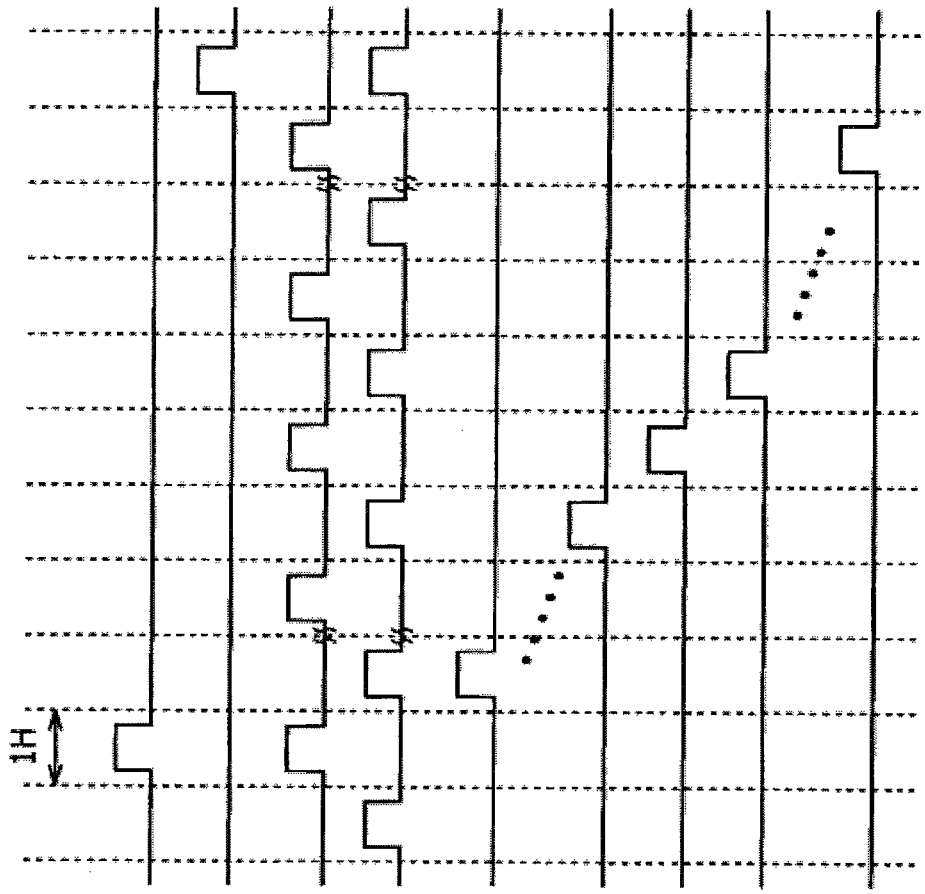
FIG. 8 is a diagram showing drive waveforms of the shift register circuit (scanner) (NMOS type)
Figure 26:
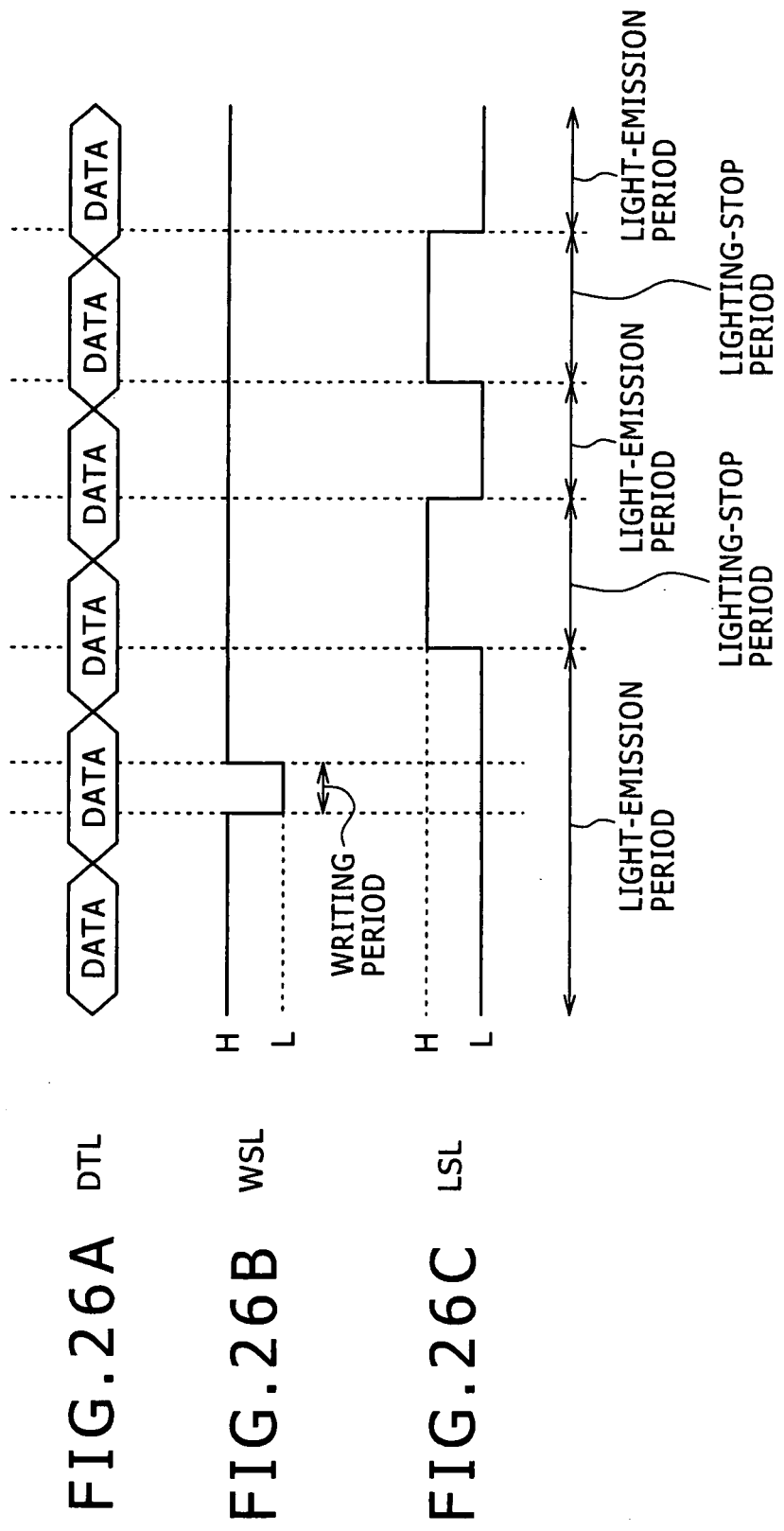
FIG. 26 is a diagram showing drive waveforms of the shift register circuit (scanner) (PMOS type)

The configurations of the sub-pixel 11 shown in FIG. 24 and FIG. 25 are basically the same as those of FIG. 2 and FIG. 3, respectively, except for replacement of the respective NMOS thin film transistors in FIG. 2 and FIG. 3 by PMOS thin film transistors. Therefore, as shown in FIG. 26, the drive waveforms in these configurations are obtained by interchanging the H level and the L level of the write control line WSL and the lighting control line LSL in FIG. 4.

Figure 27:
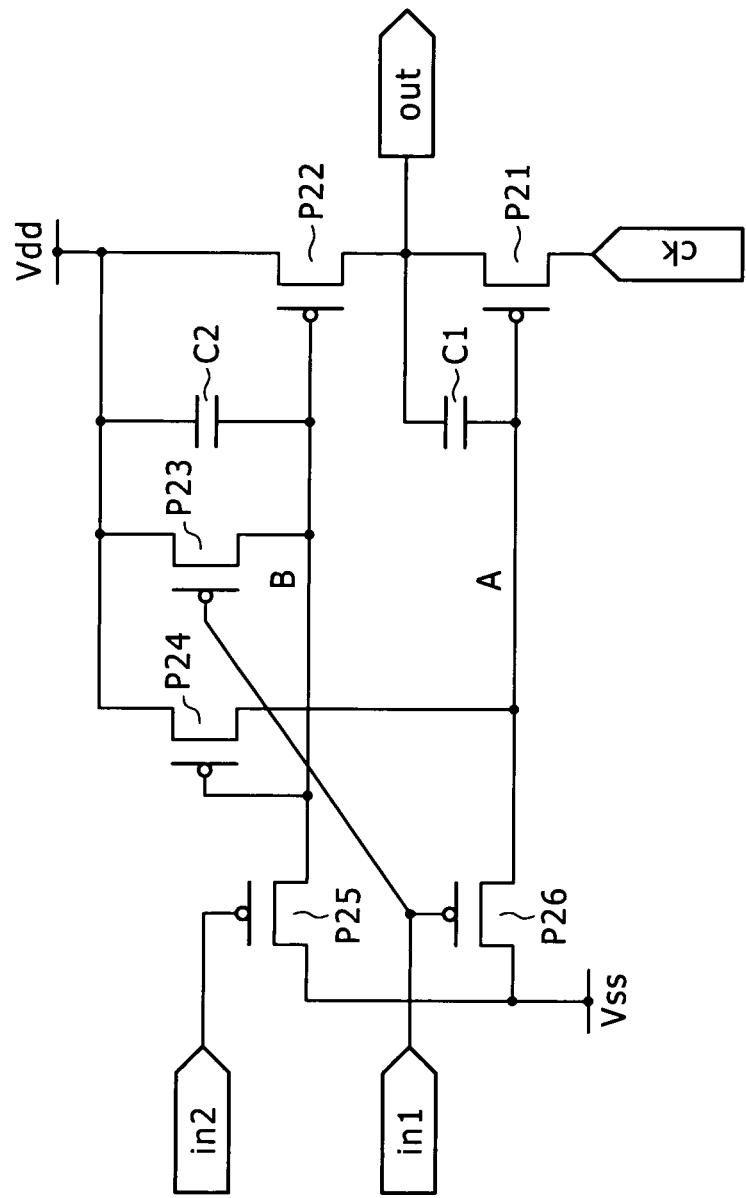
FIG. 27 is a diagram showing a form example of a shift stage (PMOS type)

Thus, the configuration of the shift stage included in the PMOS-type shift register circuit has the connection relationship shown in FIG. 27.

The connection relationship among the respective thin film transistors P21 to P26 is the same as that in the configuration of the NMOS-type shift stage shown in FIG. 22.

The differences therebetween are that the higher potential Vdd is employed as the first power supply to which one main electrode of each of the thin film transistors P22, P23, and P24 is connected, and that the lower potential VSS is employed as the second power supply to which one main electrode of each of the thin film transistors P25 and P26 is connected.

Figure 28:
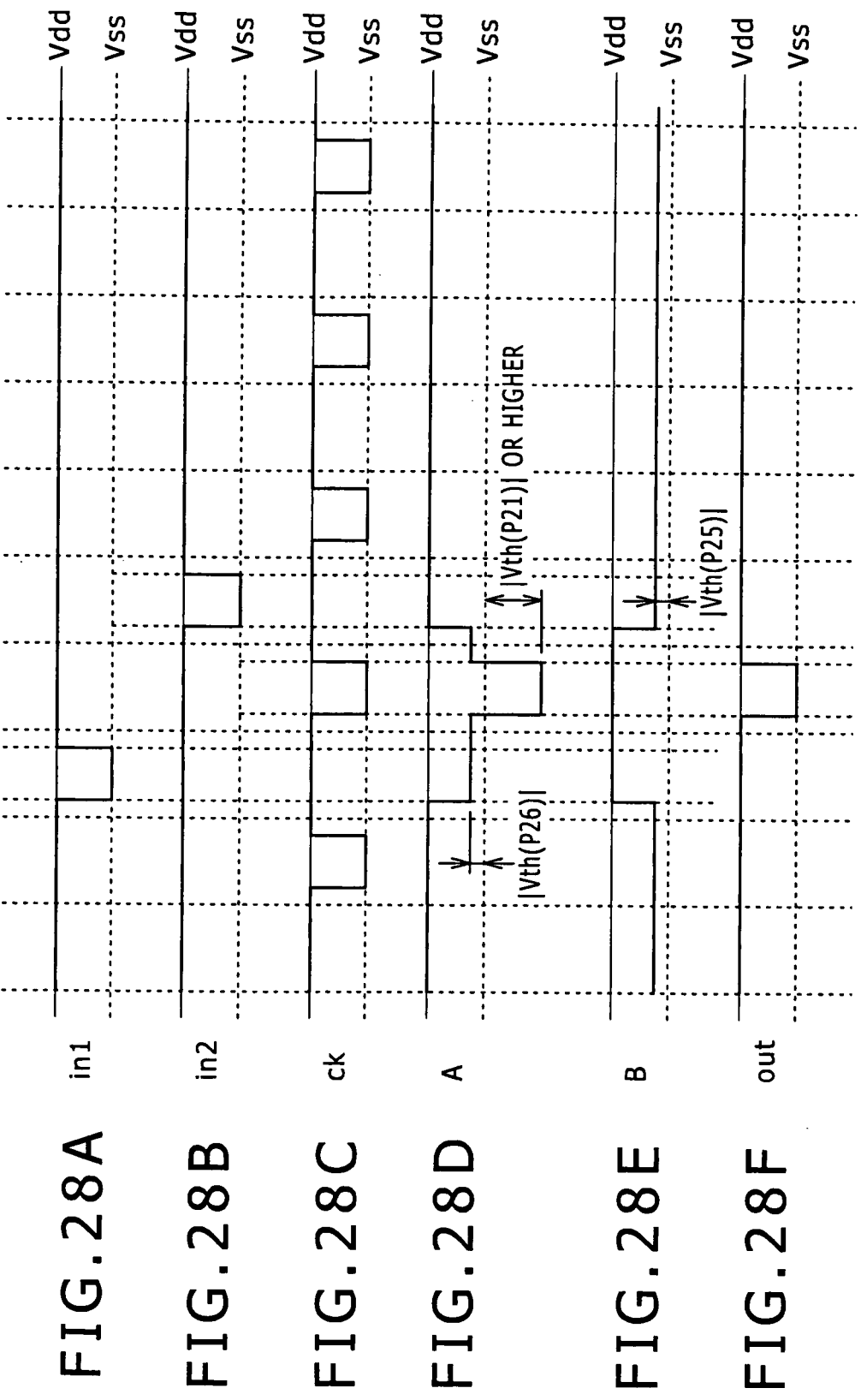
FIG. 28 is a diagram showing drive waveforms of the shift stage shown in FIG. 27.

FIG. 28 shows the drive waveforms of the shift stage according to this form example. FIGS. 28A to 28F correspond to FIGS. 23A to 23F, respectively. The respective waveforms shown in FIG. 28 are obtained by interchanging the H level and the L level of the respective waveforms shown in FIG. 23. That is, the basic operation is the same between the NMOS-type and PMOS-type shift stages. Therefore, the detailed description of the PMOS-type shift stage is omitted.

Also in the case of this PMOS-type shift stage, the load of the input terminals in1 and in2 can be reduced compared with the related-art example. As a result, the load of the transfer pulse is reduced. This allows driving at a higher frequency compared with the shift register circuit according to the related-art example.

(B-2) Second Form Example of Shift Stage

In the above-described shift stage according to the first form example, the potential of the node B in the floating state depends on the leakage balance between the thin film transistors N23 and N25 or P23 and P25. For example, in the NMOS-type shift stage, the leakages act to lower the potential of the node B toward the lower potential VSS if the leakage amount of the thin film transistor N23 is larger than that of the thin film transistor N25. In contrast, the leakages act to increase the potential of the node B toward the higher potential Vdd if the leakage amount of the thin film transistor N25 is larger than that of the thin film transistor N23.

In the PMOS-type shift stage, the potential of the node B is changed in the direction opposite to that in the NMOS-type shift stage.

Figure 29:
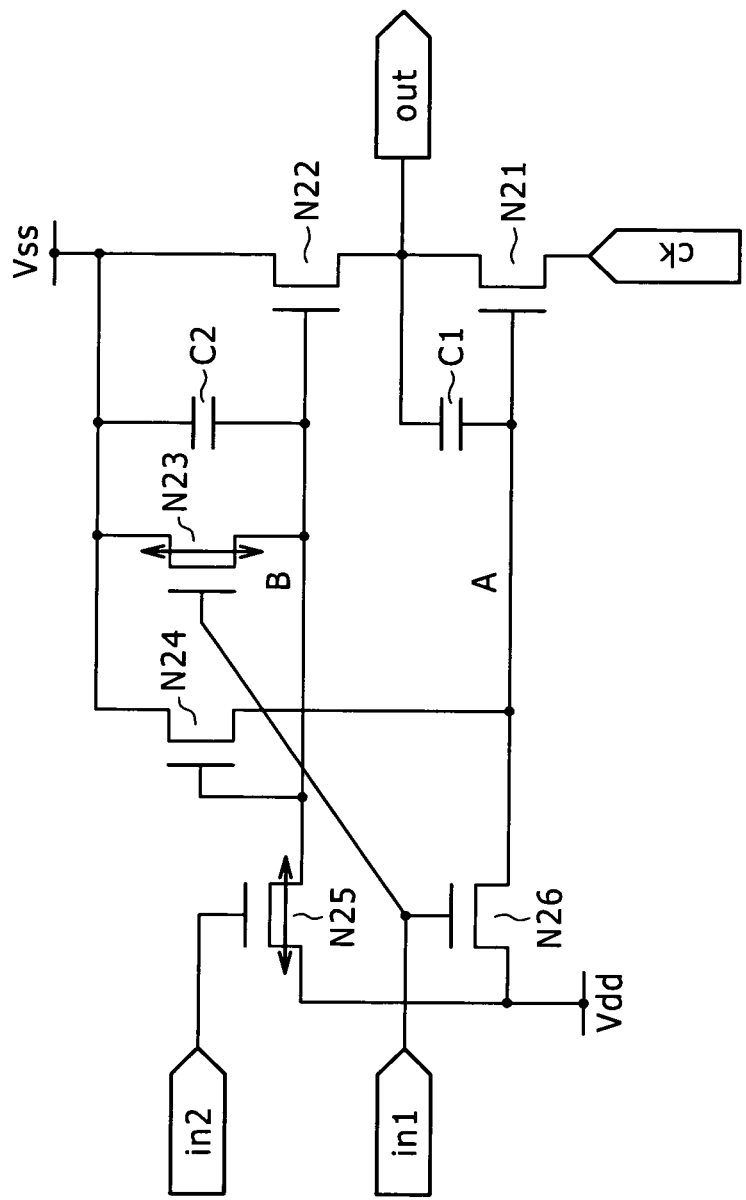
FIG. 29 is a diagram for explaining the influence of off-leakage.

With reference to FIG. 29, a description will be made below about the influence when the leakage amount of the thin film transistor N25 is larger than that of the thin film transistor N23 in the NMOS-type shift stage.

In this case, a possible issue is the drive operation in the period during which both the node A and the node B are in the floating state.

Originally, during this period, the node A is kept at the H level and the node B is kept at the L level.

However, if the potential of the node B is shifted toward the H level due to the collapse of the leakage amount balance, the thin film transistor N24 is turned on when the potential of the node B reaches a certain potential. This acts to lower the potential of the node A in the floating state toward the lower potential VSS, which possibly precludes the bootstrap operation of the node A accompanying the input of the clock signal. Specifically, the amplitude of the pulse that appears at the output node OUT is possibly insufficient.

To address this problem, in this form example, a circuit configuration is proposed in which the bootstrap operation of the node A is hardly precluded even with the collapse of the leakage amount balance due to the influence of manufacturing variation.

It should be obvious that this form example is to further enhance the reliability and the shift stage according to the first form example can be used without any problem as long as the influence of manufacturing variation is within the allowable range.

(a) NMOS Type

Figure 30:
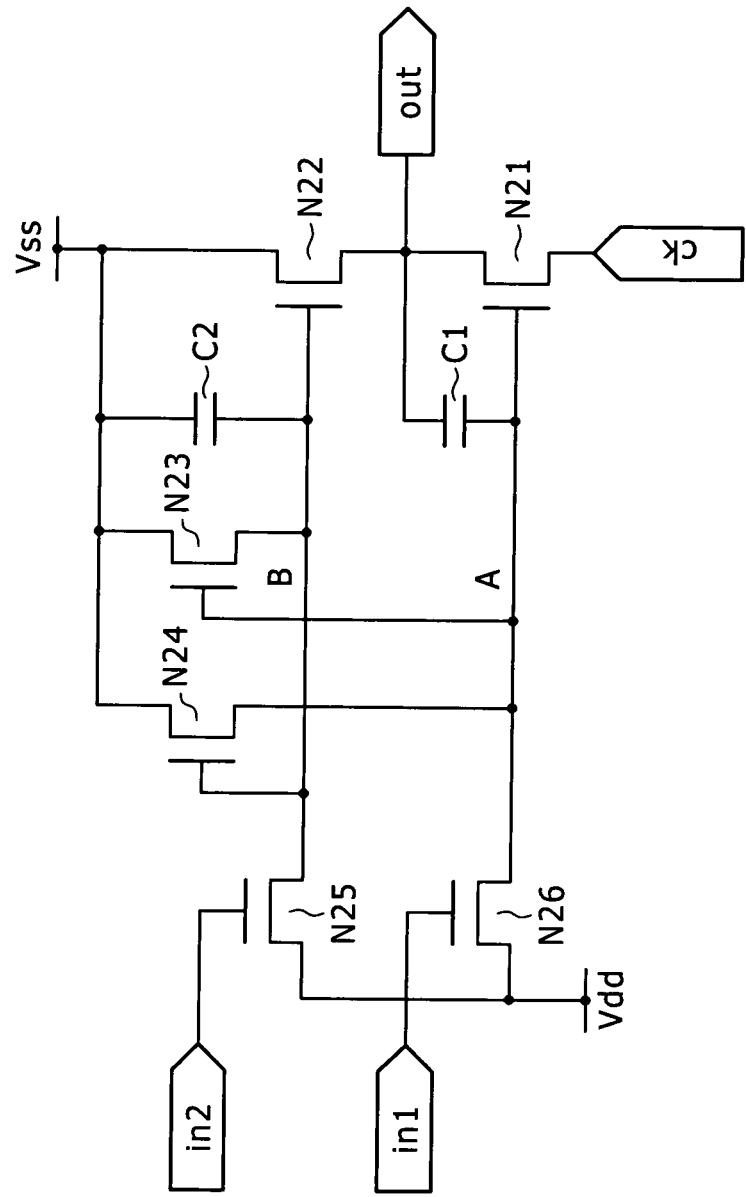
FIG. 30 is a diagram showing a form example of a shift stage (NMOS type)

FIG. 30 shows a second form example of the shift stage included in the shift register circuit. FIG. 31 shows the corresponding drive waveforms.

The difference between the shift stage shown in FIG. 30 and the shift stage according to the first form example (FIG. 22) is the connection form between the gate electrode of the thin film transistor N23 and another node.

In this form example, the gate electrode of the thin film transistor N23 is connected to the control interconnect of the thin film transistor N21 (i.e. to the node A). The connection of the main electrodes of the thin film transistor N23 is the same as that in the first form example. In this form example, the thin film transistor N23 is turned on at the time of the bootstrap operation of the node A to thereby act to fix the potential of the node B at the lower potential VSS.

FIG. 31 shows the drive waveforms of the shift stage according to this form example. The drive waveforms shown in FIGS. 31A to 31F correspond to those shown in FIGS. 23A to 23F, respectively.

As is apparent from comparison between FIG. 31E and FIG. 23E, in this form example, the node B is not in the floating state but a fixed potential is applied to the node B during the period when the node A carries out bootstrap operation.

Specifically, even when the leakage amount of the thin film transistor N25 is relatively large, the potential of the node B can be continuously kept at the lower potential VSS by the thin film transistor N23 that is completely turned on.

Thus, even if the degree of manufacturing variation is beyond the allowable range of the shift stage according to the first form example, employing the shift stage according to this form example makes it possible to ensure normal bootstrap operation. That is, a shift register circuit that carries out highly-reliable drive operation can be achieved.

(b) PMOS Type

The above-described problem relating to the leakage amount balance applies also to a PMOS-type shift stage.

Therefore, the same connection structure as that of the NMOS-type shift stage can be employed for the PMOS-type shift stage.

Figure 32:
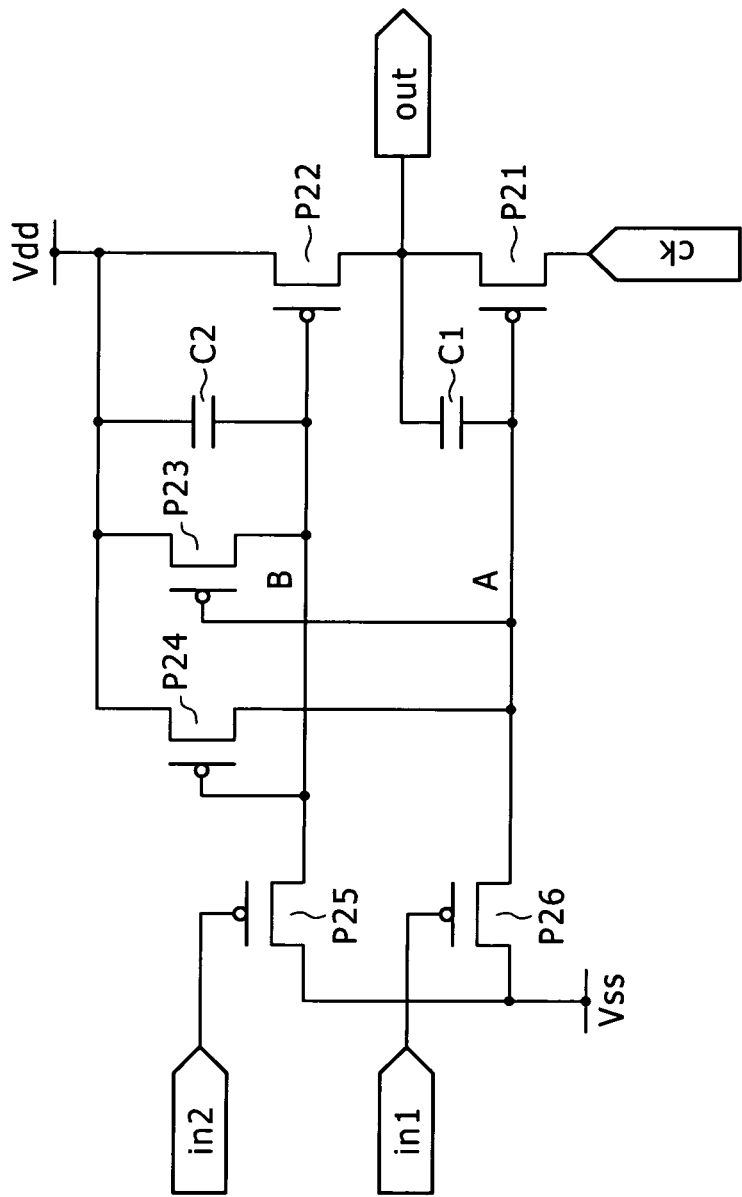
FIG. 32 is a diagram showing a form example of a shift stage (PMOS type)

FIG. 32 shows the circuit configuration of the PMOS-type shift stage according to this form example.

The difference between the shift stage shown in FIG. 32 and the shift stage according to the first form example (FIG. 27) is also the connection form of the gate electrode of the thin film transistor P23.

In this form example, the gate electrode of the thin film transistor P23 is connected to the control interconnect of the thin film transistor P21 (i.e. to the node A). This connection allows the thin film transistor P23 to fix the potential of the node B to the higher potential Vdd during the bootstrap operation of the node A.

Although the description of the drive waveforms of this PMOS-type shift stage is omitted, employing the shift stage according to this form example makes it possible to ensure normal bootstrap operation even if the degree of manufacturing variation is beyond the allowable range of the shift stage according to the first form example. That is, a shift register circuit that carries out highly-reliable drive operation can be achieved.

(B-3) Third Form Example of Shift Stage

The above-described shift stage according to the second form example involves a problem that, as shown in FIGS. 31D and 31E, the potential switching speed is low in switching of the potentials of the nodes A and B from the L level to the H level or from the H level to the L level.

This is because, even after the thin film transistor N25 (P25) or N26 (P26) is turned on and thereby the potential supply is started, the potential supply by the thin film transistor N23 (P23) or N24 (P24) continues for a while. That is, the potential supply by the first power supply conflicts with that by the second power supply. In addition, the confliction of the potential supply means that through-current flows during the confliction. This causes increase in the power consumption. Therefore, the time of the confliction of the power supply needs to be shortened as much as possible.

To meet this need, in this form example, a circuit configuration is proposed in which the bootstrap operation of the node A is hardly precluded even with the collapse of the leakage amount balance due to the influence of manufacturing variation and fast switching of the node potentials can also be achieved. That is, a circuit configuration is proposed that carries out highly-reliable drive operation, and is capable of high-frequency operation and has low power consumption.

(a) NMOS type

Figure 33:
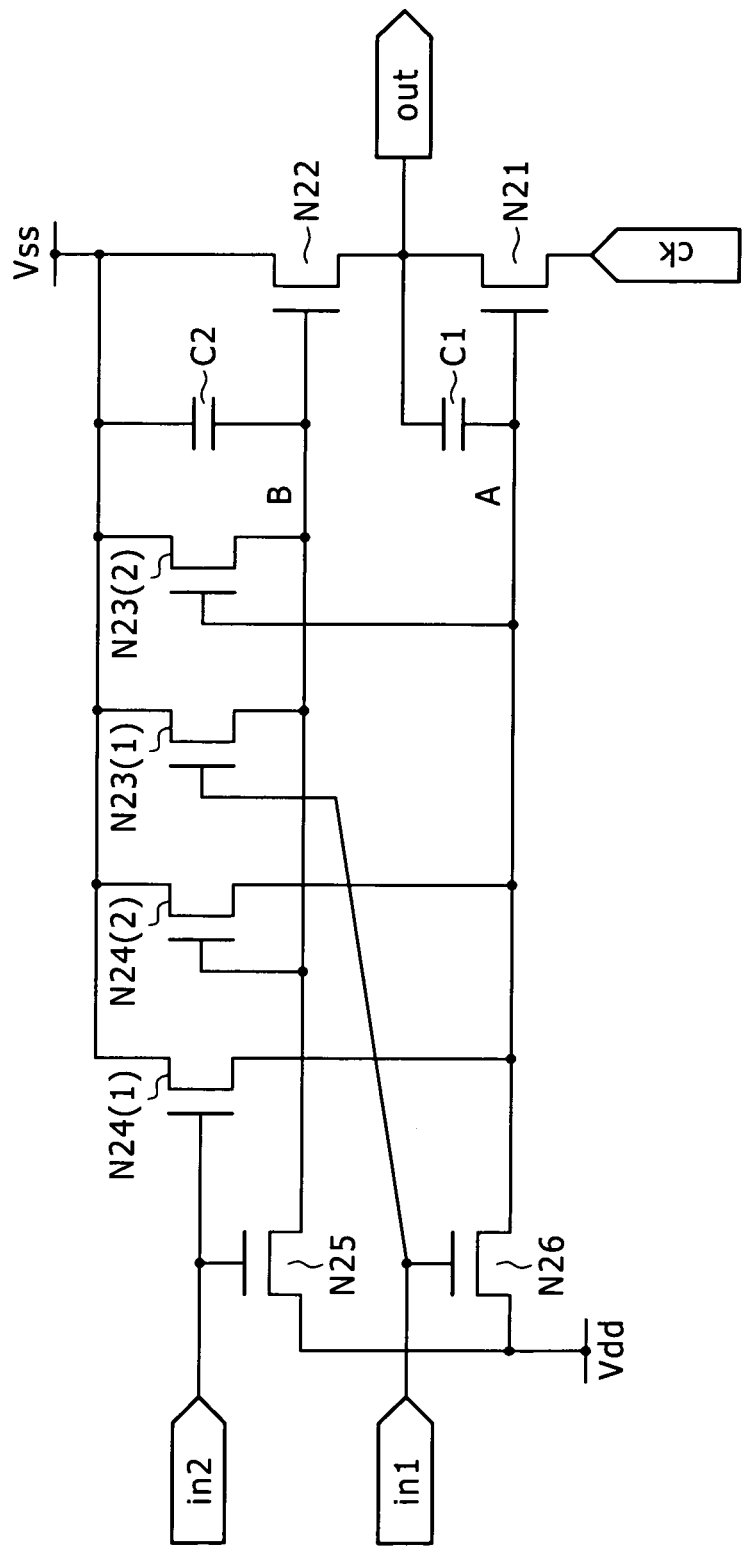
FIG. 33 is a diagram showing a form example of a shift stage (NMOS type)

FIG. 33 shows a third form example of the shift stage included in the shift register circuit.

The shift stage shown in FIG. 33 corresponds to a circuit configuration obtained by combining the shift stage according to the first form example (FIG. 22) with the shift stage according to the second form example (FIG. 30).

This circuit configuration arises from combination of the connection form of the first form example, in which the speed of switching of the node potentials is high, and the connection form of the second form example, which is excellent in the potential holding performance (latch performance).

In this form example, the thin film transistor N23 corresponding to the first form example is indicated as N23(1), and the thin film transistor N23 corresponding to the second form example is indicated as N23(2). Similarly, the thin film transistor N24 corresponding to the first form example, in which the speed of node potential switching is high, is indicated as N24(1), and the thin film transistor N24 that corresponds to the first and second form examples and is excellent in the potential holding performance (latch performance) is indicated as N24(2).

In this form example, when the H-level potential is input to the first input terminal in1, the thin film transistor N23(1) is turned on first, so that the lowering of the potential of the node B, which has been in the floating state so far, is immediately started. Thereafter, the thin film transistor N23(2) is also turned on, and the potential of the node B is completely lowered to the lower potential VSS.

Because the potential of the node B is lowered fast in this manner, the thin film transistor N24(2) is also rapidly turned off to stop the supply of the lower potential VSS to the node A. Thus, the speed of the potential rise of the node A to the higher potential Vdd is also improved.

Furthermore, when the H-level potential is input to the second input terminal in2, the thin film transistor N24(1) is turned on first, so that the lowering of the potential of the node A, which has been in the floating state so far, is immediately started. Thereafter, the thin film transistor N24(2) is also turned on, and the potential of the node A is completely lowered to the lower potential VSS.

Because the potential of the node A is lowered fast in this manner, the thin film transistor N23(2) is also rapidly turned off to stop the supply of the lower potential VSS to the node B. Thus, the speed of the potential rise of the node B to the higher potential Vdd is also improved.

FIG. 34 shows the drive waveforms of the shift stage according to this form example. The drive waveforms shown in FIGS. 34A to 34F correspond to those shown in FIGS. 31A to 31F, respectively.

As is apparent from comparison between FIGS. 34D and 34E and FIGS. 31D and 31E, the speed of the potential change of the nodes A and B is higher in this form example.

In addition, as is apparent from comparison with FIG. 23E, the supply of the lower potential VSS to the node B is continued also during the bootstrap operation of the node A, due to the provision of the thin film transistor N23(2).

Therefore, in this form example, the normal bootstrap operation of the node A can be ensured even if the leakage amount of the thin film transistor N25 is relatively large due to the influence of manufacturing variation.

That is, using the shift stage according to this third form example makes it possible to achieve a shift register circuit in which the speed of switching of the node potentials is high and the reliability of the drive operation is high. In addition, increase in the power consumption can also be minimized in spite of the enhancement in the potential switching speed.

(b) PMOS Type

The above-described problem applies also to a PMOS-type shift stage.

Therefore, the same connection structure as that of the NMOS-type shift stage can be employed for the PMOS-type shift stage.

Specifically, a circuit configuration obtained by combining the shift stage according to the first form example (FIG. 27) with the shift stage according to the second form example (FIG. 32) is employed.

Figure 35:
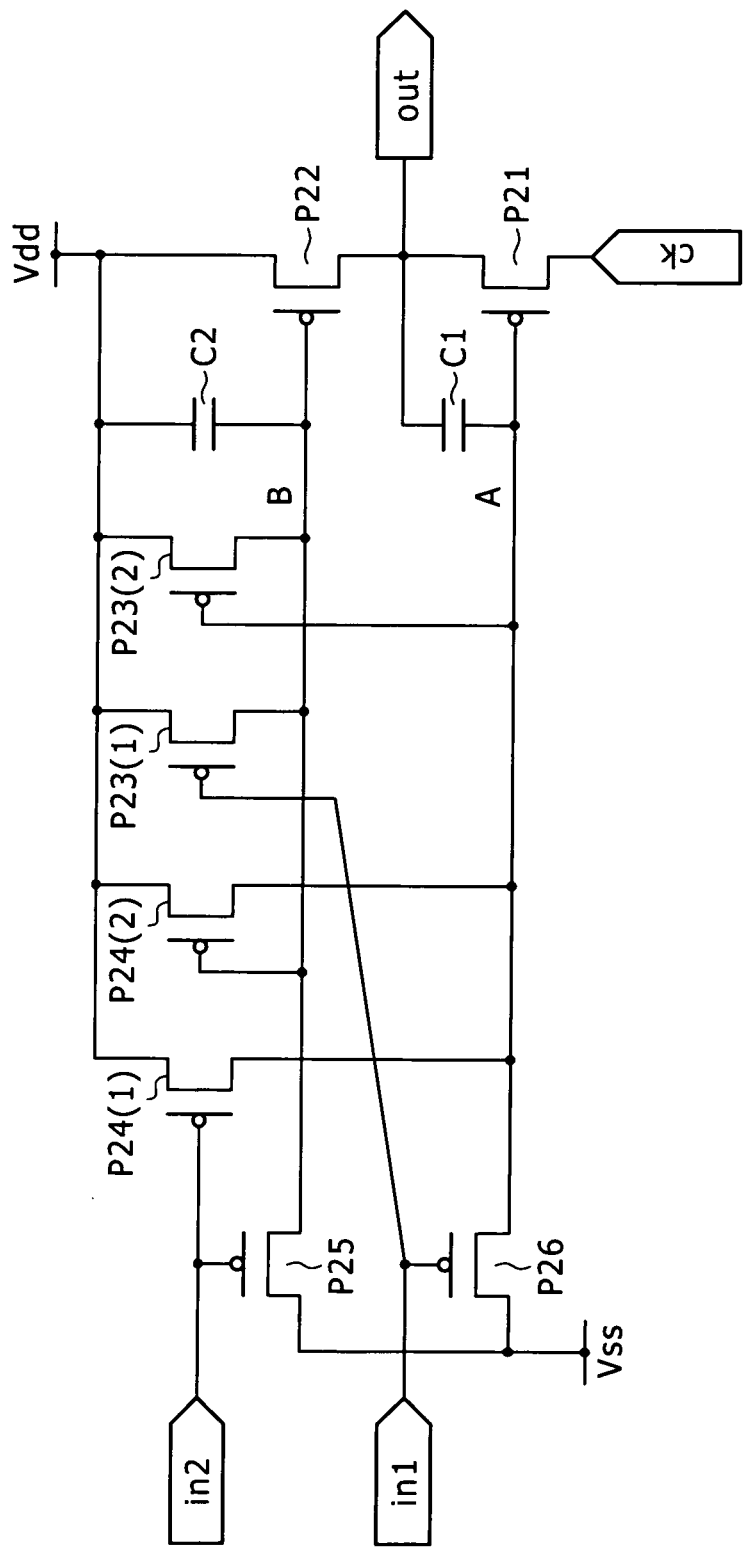
FIG. 35 is a diagram showing a form example of a shift stage (PMOS type)

FIG. 35 shows the circuit configuration of the PMOS-type shift stage according to this form example.

In the shift stage shown in FIG. 35, the thin film transistor P23 corresponding to the first form example is indicated as P23(1), and the thin film transistor P23 corresponding to the second form example is indicated as P23(2). Similarly, the thin film transistor P24 corresponding to the first form example, in which the speed of node potential switching is high, is indicated as P24(1), and the thin film transistor P24 that corresponds to the first and second form examples and is excellent in the potential holding performance (latch performance) is indicated as P24(2).

Although the description of the drive waveforms of this PMOS-type shift stage is omitted, employing the shift stage according to this form example makes it possible to achieve a shift register circuit having the same advantages as those of the shift register circuit including the NMOS-type shift stage.

(B-4) Fourth Form Example of Shift Stage

As described above, using the shift stage according to the third form example can prevent the bootstrap operation of the node A from being affected by the influence of production variation.

However, the period during which the node B is kept at the floating state at the H level involves a slight possibility that off-leakage due to production variation leads to erroneous output to the output node OUT.

Figure 36:
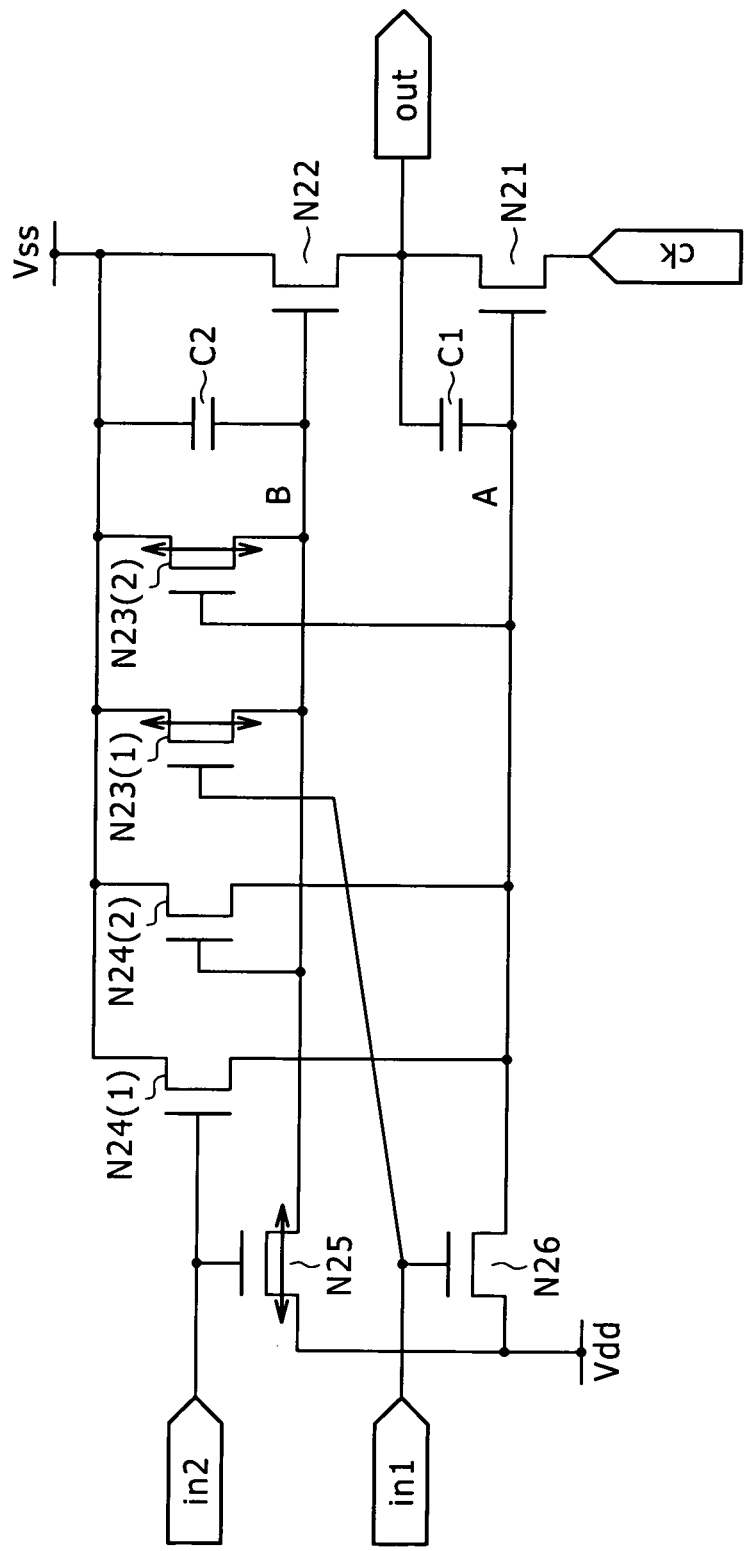
FIG. 36 is a diagram for explaining the influence of off-leakage.

FIG. 36 shows leakage paths that possibly become an issue in the shift stage according to the third form example, regarding the NMOS-type shift stage. The problematic leakage paths are the leakage path through the thin film transistor N25 and two leakage paths through the thin film transistors N23(1) and N23(2).

If the sum of the leakage amounts of the thin film transistors N23(1) and N23(2) is larger than the leakage amount of the thin film transistor N25, the potential of the node B, which should be kept at the higher potential Vdd originally, is lowered toward the lower potential VSS.

Figure 14:
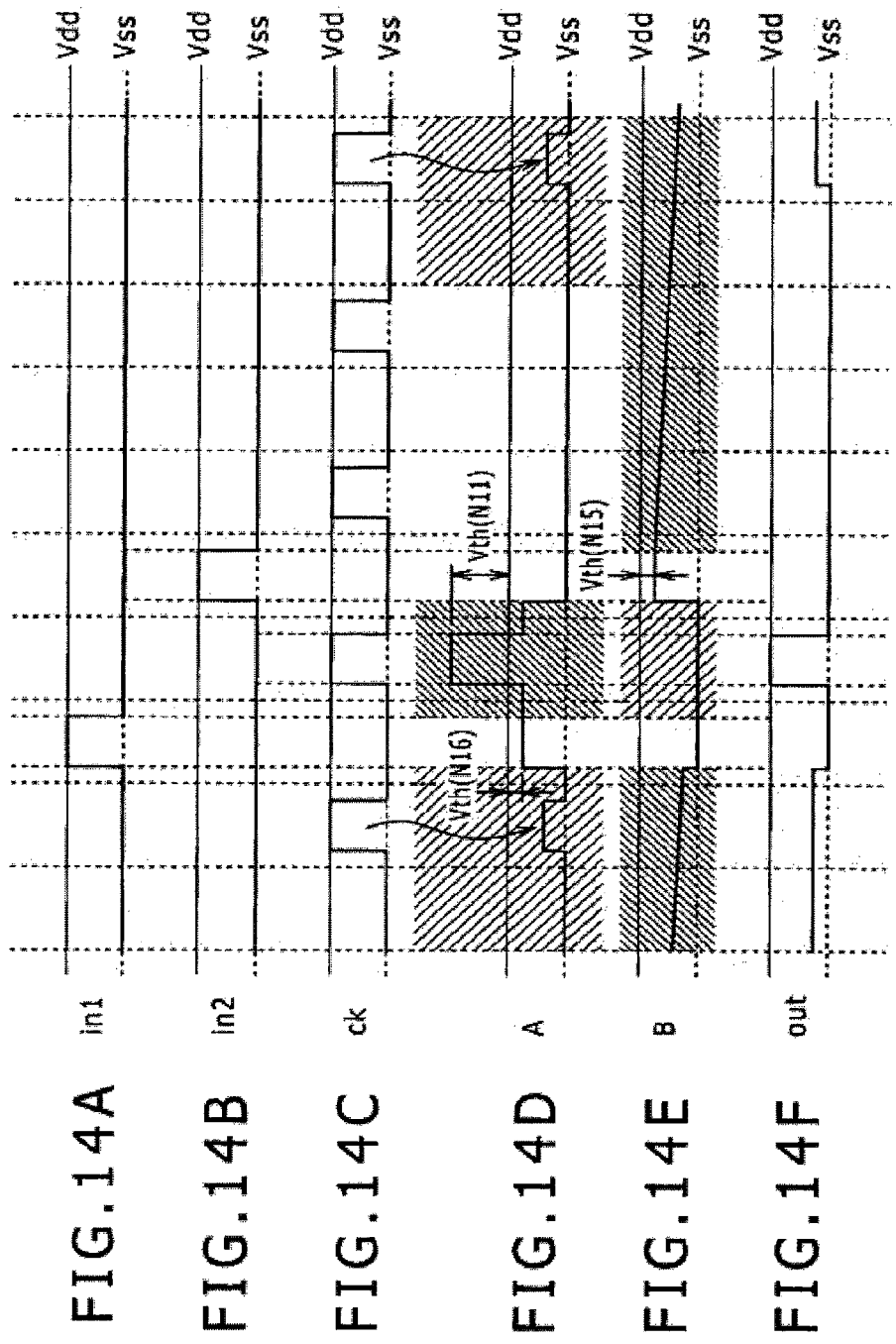
FIG. 14 is a diagram for explaining the influence of the coupling on the potential held by a node.
Figure 15:
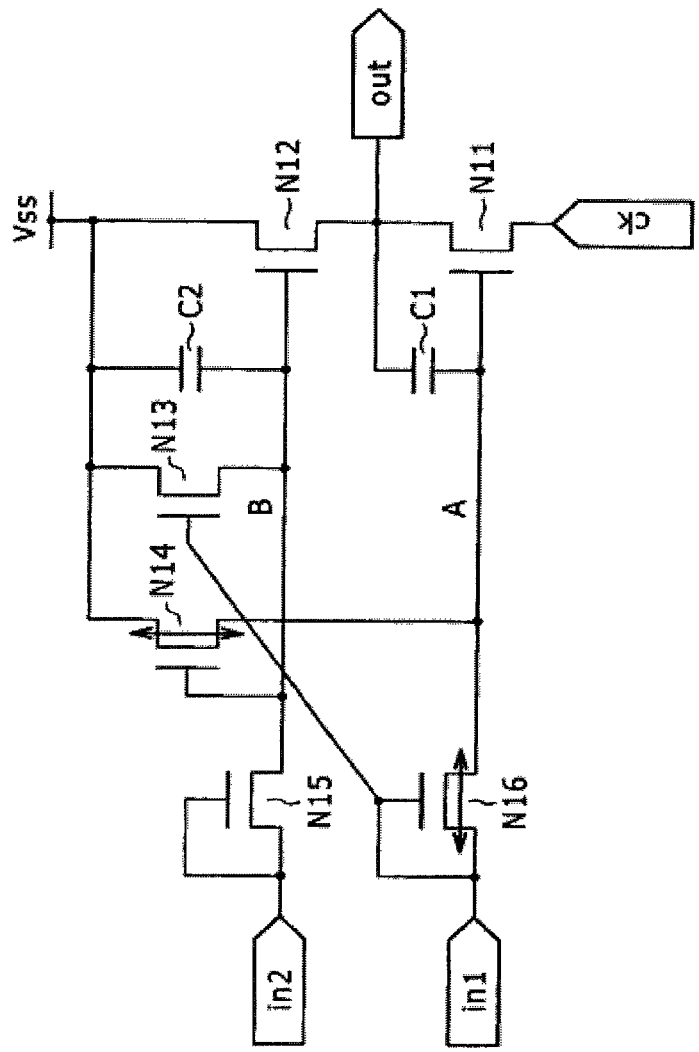
FIG. 15 is a diagram for explaining other off-leakage paths.
Figure 16:
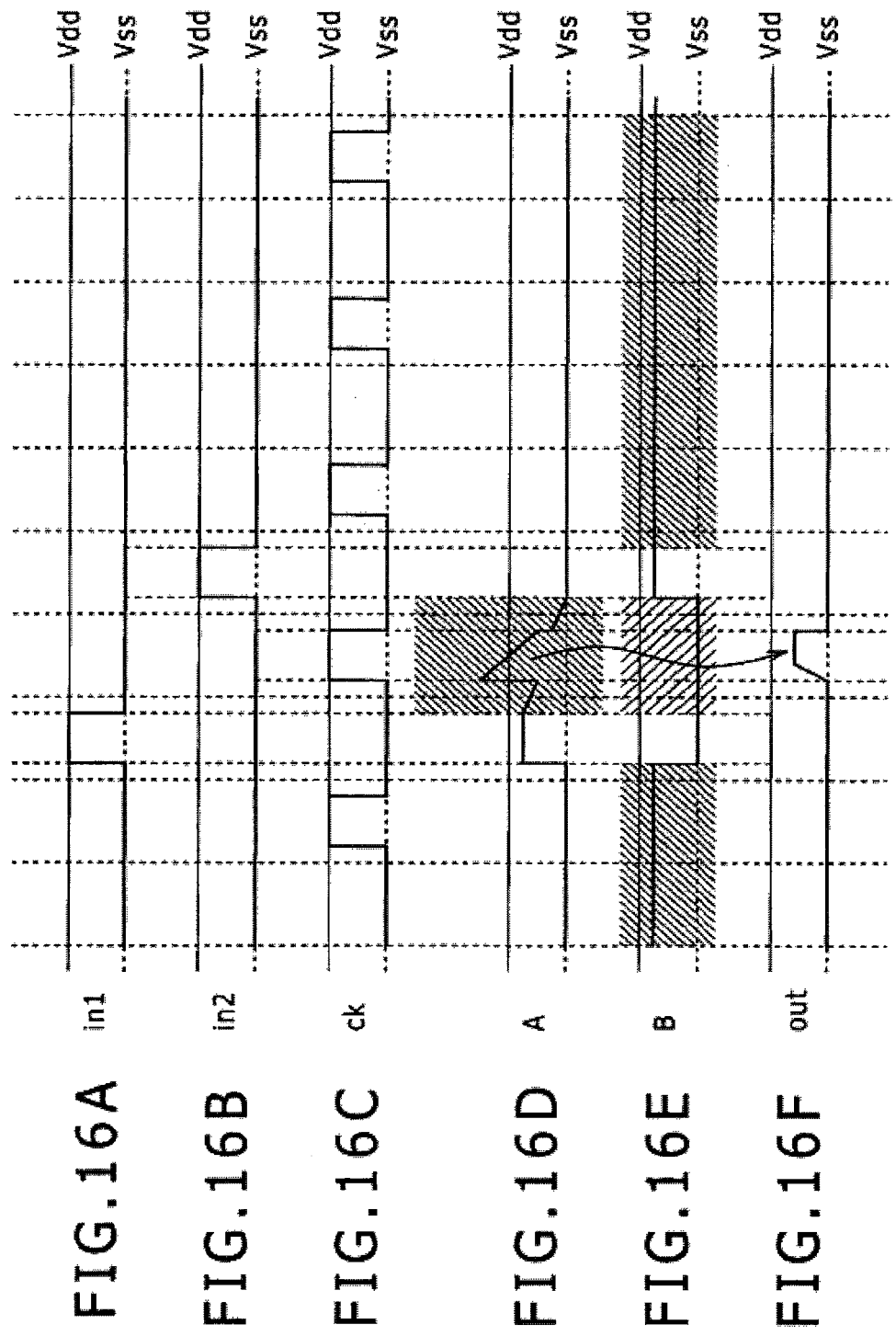
FIG. 16 is a diagram for explaining the influence of the off-leakage on the bootstrap operation of a node A.
Figure 17:
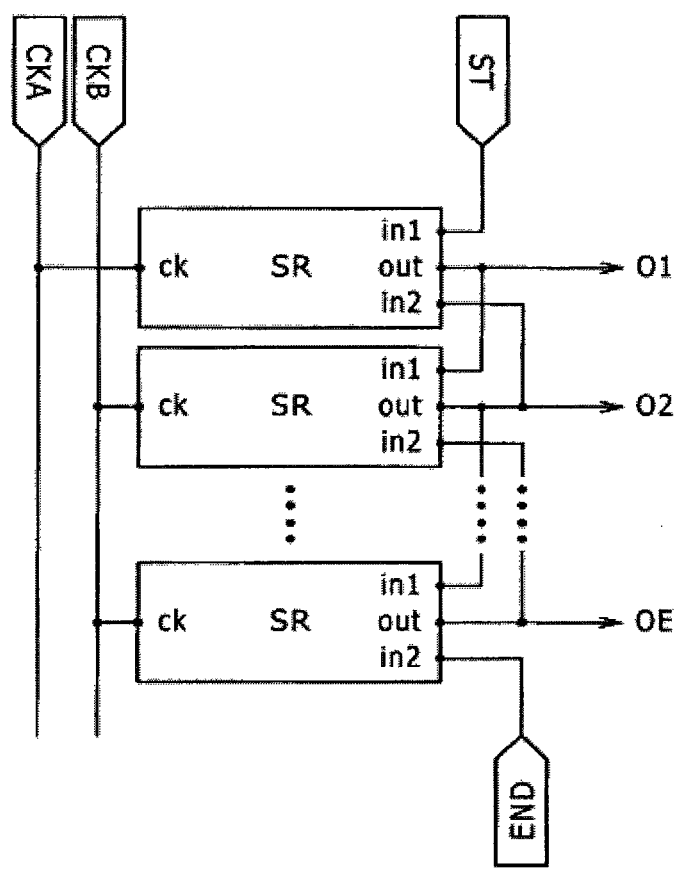
FIG. 17 is a diagram showing a circuit example of the shift register circuit (scanner)
Figure 18:
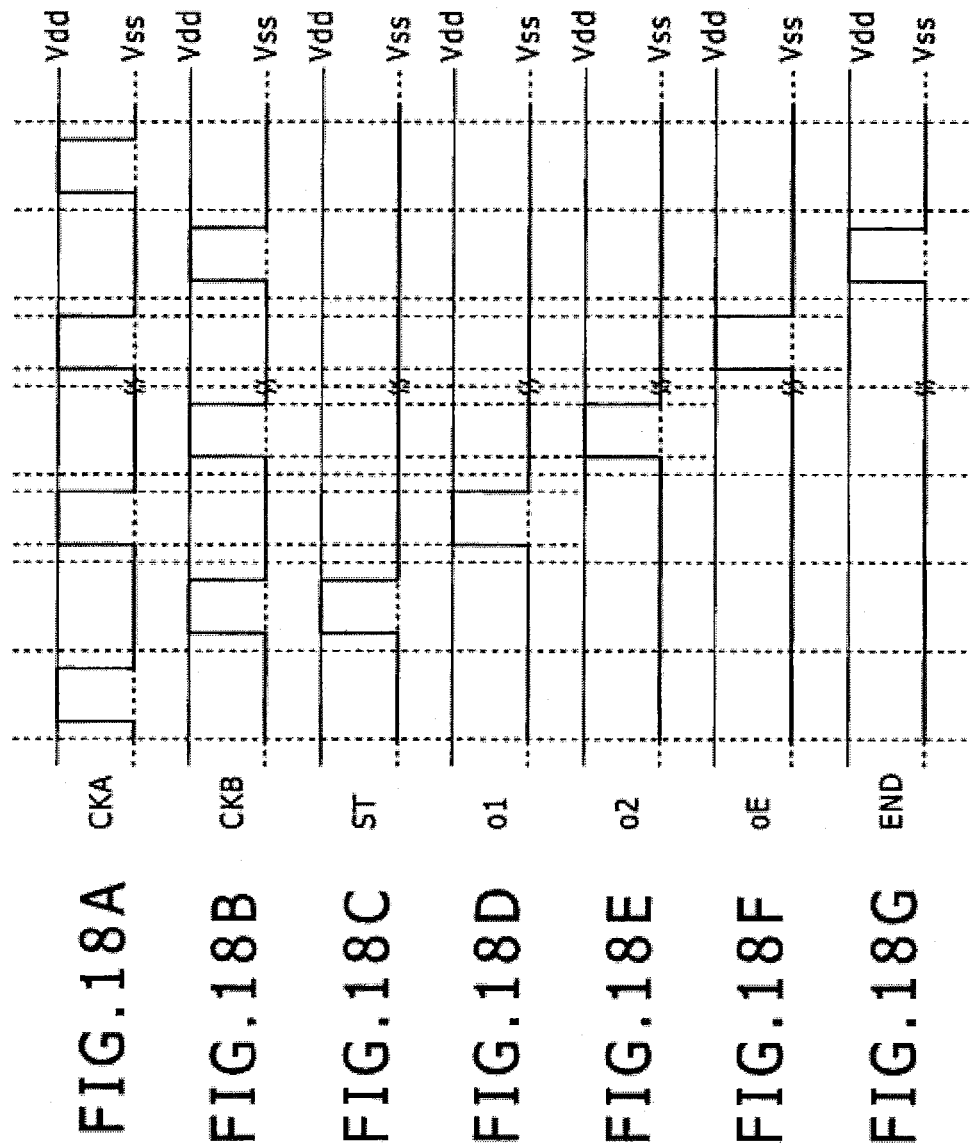
FIG. 18 is a diagram showing drive waveforms of the shift register circuit (scanner) (NMOS type)
Figure 19:
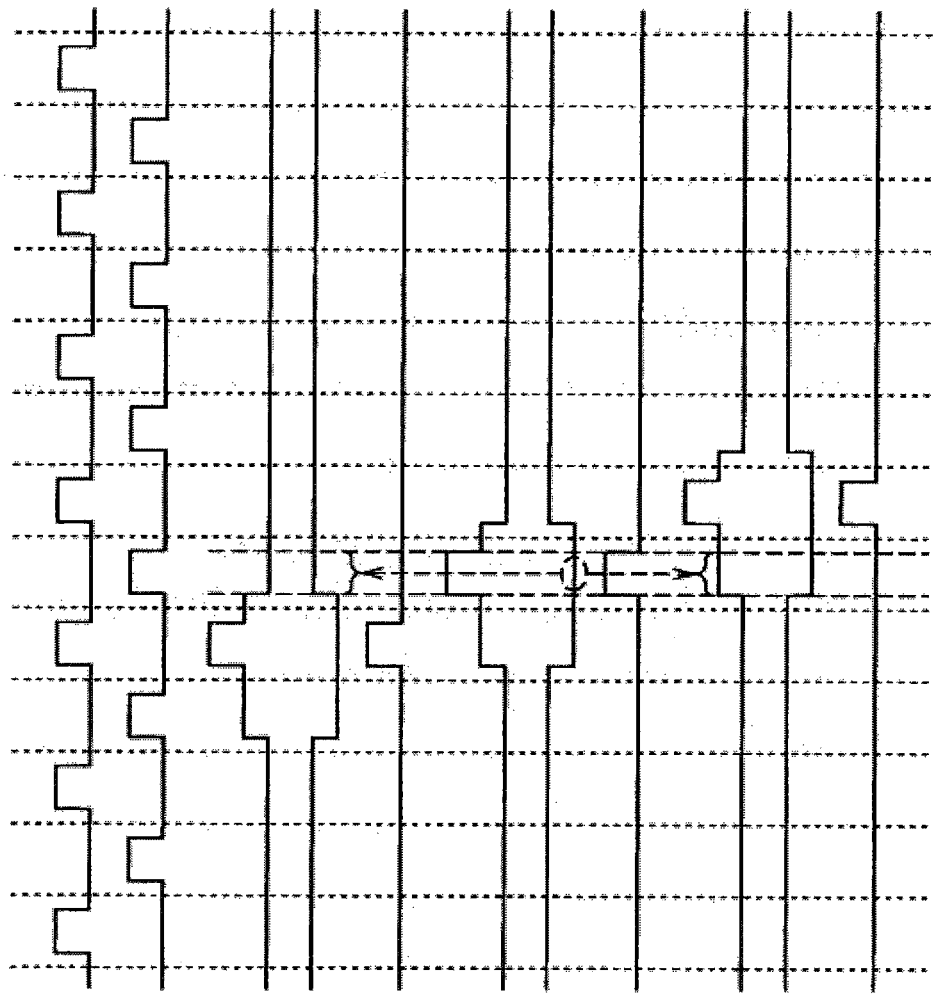
FIG. 19 is a diagram for explaining the drive load of a shift stage.

The potential decrease of the node B in the period of the floating state thereof causes the occurrence of the floating state of the node A as described above with FIG. 14. This floating state of the node A causes a phenomenon that the clock signal input from the clock input terminal CK via the coupling capacitance turns on the thin film transistor N21 and an erroneous transfer pulse appears at the output node OUT.

To address this problem, in this form example, it is proposed to use a configuration in which the leakage amount of the thin film transistor N25 is structurally larger than that of the thin film transistors N23(1) and N23(2), with focus on the characteristic that the second power supply Vdd can be utilized. That is, a method is proposed in which the off-leakage that causes the potential of the node B to be lowered toward the lower potential VSS is structurally decreased to thereby enhance the reliability of the shift operation.

(a) Method of Utilizing Difference in Transistor Size

As a first method, the present inventors focus attention on the transistor size. Specifically, the present inventors focus attention on the characteristic that the off-leakage through a thin film transistor becomes larger as the ratio of the channel width W of the thin film transistor to the channel length L thereof (i.e. W/L) becomes higher.

Based on this characteristic, the transistor sizes are so determined that W/L of the thin film transistor N25 is larger than W/L of the thin film transistors N23(1) and N23(2).

Figure 37:
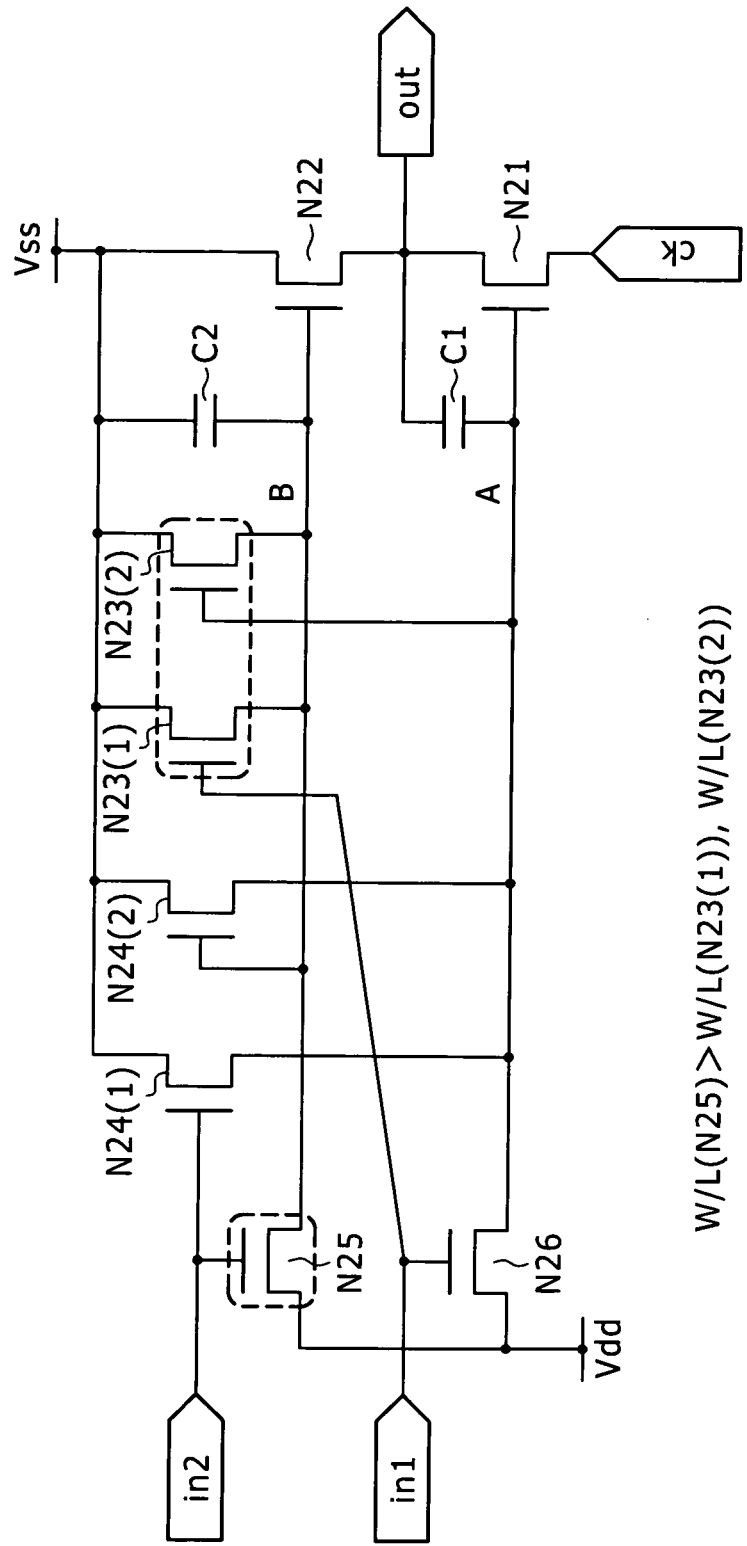
FIG. 37 is a diagram showing a form example of a shift stage (NMOS type)
Figure 38:
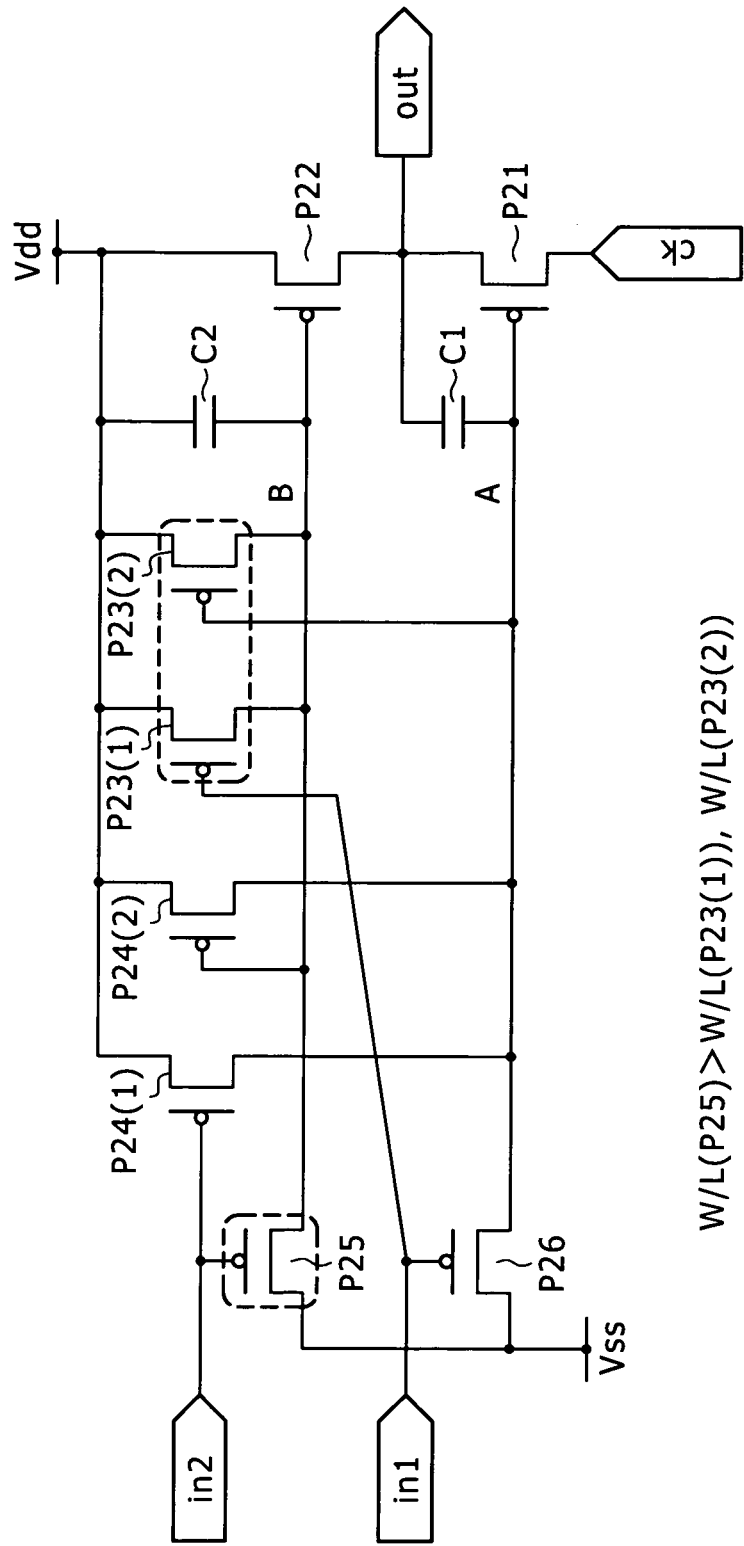
FIG. 38 is a diagram showing a form example of a shift stage (PMOS type)

FIG. 37 shows a configuration example of the NMOS-type shift stage, and FIG. 38 shows a configuration example of the PMOS-type shift stage.

As long as the sizes of the thin film transistors surrounded by the dashed line and the dotted line in the diagrams satisfy the above-described relationship, the other thin film transistors may have any size.

Therefore, the other thin film transistors may have the same size as that of the thin film transistors N23(1) and N23(2) or P23(1) and P23(2), or may have the same size as that of the thin film transistor N25 or P25. Alternatively, they may have a third size different from these sizes.

In any case, this larger off-leakage of the thin film transistor N25 or P25 makes it easy to hold the potential of the node B that is at the H level and in the floating state. This can enhance the reliability of the drive operation.

(b) Method of Utilizing Difference in Gate Structure of Transistor

As a second method, the present inventors focus attention on the gate structure. FIG. 39 shows the sectional structures of thin film transistors with focus on difference in the gate structure.

Figure 39A:
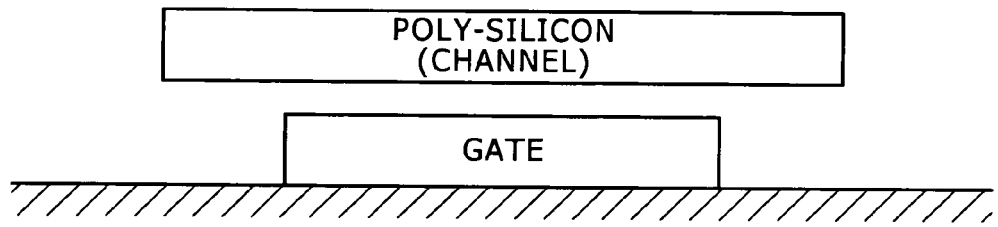
FIGS. 39A, 39B, and 39C are diagrams for explaining the gate structures of thin film transistors.
Figure 39B:
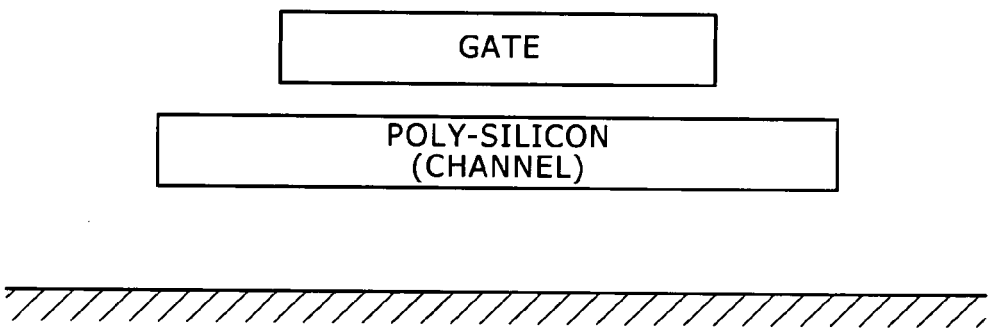

FIGS. 39A and 39B show thin film transistors having a structure in which a gate electrode is formed on merely one side of the channel layer. Hereinafter, this structure will be referred to as the single-sided gate structure.

The structure shown in FIG. 39A, in which the gate electrode is disposed under the channel layer, is referred to as the bottom-gate structure.

The structure shown in FIG. 39B, in which the gate electrode is disposed over the channel layer, is referred to as the top-gate structure.

Figure 39C:
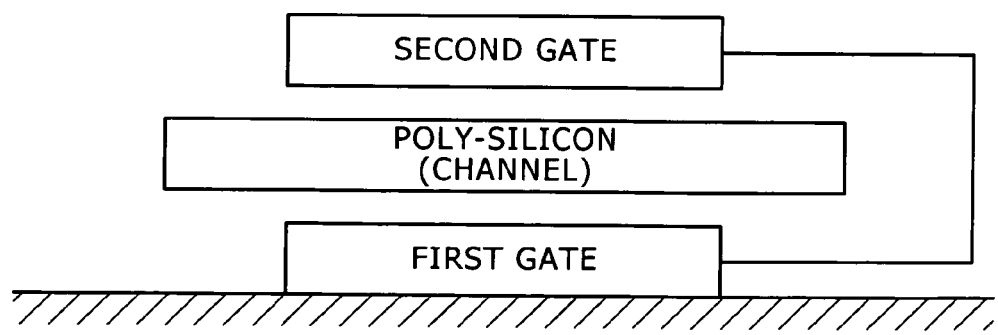

FIG. 39C shows a thin film transistor having a structure in which gate electrodes are formed on both the sides of the channel layer (over and under the channel layer). Hereinafter, this structure will be referred to as the double-sided gate structure. In the structure of FIG. 39C, the upper gate electrode and the lower gate-electrode are controlled by the same power supply. However, it is also possible to control them by different power supplies. Using different power supplies can shift the operating point, and thus can control the off-leakage.

It is known that the intensity of the gate-source electric field in the thin film transistor having the double-sided gate structure is higher than that of the gate-source electric field in the thin film transistor having the single-sided gate structure. Therefore, it is generally known that the thin film transistor with the double-sided gate structure has a characteristic of having large on-current and a small S value.

Figure 40A:
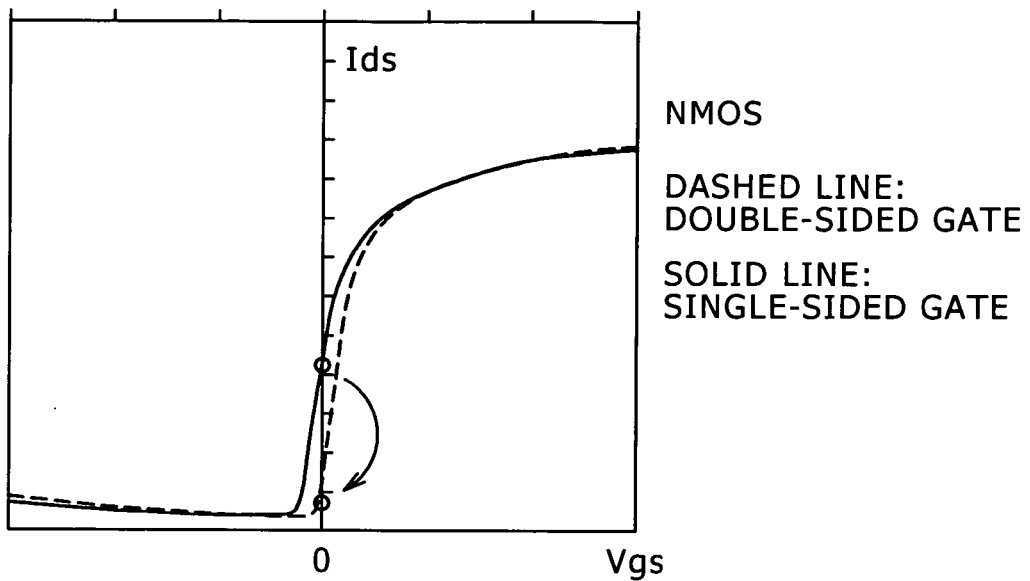
FIGS. 40A and 40B are diagrams for explaining the relationship between the gate structure and off-leakage.
Figure 40B:
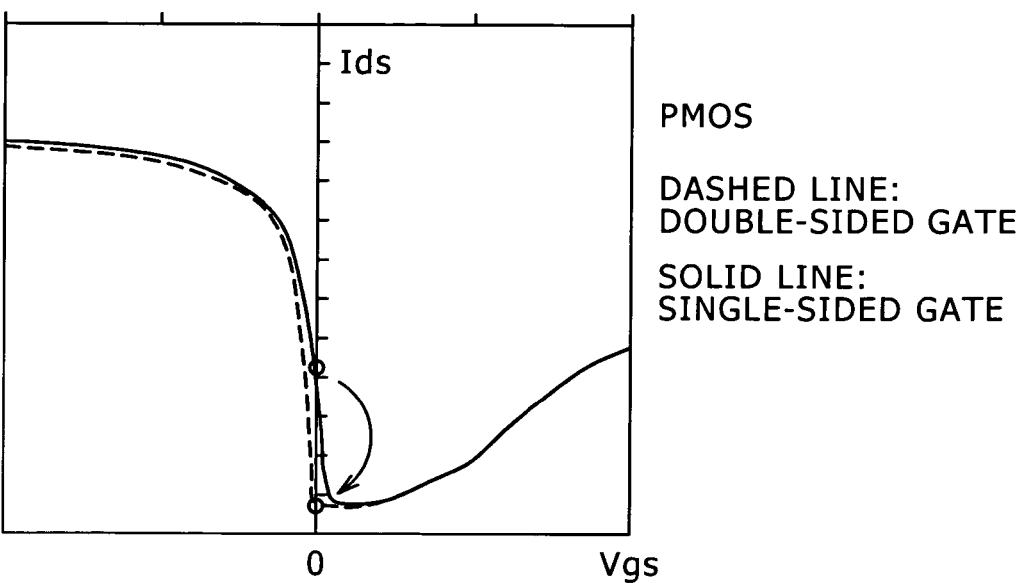

FIG. 40 shows the result of actual measurement relating to the relationship between the gate structure and the off-leakage. FIG. 40A shows the relationship between the gate-source voltage Vgs and the drain-source current Ids in an NMOS thin film transistor. FIG. 40B shows the relationship between the gate-source voltage Vgs and the drain-source current Ids in a PMOS thin film transistor.

To show the off-leakage current, the ordinates in FIGS. 40A and 40B are represented on the log scale.

Comparison at the operating point of the gate-source voltage Vgs=0 V makes it apparent that the off-leakage current of the thin film transistor having the double-sided gate structure is smaller than that of the thin film transistor having the single-sided gate structure by two to three orders of magnitude. This means that the off-resistance of the single-sided gate structure is lower than that of the double-sided gate structure by two to three orders of magnitude.

Based on this characteristic, in this method, the single-sided gate structure is employed for the thin film transistor N25 or P25, and the double-sided gate structure is employed for the thin film transistors N23(1) and N23(2) or P23(1) and P23(2).

Figure 41:
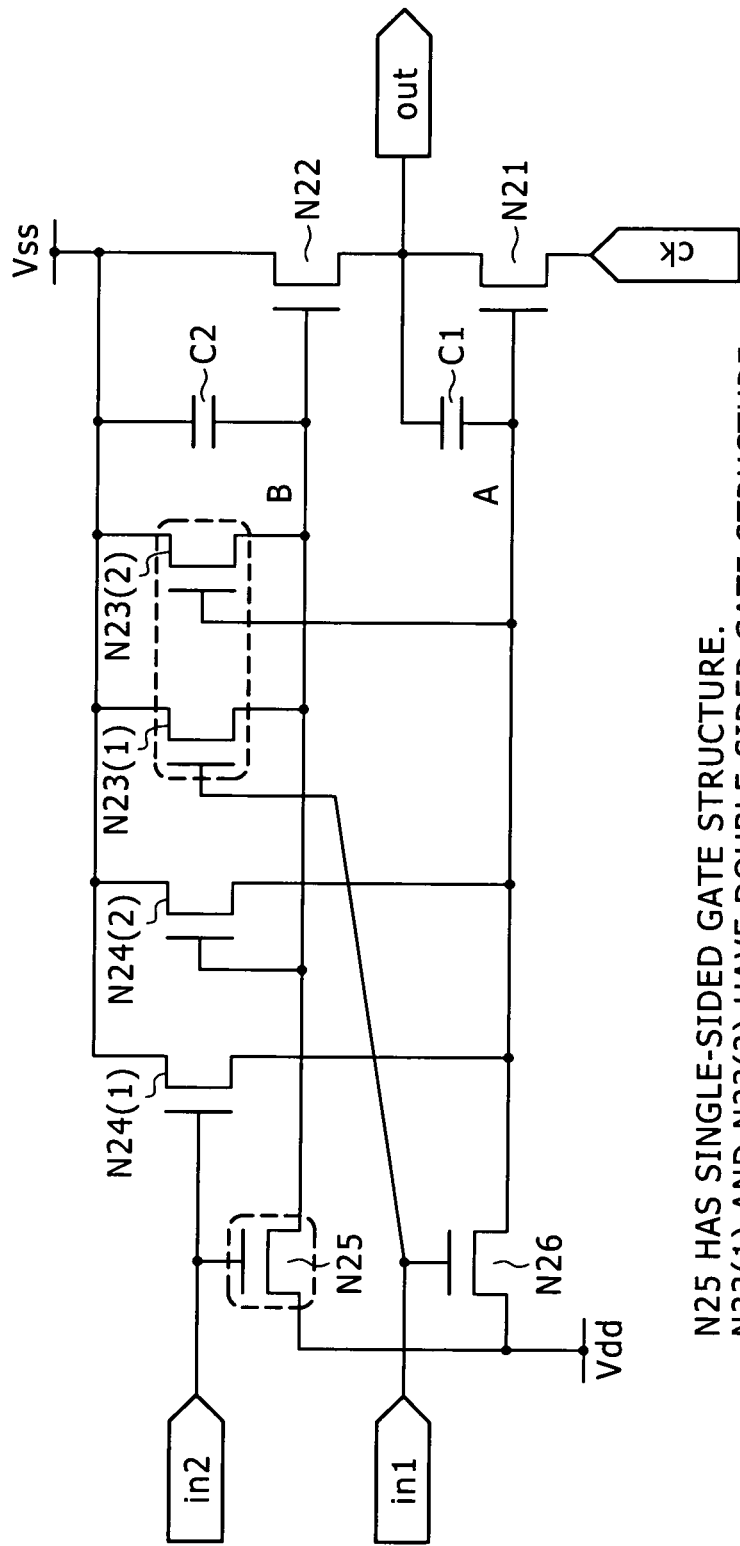
FIG. 41 is a diagram showing a form example of a shift stage (NMOS type)
Figure 42:
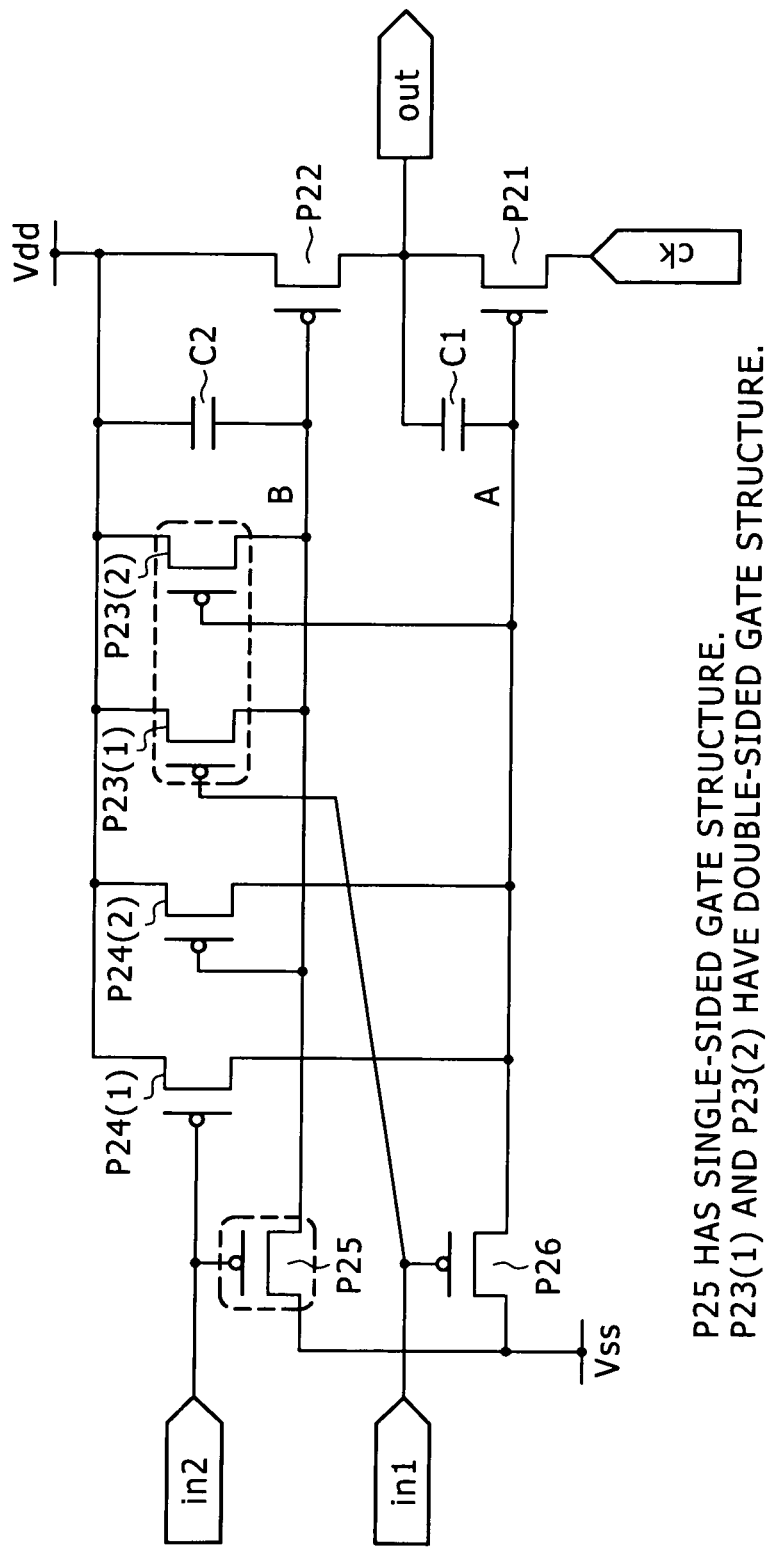
FIG. 42 is a diagram showing a form example of a shift stage (PMOS type)

FIG. 41 shows a configuration example of the NMOS-type shift stage, and FIG. 42 shows a configuration example of the PMOS-type shift stage.

As long as the gate structures of the thin film transistors surrounded by the dashed line and the dotted line in the diagrams satisfy the above-described relationship, the other thin film transistors may have any gate structure.

Therefore, the gate structure of each of the other thin film transistors may be either the single-sided gate structure or the double-sided gate structure.

In any case, this larger off-leakage of the thin film transistor N25 or P25 makes it easy to hold the potential of the node B that is at the H level and in the floating state. This can enhance the reliability of the drive operation.

(c) Method of Utilizing Difference in Source-Shield Length of Transistor

As a third method, the present inventors focus attention on the source-shield length. Initially, the relationship between the source-shield length and the off-leakage amount will be described below with reference to FIGS. 43 and 44.

Figure 43A:
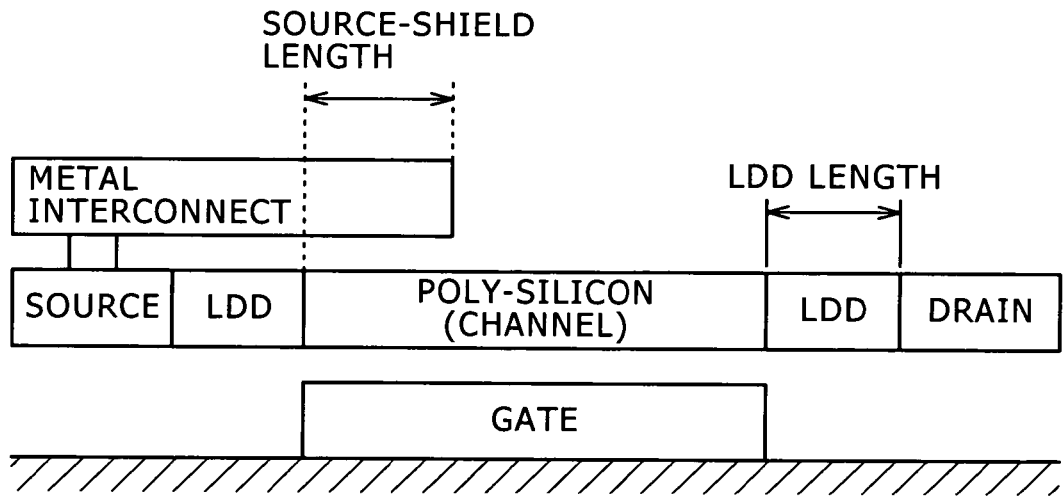
FIGS. 43A and 43B are diagrams for explaining the relationship between the source-shield length and off-leakage (NMOS type)

FIG. 43A shows the sectional structure of an NMOS thin film transistor.

In the case of the NMOS thin film transistor, the source-shield length refers to the length of the partial portion of the metal interconnect (source electrode) connected to the source, as the part covering the channel region. A lightly doped drain (LDD) region is not included in this channel region.

Figure 44A:
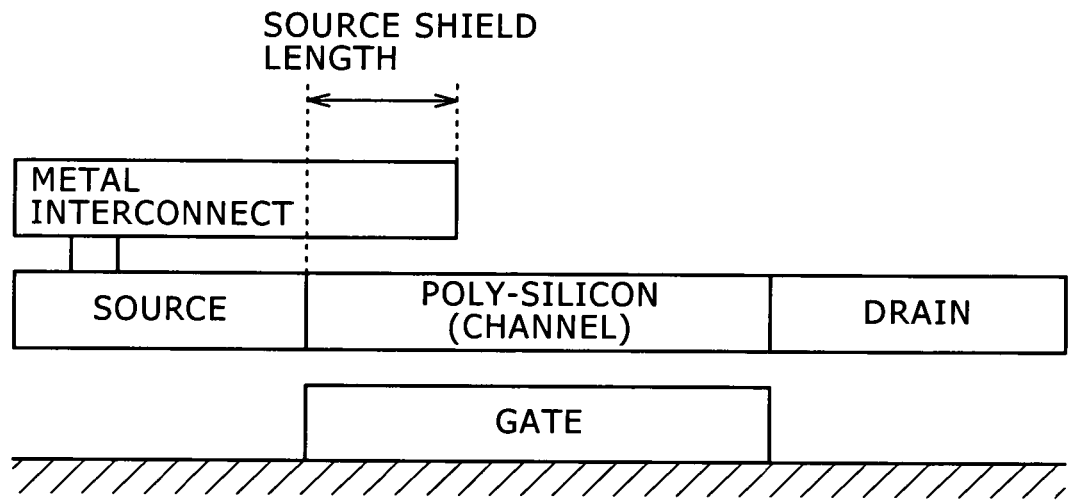
FIGS. 44A and 44B are diagrams for explaining the relationship between the source-shield length and off-leakage (PMOS type)

FIG. 44A shows the sectional structure of a PMOS thin film transistor. Also in the case of the PMOS thin film transistor, the source-shield length refers to the length of the partial portion of the metal interconnect (source electrode) connected to the source, as the part covering the channel region. In the structure of FIG. 44A, the PMOS thin film transistor does not have an LDD layer.

Figure 43B:
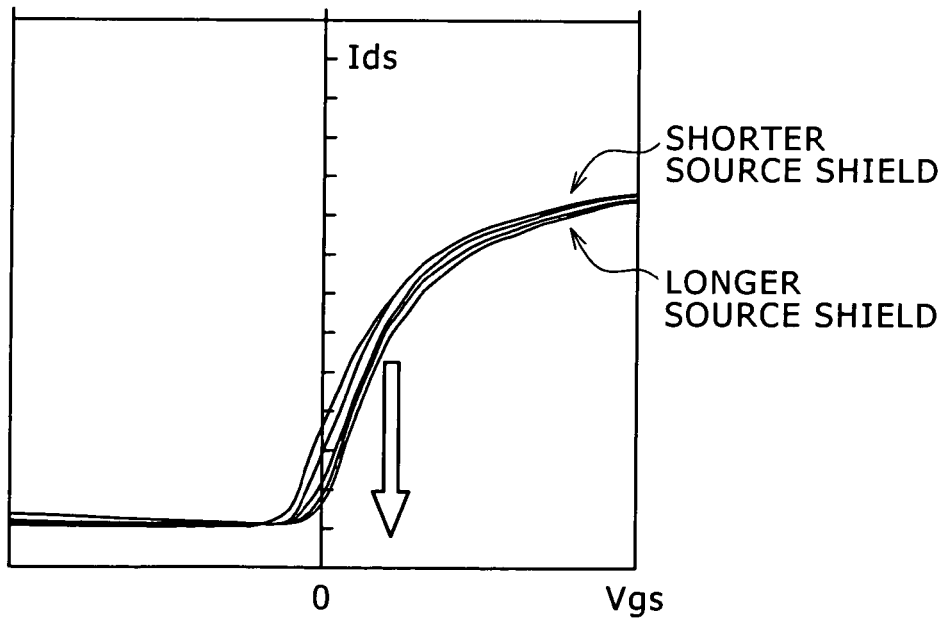
Figure 44B:
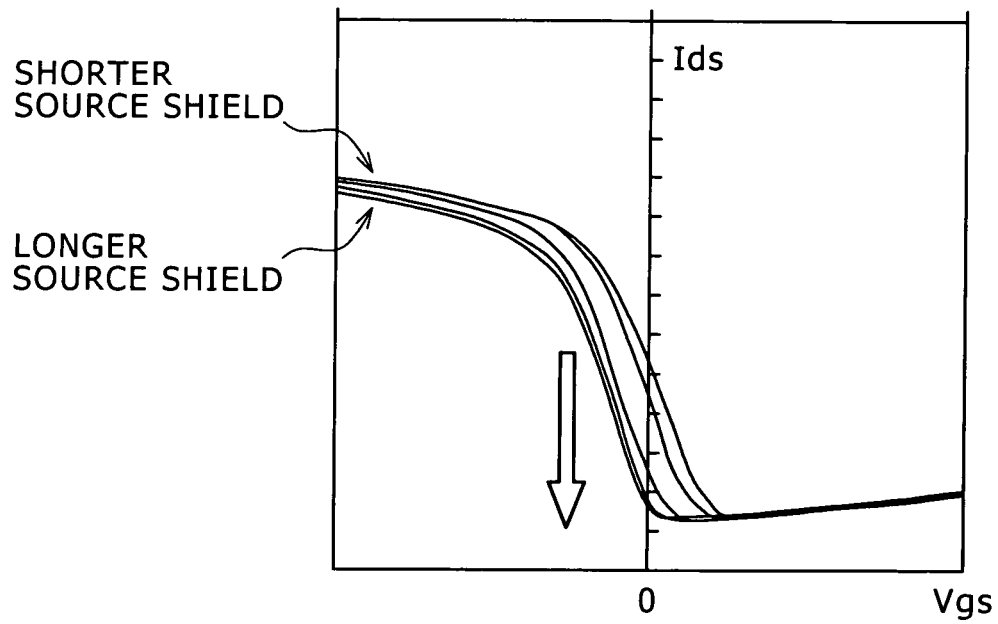

FIG. 43B shows the relationship between the gate-source voltage Vgs and the drain-source current Ids in the NMOS thin film transistor. FIG. 44B shows the relationship between the gate-source voltage Vgs and the drain-source current Ids in the PMOS thin film transistor. In either case, the ordinate is represented on the log scale.

As shown in FIGS. 43B and 44B, the following characteristic is found in either case: smaller source-shield length provides larger off-leakage and larger source-shield length provides smaller off-leakage.

Based on this characteristic, in this method, a thin film transistor having a relatively-small source-shield length is employed as the thin film transistor N25 or P25, and thin film transistors having a relatively-large source-shield length are employed as the thin film transistors N23(1) and N23(2) or P23(1) and P23(2).

Figure 45:
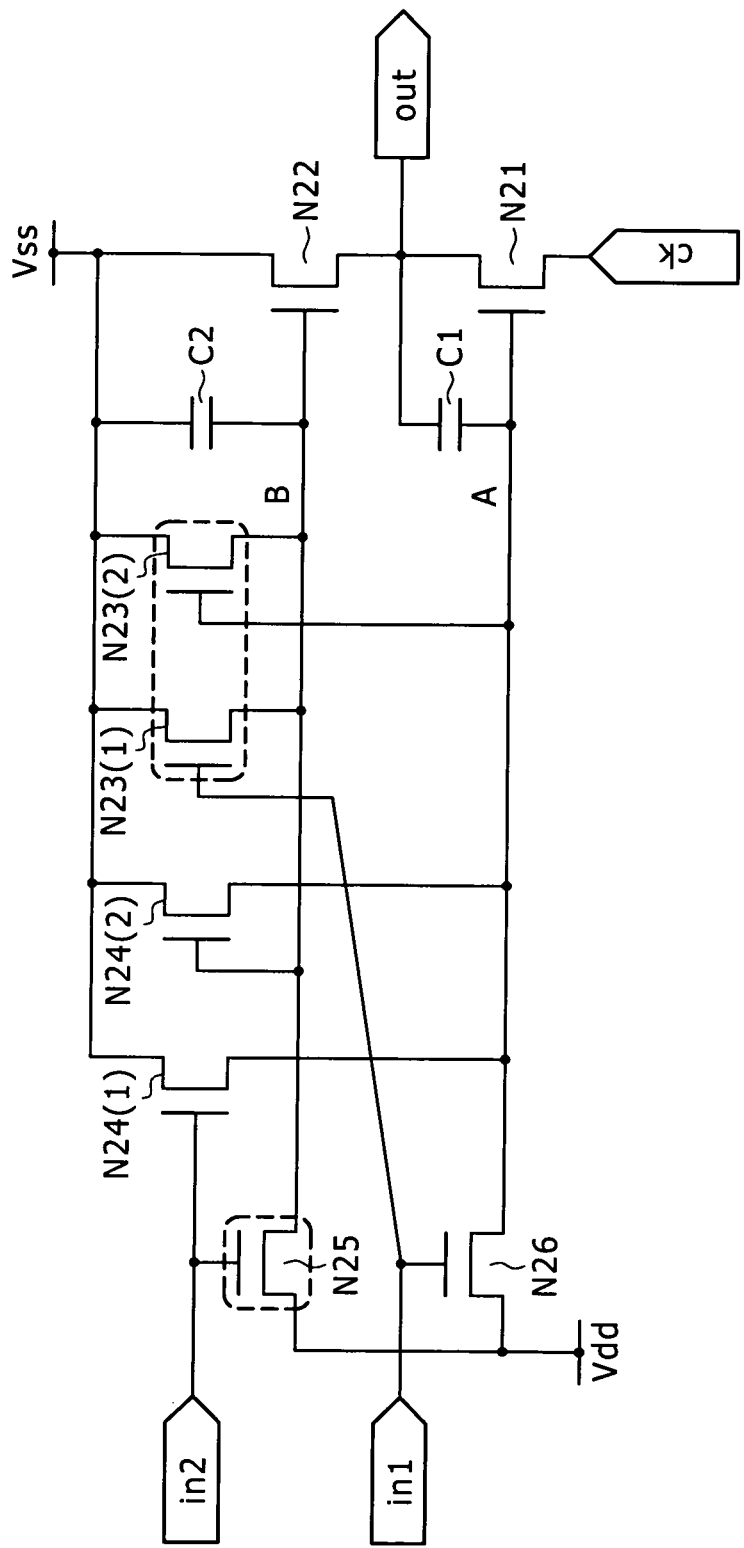
FIG. 45 is a diagram showing a form example of a shift stage (NMOS type)
Figure 46:
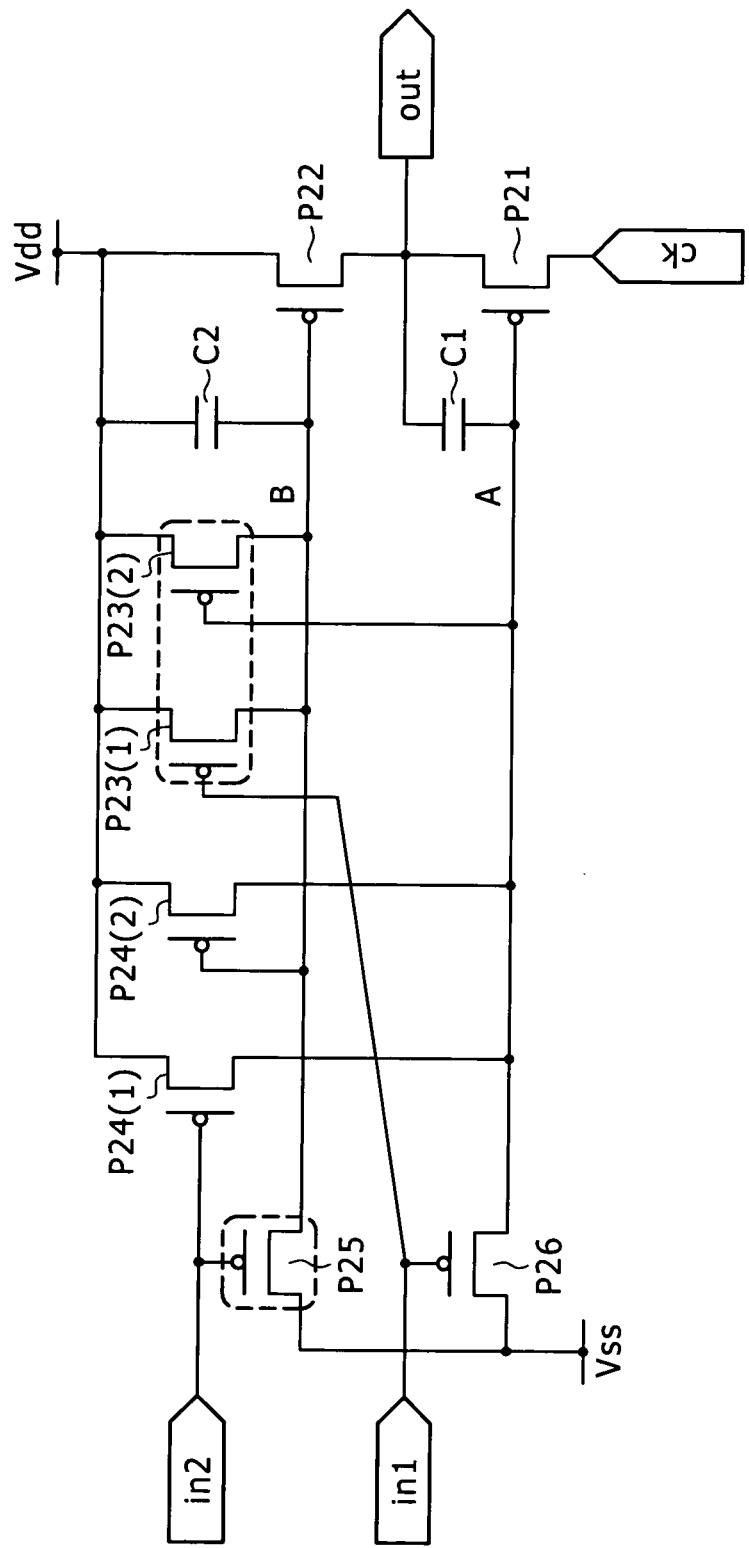
FIG. 46 is a diagram showing a form example of a shift stage (PMOS type)

FIG. 45 shows a configuration example of the NMOS-type shift stage, and FIG. 46 shows a configuration example of the PMOS-type shift stage.

As long as the source-shield lengths of the thin film transistors surrounded by the dashed line and the dotted line in the diagrams satisfy the above-described relationship, the other thin film transistors may have any source-shield length.

Therefore, the other thin film transistors may have a source-shield length larger than the above-described two kinds of source-shield lengths, or one between the above-described two kinds of source-shield lengths, or one smaller than the above-described two kinds of source-shield lengths.

In any case, this larger off-leakage of the thin film transistor N25 or P25 makes it easy to hold the potential of the node B that is at the H level and in the floating state. This can enhance the reliability of the drive operation.

The purpose of the provision of the LDD region in the NMOS thin film transistor is to greatly reduce the off-leakage by electric field relaxation.

If the NMOS thin film transistor does not have the LDD region, the off-leakage current is on the order of $10^{-8}$. In contrast, if it has the LDD region, the off-leakage current can be decreased to one on the order of $10^{-13}$, although depending on the LDD length. On the other hand, the off-leakage current in the PMOS thin film transistor is on the order of $10^{-13}$ without the LDD region. Therefore, there is no need to apply the LDD structure, which increases the number of processes, to the PMOS thin film transistor. The desired value of the off-leakage current in driving is $10^{-10}$ or smaller.

If the source and the drain are interchanged (the metal interconnect is connected to the drain) in the structures of FIGS. 43 and 44, the characteristic can be shifted depending on the drain shield. As the shield length of the drain shield is increased, the TFT characteristic is further shifted toward the depletion side. Thus, at the circuit operating point of Vgs=0, larger shield length provides larger off-leakage.

However, the amount of the TFT characteristic shift in relation to the drain shield depends greatly on the drain potential. In addition, the drain potential varies and thus is difficult to control in the operation (for a TFT, the source potential is the reference potential and the drain potential is regarded as the relative potential difference with respect to the source potential). Although it is possible to control the off-leakage by using the drain shield in principle, the off-leakage is large at the operating point in the form examples of the present invention and thus erroneous operation possibly occurs. Therefore, it is difficult to utilize the drain shield.

In the case of the source shield, larger shield length shifts the TFT characteristic toward the enhancement side with a higher degree, and larger shield length provides smaller off-leakage at the circuit operating point of Vgs=0. Because the source potential is the reference potential for a TFT, the source shield gives the electrically-stable TFT characteristic.

(d) Method of Utilizing Difference in LDD Length of Transistor

The above-described three methods can be applied to both NMOS and PMOS transistors. However, another method other than these methods is also available as long as this method is applied to an NMOS thin film transistor.

In this method as a fourth method, the present inventors focus attention on the LDD length of an NMOS thin film transistor. The LDD region refers to the low-concentration impurity region provided between the source/drain and the channel as shown in FIG. 43A. The LDD region is used to avoid focusing of a high electric field on the corresponding region part. It is known that smaller LDD length provides larger off-leakage.

Based on this characteristic, in this method, a thin film transistor having a relatively-small LDD length is employed as the thin film transistor N25, and thin film transistors having a relatively-large LDD length are employed as the thin film transistors N23(1) and N23(2).

Figure 47:
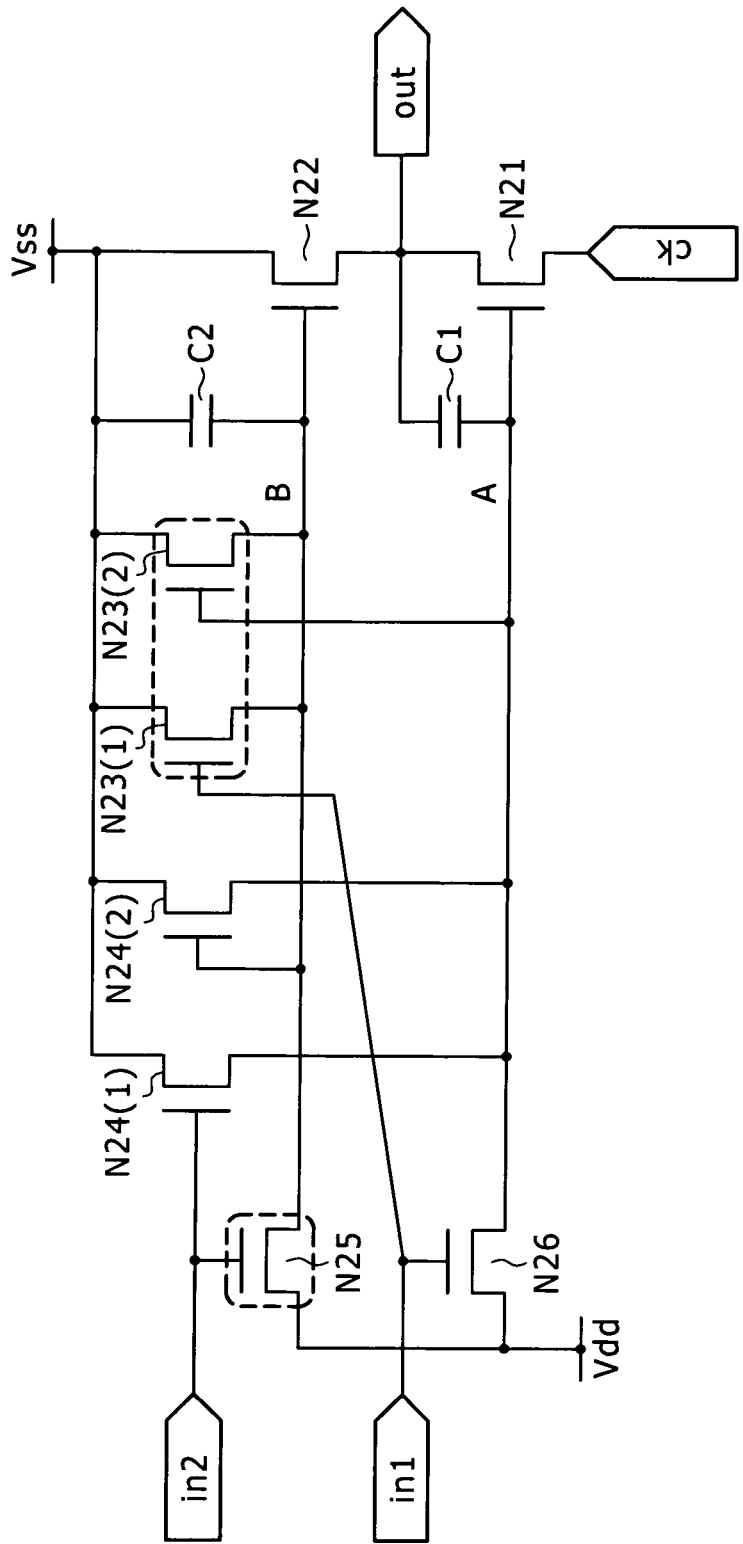
FIG. 47 is a diagram showing a form example of a shift stage (NMOS type)

FIG. 47 shows a configuration example of the NMOS-type shift stage.

As long as the LDD lengths of the thin film transistors surrounded by the dashed line and the dotted line in the diagram satisfy the above-described relationship, the other thin film transistors may have any LDD length.

Therefore, the other thin film transistors may have an LDD length larger than the above-described two kinds of LDD lengths, or one between the above-described two kinds of LDD lengths, or one smaller than the above-described two kinds of LDD lengths.

In any case, this larger off-leakage of the thin film transistor N25 makes it easy to hold the potential of the node B that is at the H level and in the floating state. This can enhance the reliability of the drive operation.

(B-5) Fifth Form Example of Shift Stage

In the following, a technique to decrease the potential amplitude of the first and second input terminals in1 and in2 will be described below. Specifically, a description will be made below about the configuration of a shift stage in which amplitude of VSS/Vdd appears at the output node OUT even if the amplitude of the input to the first and second input terminals in1 and in2 is not VSS/Vdd.

However, the shift stages according to the above-described respective form examples are premised on the shift register circuit having the connection structure shown in FIG. 21. Therefore, to the first and second input terminals of the shift stages other than the first shift stage and the final shift stage, the transfer pulse with the maximum amplitude of VSS/Vdd is input. As a result, the pulses whose amplitude can be decreased are limited to two pulses: the start pulse st input to the first shift stage; and the end pulse 'end' input to the final shift stage.

However, the amplitude decrease of these two pulses means that an amplitude decrease for the generation circuits of these pulses can be achieved. If the amplitude is small, a voltage decrease of the drive power supply desired for the respective generation circuits of these two pulses can also be achieved. Thus, reduction in the power consumption of these two pulses can be achieved.

(a) NMOS Type

Figure 48:
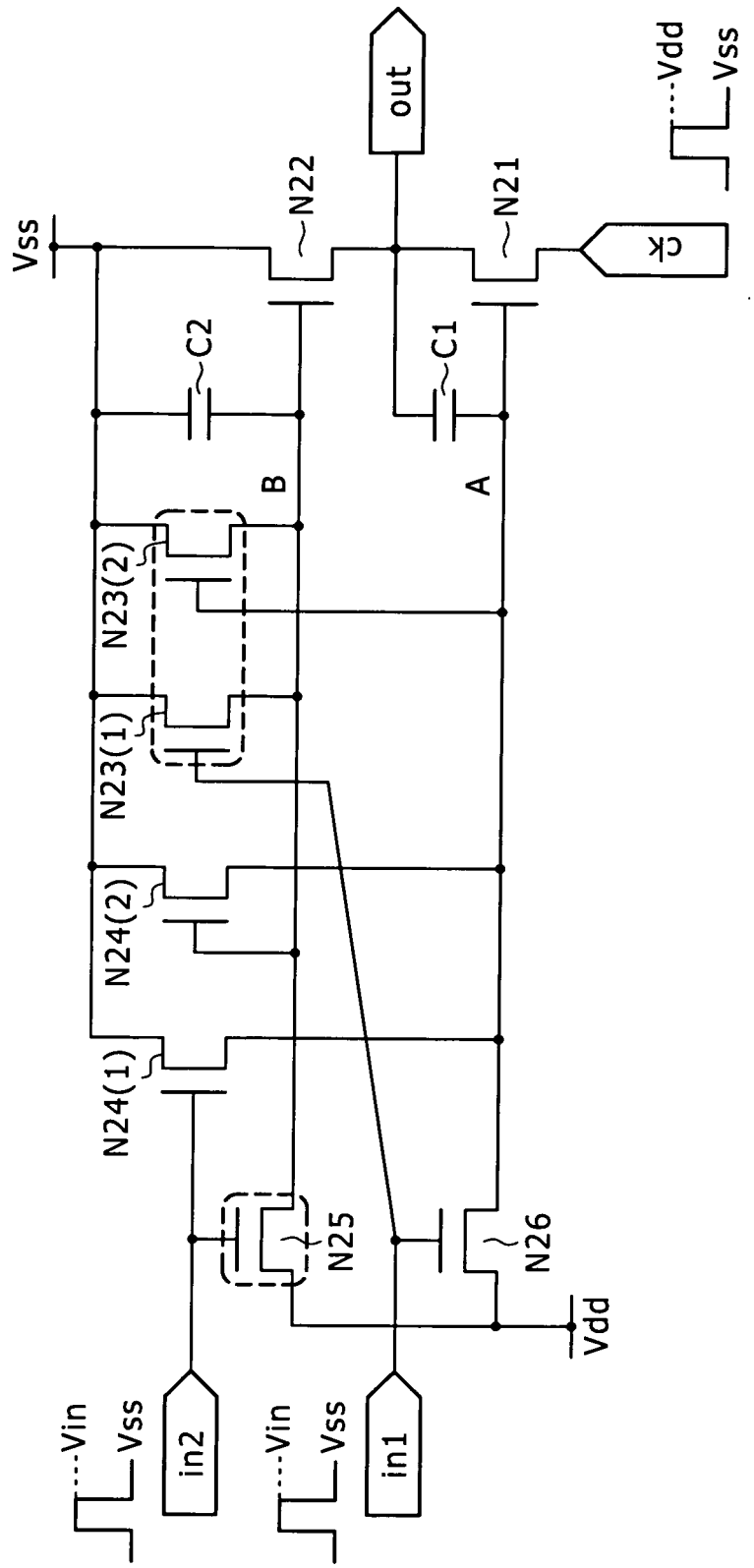
FIG. 48 is a diagram showing a form example of a shift stage (NMOS type)
Figure 49:
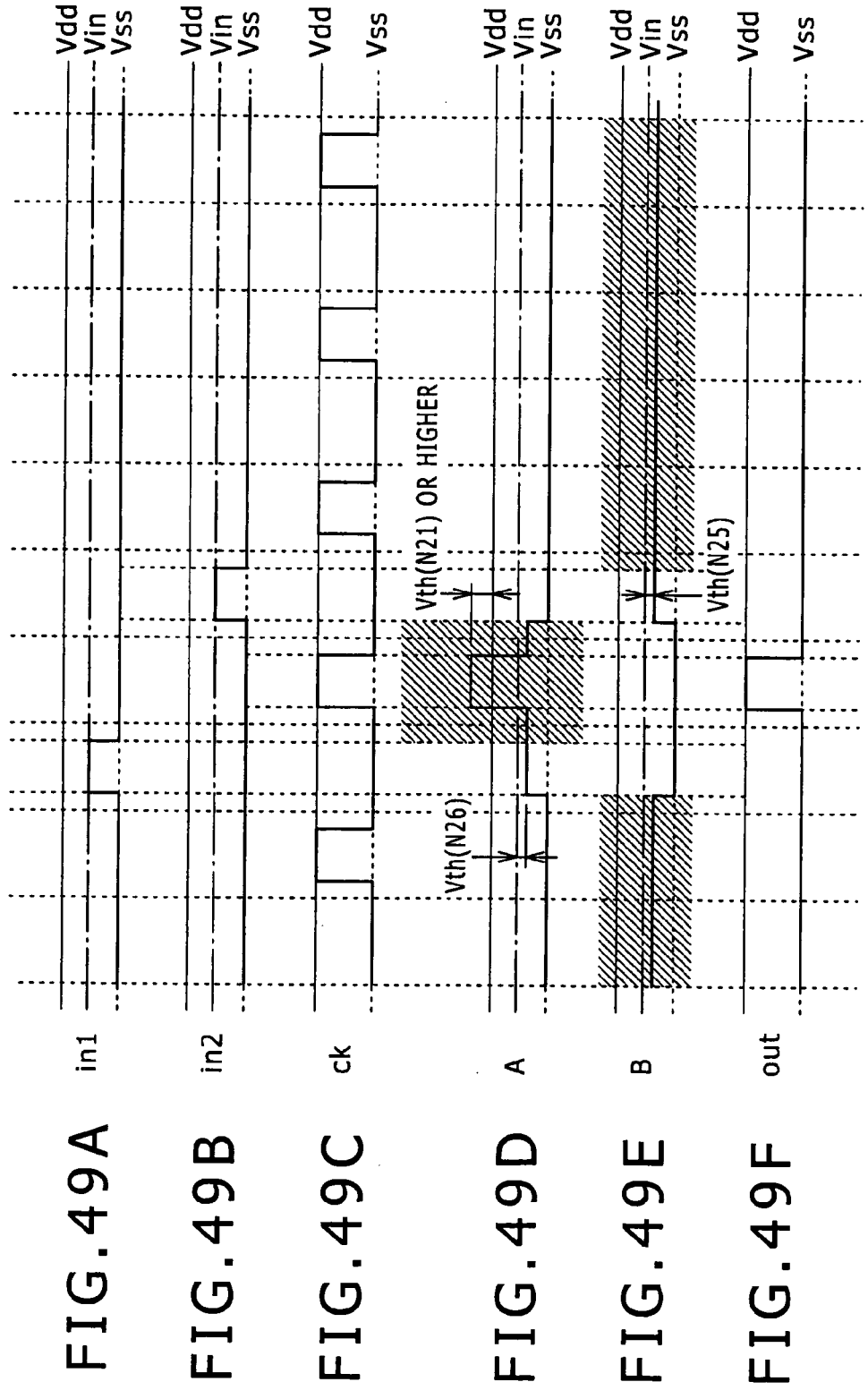
FIG. 49 is a diagram showing drive waveforms of the shift stage shown in FIG. 48.

FIG. 48 shows a fifth form example of the shift stage included in the shift register circuit. FIG. 49 shows the corresponding drive waveforms. The drive waveforms shown in FIGS. 49A to 49F correspond to those shown in FIGS. 31A to 31F, respectively.

The configuration of the shift stage shown in FIG. 48 is the same as that of the shift stage according to the third form example (FIG. 33).

However, as shown in FIGS. 49A and 49B, the H-level potential of the pulse signal input to the first and second input terminals in1 and in2 is Vin lower than the potential Vdd of the first power supply.

Therefore, the operation condition desired for the shift stage shown in FIG. 48 is that the transfer pulse with the maximum amplitude appears at the output node OUT due to the bootstrap operation of the node A even with the input of the pulse signal having the smaller amplitude.

Figure 50:
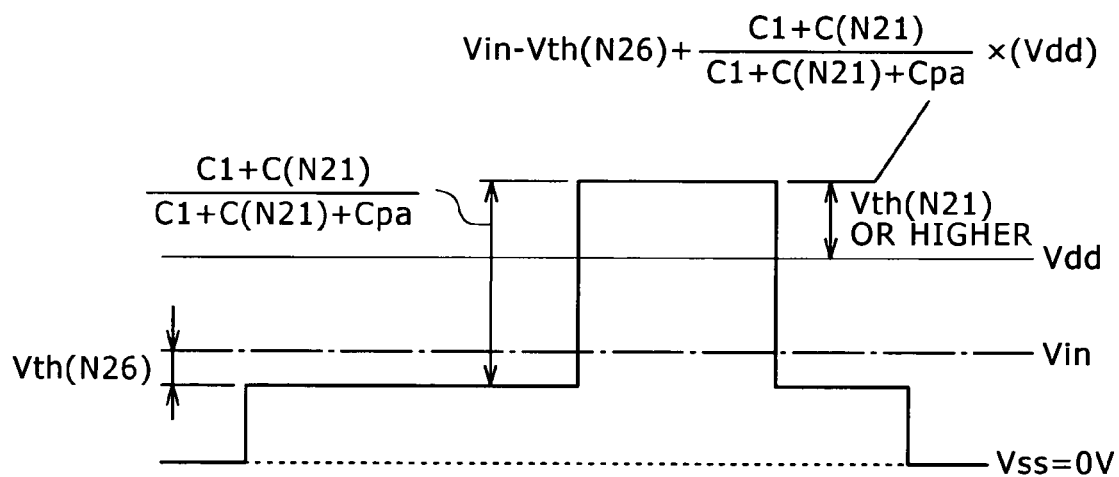
FIG. 50 is a diagram showing the potential relationship necessary for bootstrap operation.

FIG. 50 shows the drive condition desired for the node A. In FIG. 50, the lower potential VSS is defined as 0 V.

The potential of the node A except for in the bootstrap operation thereof is represented as Vin−Vth(N26) if the higher potential Vin is input to the first input terminal in1.

In this case, the amplitude at the time of the bootstrap operation is represented as $\{(C1+C(N21))/(C1+C(N21)+Cpa)\}*Vdd$.

Therefore, if the value obtained by subtracting the output potential Vdd from the maximum potential, which arises from addition of the amplitude potential at the time of the bootstrap operation to the potential Vin−Vth(N26) obtained before the bootstrap operation, is equal to or higher than the threshold voltage Vth(N21) of the thin film transistor N21, the same operation as that in the above-described respective form examples can be achieved although the amplitude of the start pulse st and the end pulse 'end' is decreased.

C(N21) denotes the gate capacitance of the thin film transistor N21, and Cpa denotes the total parasitic capacitance of the node A, except for C(N21) and C1.

At the time of the design, the values of the complementary capacitance C1, the gate capacitance C(N21), and the total parasitic capacitance Cpa are optimized so that the above-described condition may be satisfied.

Figure 51:
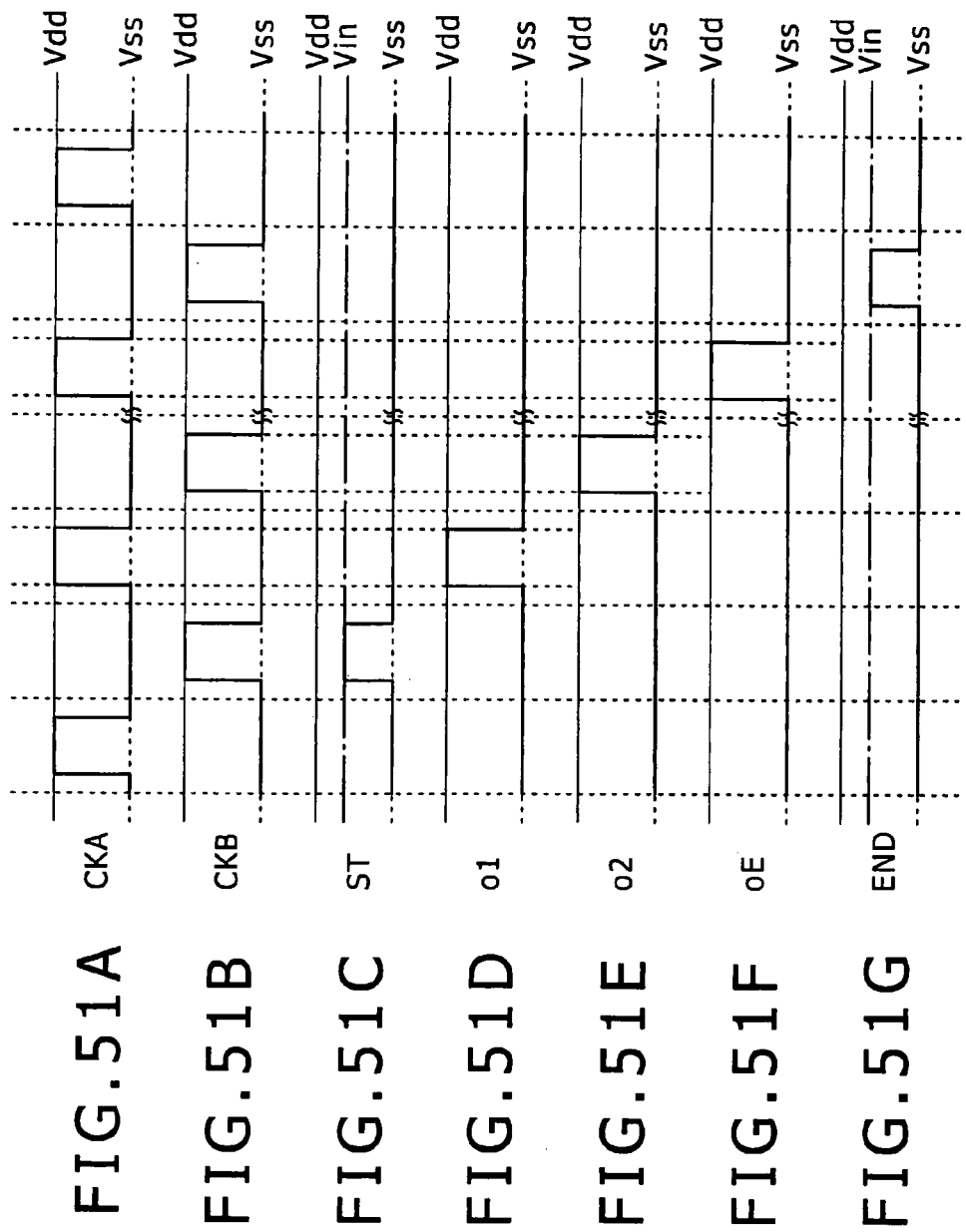
FIG. 51 is a diagram showing drive waveforms of a shift register circuit employing the shift stage shown in FIG. 48.

FIG. 51 shows drive pulse waveforms of the shift register circuit including the shift stage according to this form example. The drive waveforms shown in FIGS. 51A to 51G correspond to those shown in FIGS. 18A to 18G, respectively.

It can be understood from FIG. 51 that the output pulse having the same amplitude as that of the clock signal appears at the output node of each shift stage although the signal amplitude of the start pulse st and the end pulse 'end' is smaller as shown in FIGS. 51C and 51G.

Although the third form example is taken as an example in the above description, the technique to decrease the amplitude of the start pulse st and the end pulse 'end' can be applied also to the first, second, and fourth form examples similarly.

(b) PMOS Type

The above-described technique to decrease the amplitude of the start pulse st and the end pulse 'end' can be applied also to a PMOS-type shift stage in the same manner. The desired parameter condition is the same as that of the NMOS-type shift stage.

Figure 52:
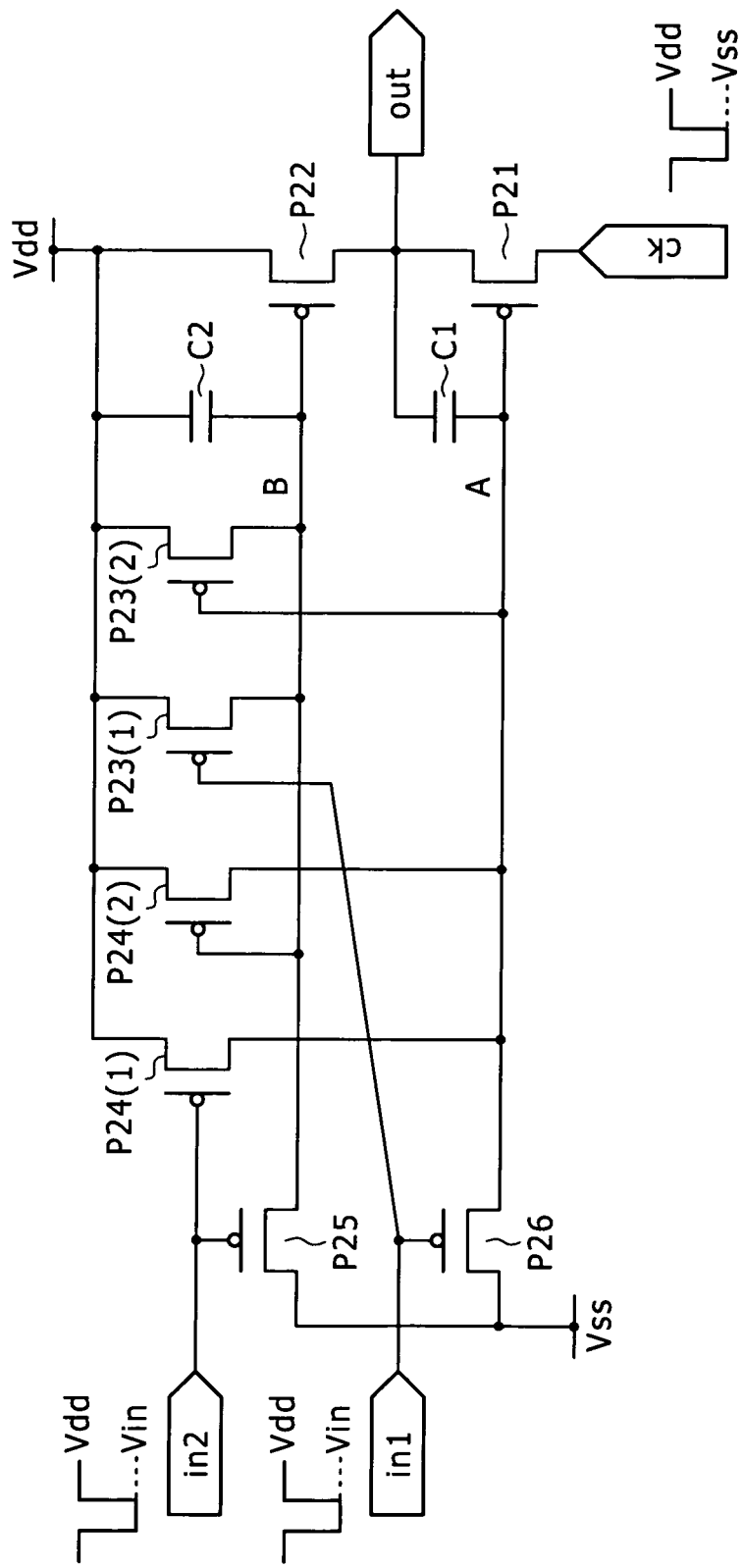
FIG. 52 is a diagram showing a form example of a shift stage (PMOS type)

FIG. 52 shows the circuit configuration of the PMOS-type shift stage according to this form example. Although the description of the drive waveforms of this PMOS-type shift stage is omitted, employing the shift stage according to this form example makes it possible to achieve a shift register circuit having the same advantages as those of the shift register circuit including the NMOS-type shift stage.

(B-6) Sixth Form Example of Shift Stage

A description will be made below about specific structure examples to achieve the amplitude decrease of the start pulse st and the end pulse 'end' input to the first and second input terminals in1 and in2 in the fifth form example.

(a) NMOS Type

In order to achieve the amplitude decrease of the pulse signal, a structure having a high bootstrap gain Gbt, represented by the following equation, should be employed.

$Gbt=(C1+C(N21))/(C1+C(N21)+Cpa)$

To increase the bootstrap gain Gbt, the total parasitic capacitance Cpa of the node A should be decreased. Alternatively, the complementary capacitance C1 and the gate capacitance C(N21) of the thin film transistor N21 should be increased.

In the present example, attention is focused on the gate capacitance C(N21) of the thin film transistor N21.

The relationship between the structure of the thin film transistor and the gate capacitance C(N21) will be described below with reference to FIG. 53.

Figure 53A:
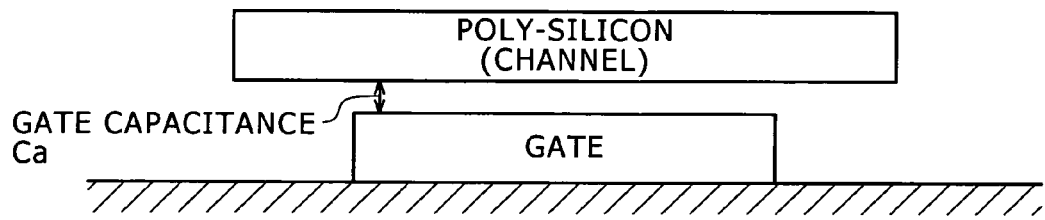
FIGS. 53A, 53B, and 53C are diagrams showing the relationship between the gate structure and the gate capacitance of a thin film transistor.
Figure 53B:
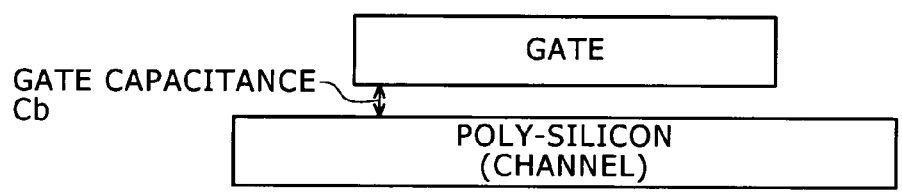
Figure 53C:
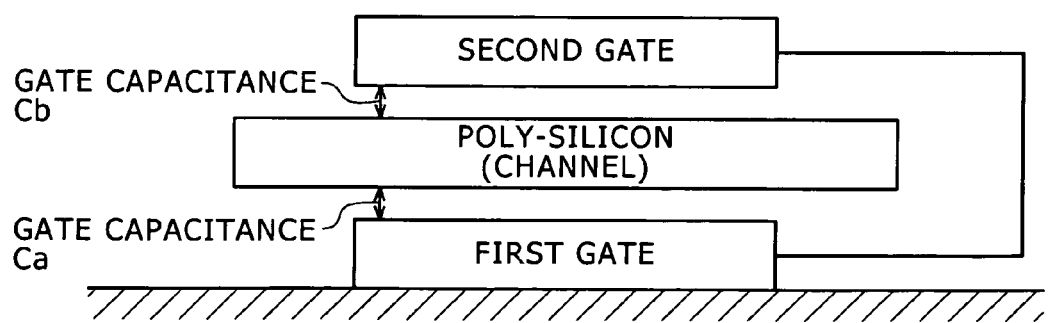

If the gate capacitance of the thin film transistor having the bottom-gate structure shown in FIG. 53A is defined as Ca and the gate capacitance of the thin film transistor having the top-gate structure shown in FIG. 53B is defined as Cb, the gate capacitance of the thin film transistor having a double-sided gate structure is represented as Ca+Cb. That is, by providing the thin film transistor N21 with the double-sided gate structure, the bootstrap gain can be increased. Higher bootstrap gain provides higher operation stability of the shift stage.

Figure 54:
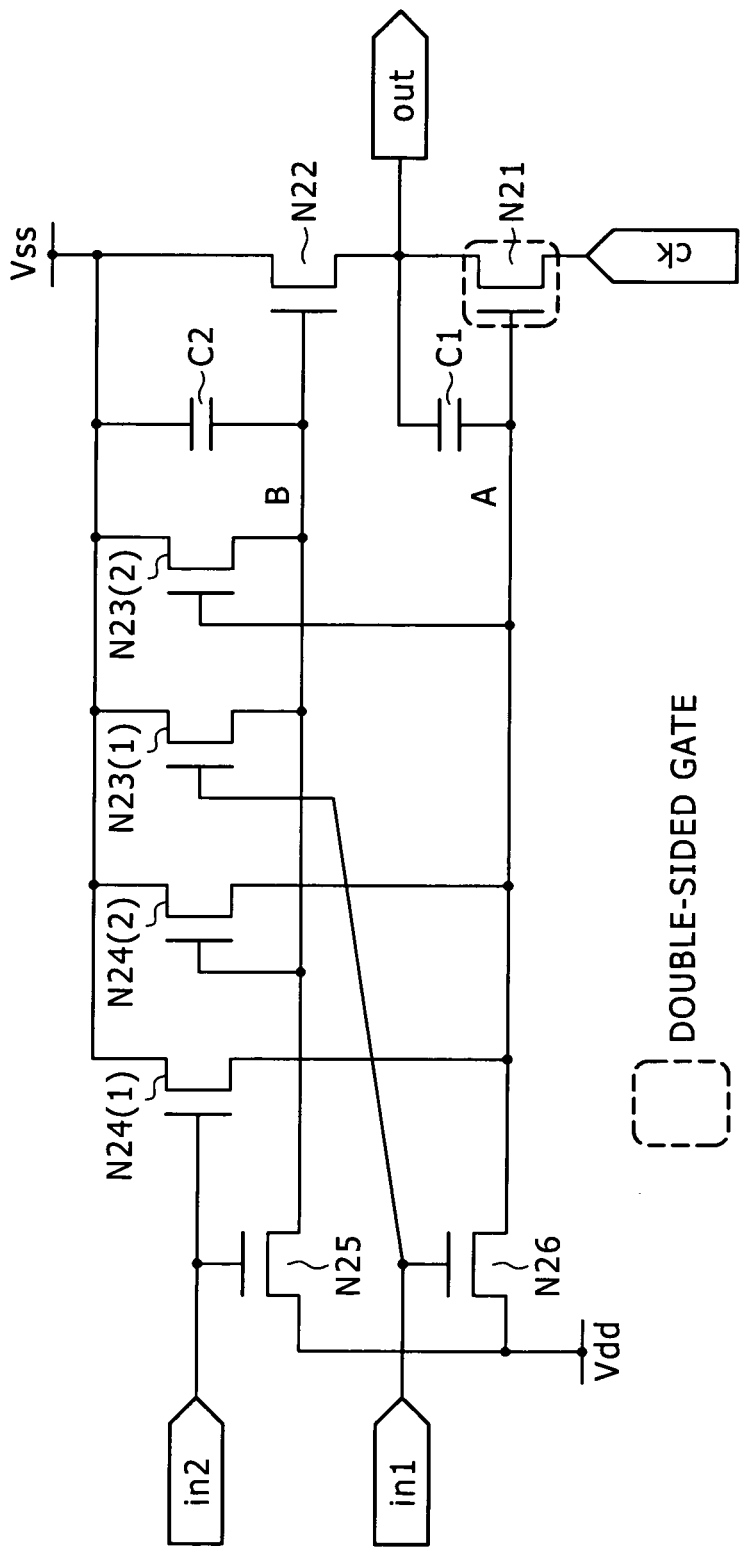
FIG. 54 is a diagram showing a form example of a shift stage (NMOS type)

FIG. 54 shows a sixth form example of the shift stage included in the shift register circuit. As shown in FIG. 54, the thin film transistor N21 having a double-sided gate structure is employed in the shift stage according to this form example. The double-sided gate structure intensifies the gate-source electric field. Thus, the on-current is increased. Therefore, the double-sided gate structure provides an advantage of enhancing the speed of the rising and falling (so-called transient) of the current amount of the output node OUT as shown in FIG. 55.

Figure 55A:
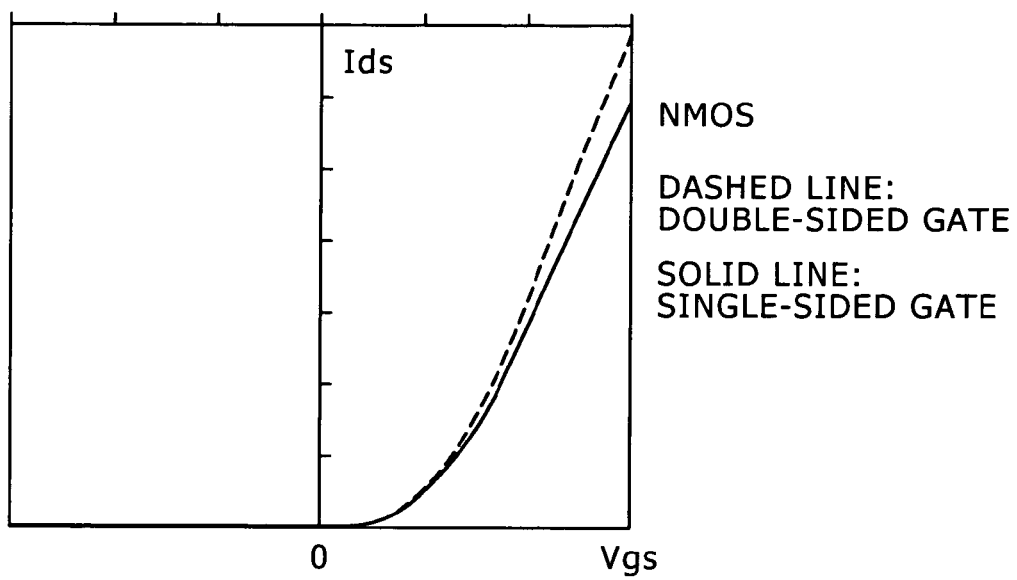
FIGS. 55A and 55B are diagrams for explaining the relationship between the gate structure and current of a thin film transistor.
Figure 55B:
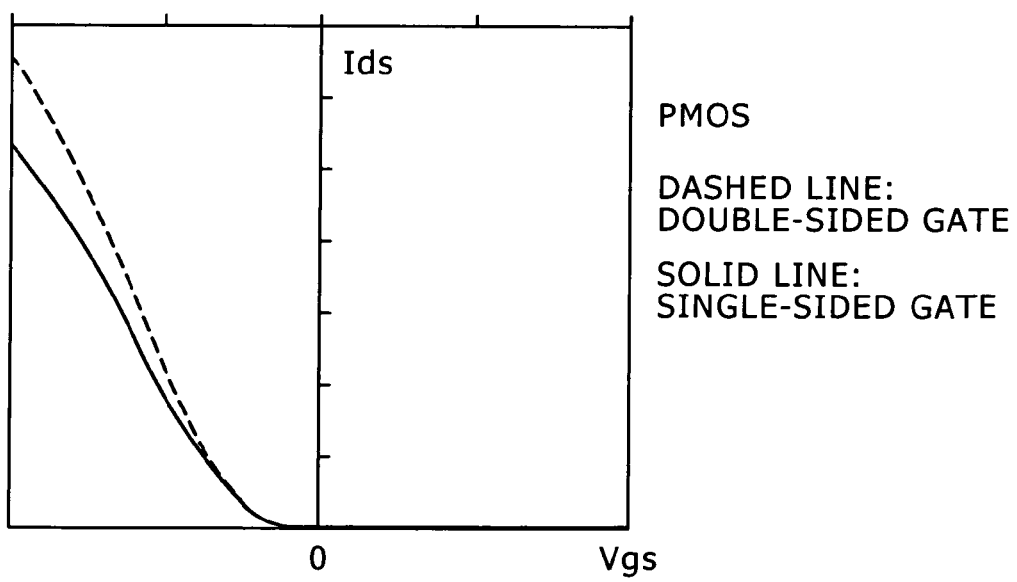

FIG. 55A shows the current characteristic of an NMOS thin film transistor, and FIG. 55B shows the current characteristic of a PMOS thin film transistor. In either case, the double-sided gate structure provides sharper change in the current amount.

(b) PMOS Type

Figure 56:
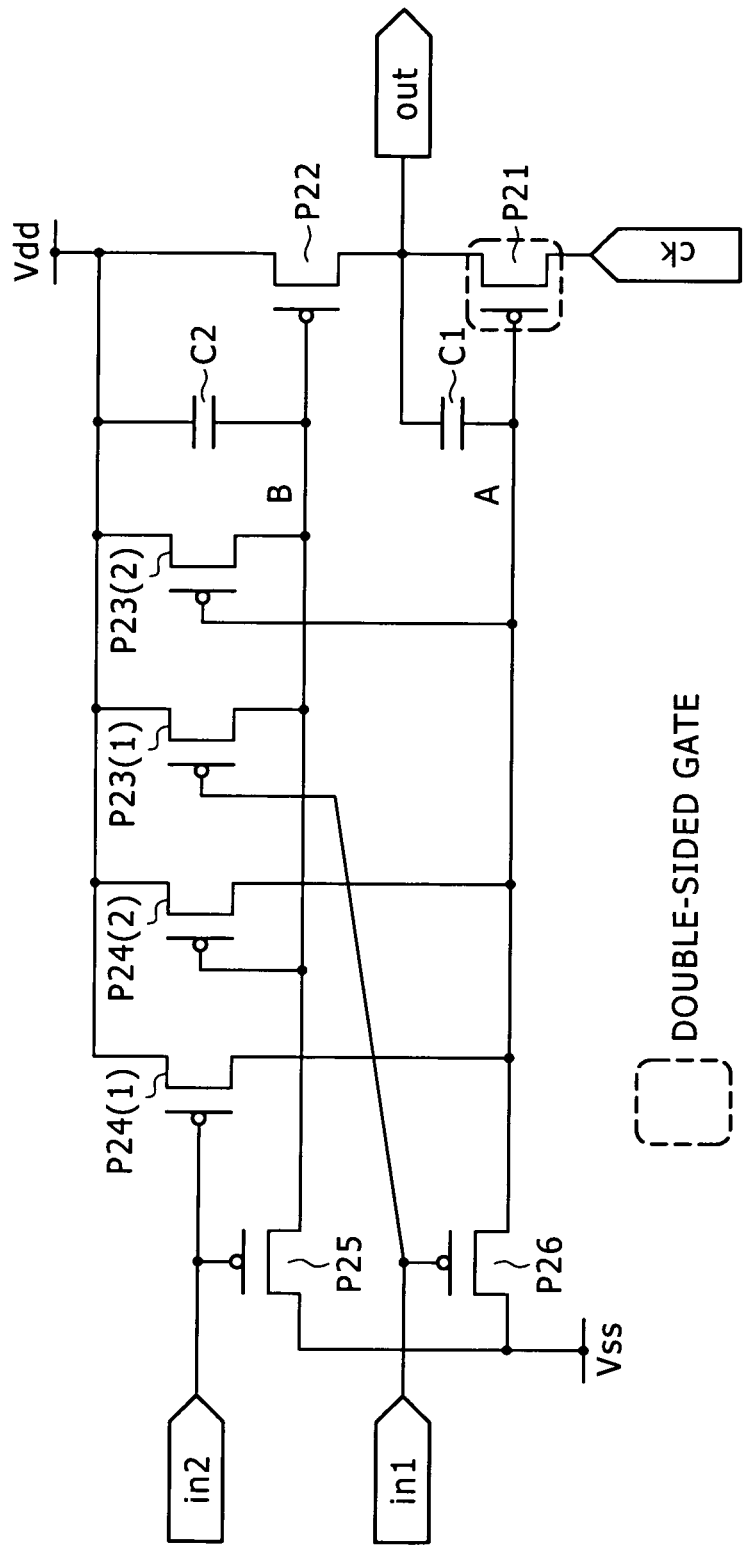
FIG. 56 is a diagram showing a form example of a shift stage (PMOS type)

The above-described technique to increase the bootstrap gain can be applied also to a PMOS-type shift stage in the same manner. Therefore, the circuit configuration shown in FIG. 56 can be employed for the PMOS-type shift stage according to this form example. Although the description of the drive waveforms of this PMOS-type shift stage is omitted, employing the shift stage according to this form example makes it possible to simultaneously achieve lower power consumption and higher-frequency driving as with the NMOS-type shift stage.

(B-7) Seventh Form Example of Shift Stage

The shift stages according to the above-described first to sixth form examples are premised on the connection form shown in FIG. 21. Specifically, in these form examples, the transfer pulse that appears at the output node OUT of each shift stage is coupled not merely to the control line corresponding to this shift stage but also to the second input terminal in2 of the previous shift stage and the first input terminal in1 of the subsequent shift stage.

In the following, a shift register circuit having an interconnect structure smaller than that of FIG. 21 will be described below. In this form example, a third clock signal ck3 is added instead of the end pulse 'end' and is used for driving of the clock input terminal CK and the second input terminal in2. In addition, in linkage with this, the connection between the output node of the shift stage and the second input terminal of the previous shift stage is eliminated.

Figure 57:
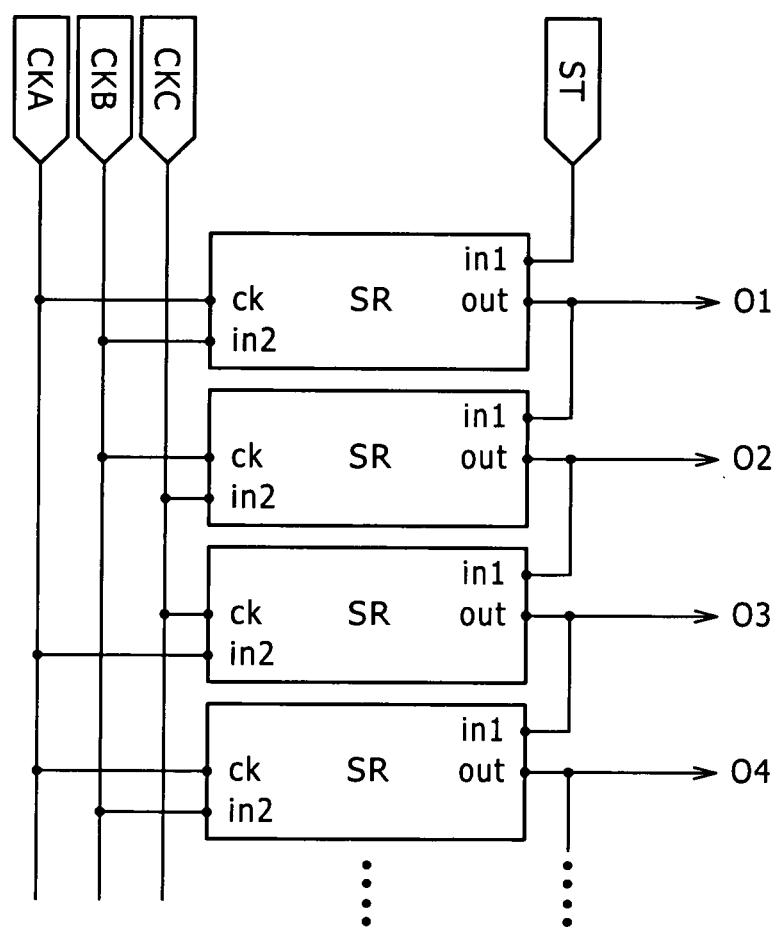
FIG. 57 is a diagram showing one example of the connection form of a shift register circuit according to a form example.

FIG. 57 shows the interconnect structure of the shift register circuit proposed in this form example. As shown in FIG. 57, the output node OUT of the shift stage is connected merely to the control line corresponding to this shift stage and the first input terminal in1 of the subsequent shift stage. On the other hand, of three clock signals CKA, CKB, and CKC whose phases are shifted from each other by a 1H period, two clock signals whose phases are adjacent to each other are coupled to the clock input terminal CK and the second input terminal in2 of each shift stage, with the cyclically-shifted phase relationship.

In the structure of FIG. 57, the first clock signal CKA is input to the clock input terminal CK of the first shift stage, and the second clock signal CKB is input to the second input terminal in2 of the first shift stage. The second clock signal CKB is input to the clock input terminal CK of the second shift stage, and the third clock signal CKC is input to the second input terminal in2 of the second shift stage. The third clock signal CKC is input to the clock input terminal CK of the third shift stage, and the first clock signal CKA is input to the second input terminal in2 of the third shift stage. This connection structure is repeated also for the subsequent shift stages. That is, the phases of the clock signals input to the clock input terminal CK and the second input terminal in2 are cyclically shifted on a stage-by-stage basis.

(a) NMOS Type

Figure 58:
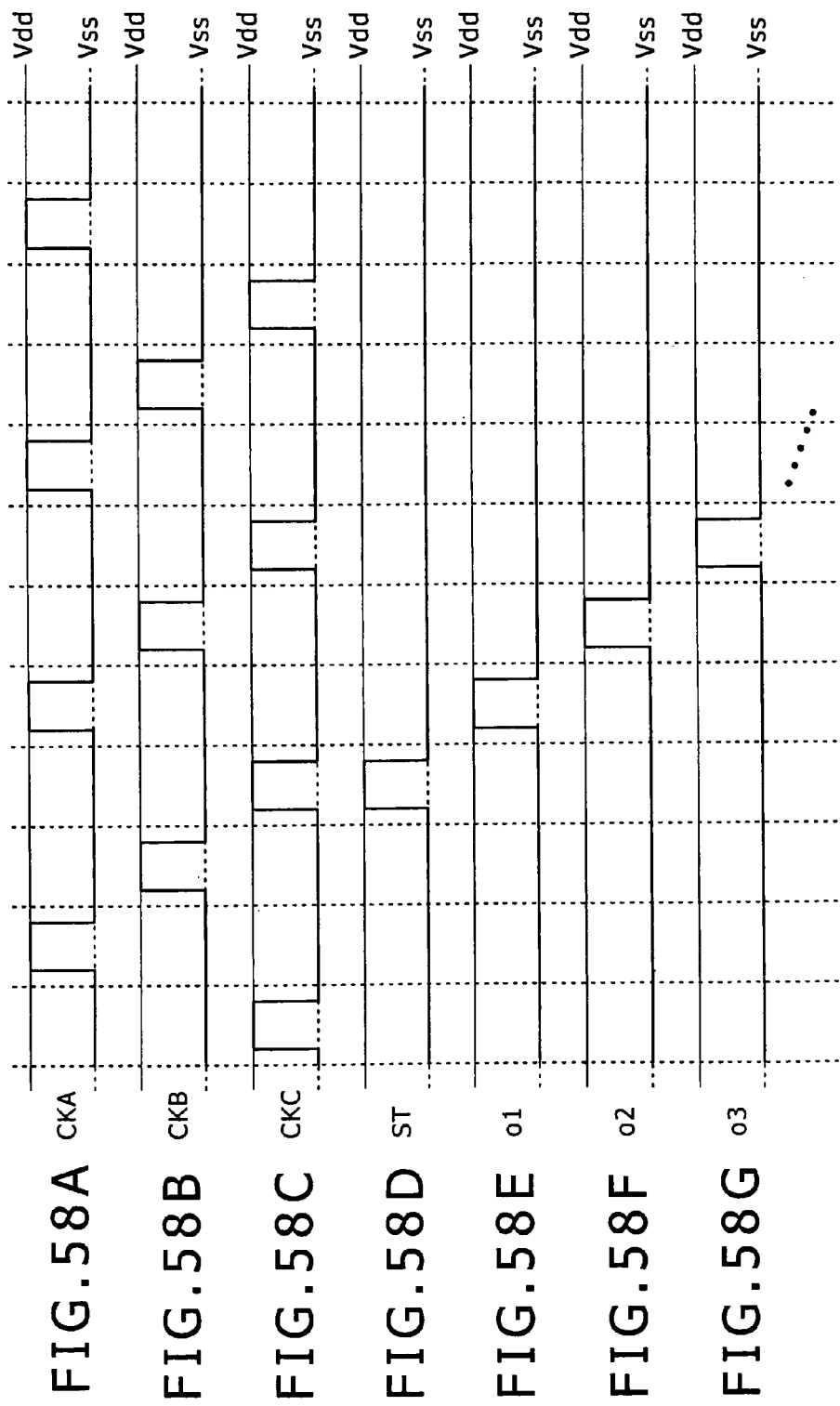
FIG. 58 is a diagram showing drive waveforms of the shift register circuit shown in FIG. 57 (NMOS type)

FIG. 58 shows an example of drive pulse waveforms of the shift register circuit formed with merely NMOS thin film transistors.

FIG. 58A shows the first clock signal CKA. FIG. 58B shows the second clock signal CKB. FIG. 58C shows the third clock signal CKC.

FIG. 58D shows the start pulse st for driving the first shift stage. FIG. 58E shows an output pulse o1 of the first shift stage SR(1). FIG. 58F shows an output pulse o2 of the second shift stage SR(2). FIG. 58G shows an output pulse o3 of the third shift stage SR(3).

As shown in FIG. 58, from the (3m+1)-th shift stage (m is 0, 1, 2, . . . ), the output pulse is output at the timing of the first clock signal CKA. From the (3m+2)-th shift stage (m is 0, 1, 2, . . . ), the output pulse is output at the timing of the second clock signal CKB. From the (3m+3)-th shift stage (m is 0, 1, 2, . . . ), the output pulse is output at the timing of the third clock signal CKC.

It is obvious that the input of the output pulse from the previous shift stage to the first input terminal in1 is necessary for the output of the output pulse. Therefore, the output pulse is transferred in such a manner as to be shifted on a stage-by-stage basis sequentially from the first shift stage.

FIG. 59 shows the drive waveforms corresponding to each shift stage. The drive waveforms of FIGS. 59A to 59F correspond to those of FIGS. 34A to 34F, respectively.

The largest difference in the drive waveforms between FIGS. 59 and 34 is that the clock pulse is periodically input (specifically, with a 3H-cycle) to the second input terminal in2 as shown in FIG. 59B.

This clock pulse input means that the H-level potential (higher potential Vdd) can be periodically supplied to the node B. Therefore, in the shift register circuit according to this form example, an advantage that the floating-state period of the node B can be shortened can be expected.

The shortening of the floating-state period of the node B means that the potentials of the nodes A and B in the period other than the output timing of the output pulse can be so kept as to have the normal potential relationship. Thus, this is effective for enhancement in the reliability of the drive operation, such as prevention of the output of the output pulse at an erroneous timing.

(b) PMOS Type

Also for a PMOS-type shift register circuit, the same connection form as that of the NMOS-type shift register circuit can be employed. The potential relationship of the drive waveforms is opposite to that of the NMOS-type shift register circuit, similarly to the other form examples.

Figure 60:
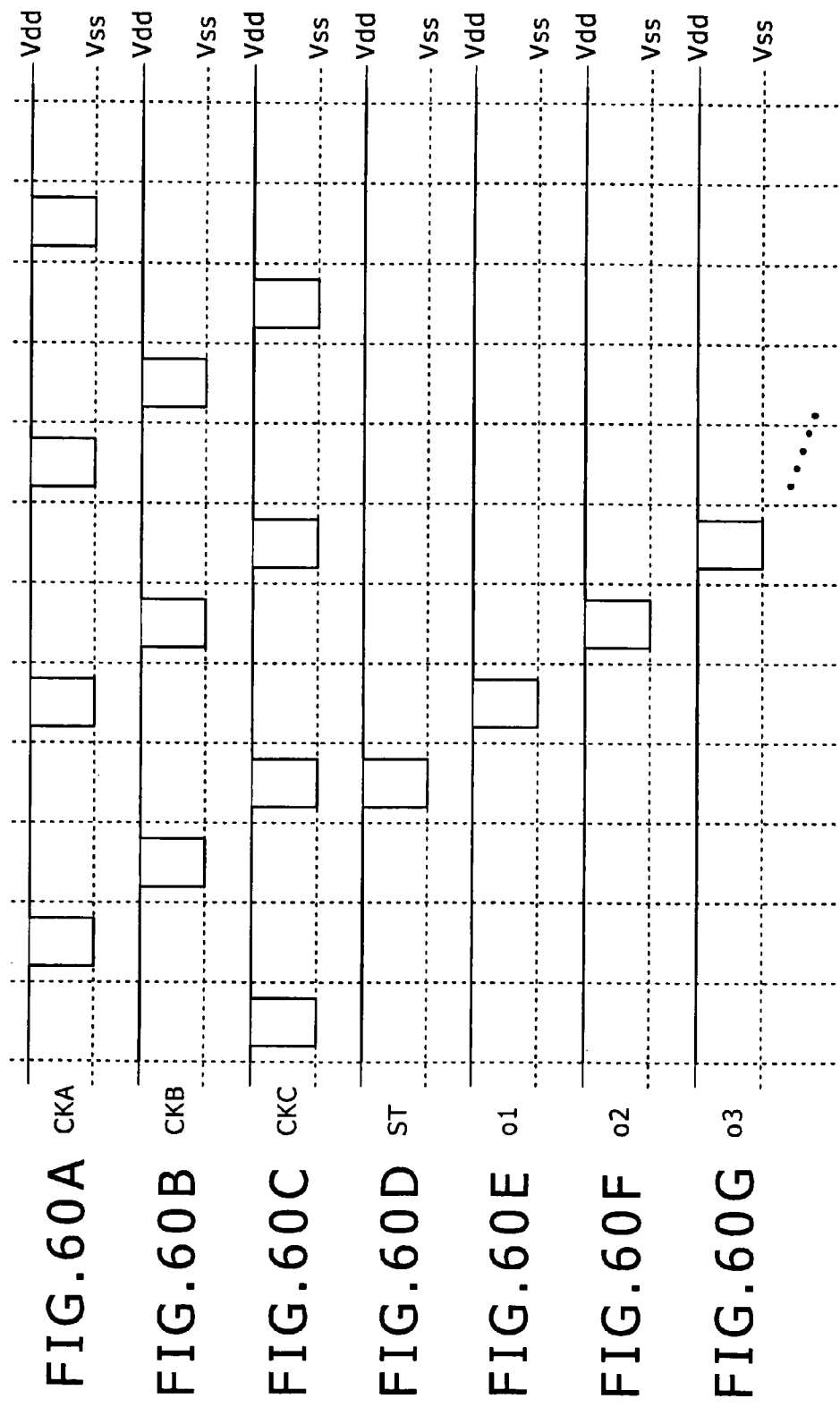
FIG. 60 is a diagram showing drive waveforms of the shift register circuit shown in FIG. 57 (PMOS type)

FIG. 60 shows an example of drive pulse waveforms of a shift register circuit formed with merely PMOS thin film transistors.

FIG. 60A shows the first clock signal CKA. FIG. 60B shows the second clock signal CKB. FIG. 60C shows the third clock signal CKC.

FIG. 60D shows the start pulse st for driving the first shift stage.

FIG. 60E shows an output pulse o1 of the first shift stage SR(1). FIG. 60F shows an output pulse o2 of the second shift stage SR(2). FIG. 60G shows an output pulse o3 of the third shift stage SR(3).

Also in this case, as shown in FIG. 60, from the (3m+1)-th shift stage (m is 0, 1, 2, . . . ), the output pulse is output at the timing of the first clock signal CKA. From the (3m+2)-th shift stage (m is 0, 1, 2, . . . ), the output pulse is output at the timing of the second clock signal CKB. From the (3m+3)-th shift stage (m is 0, 1, 2, . . . ), the output pulse is output at the timing of the third clock signal CKC.

It is obvious that the input of the output pulse from the previous shift stage to the first input terminal in1 is necessary for the output of the output pulse. Therefore, the output pulse is transferred in such a manner as to be shifted on a stage-by-stage basis sequentially from the first shift stage.

Figure 61:
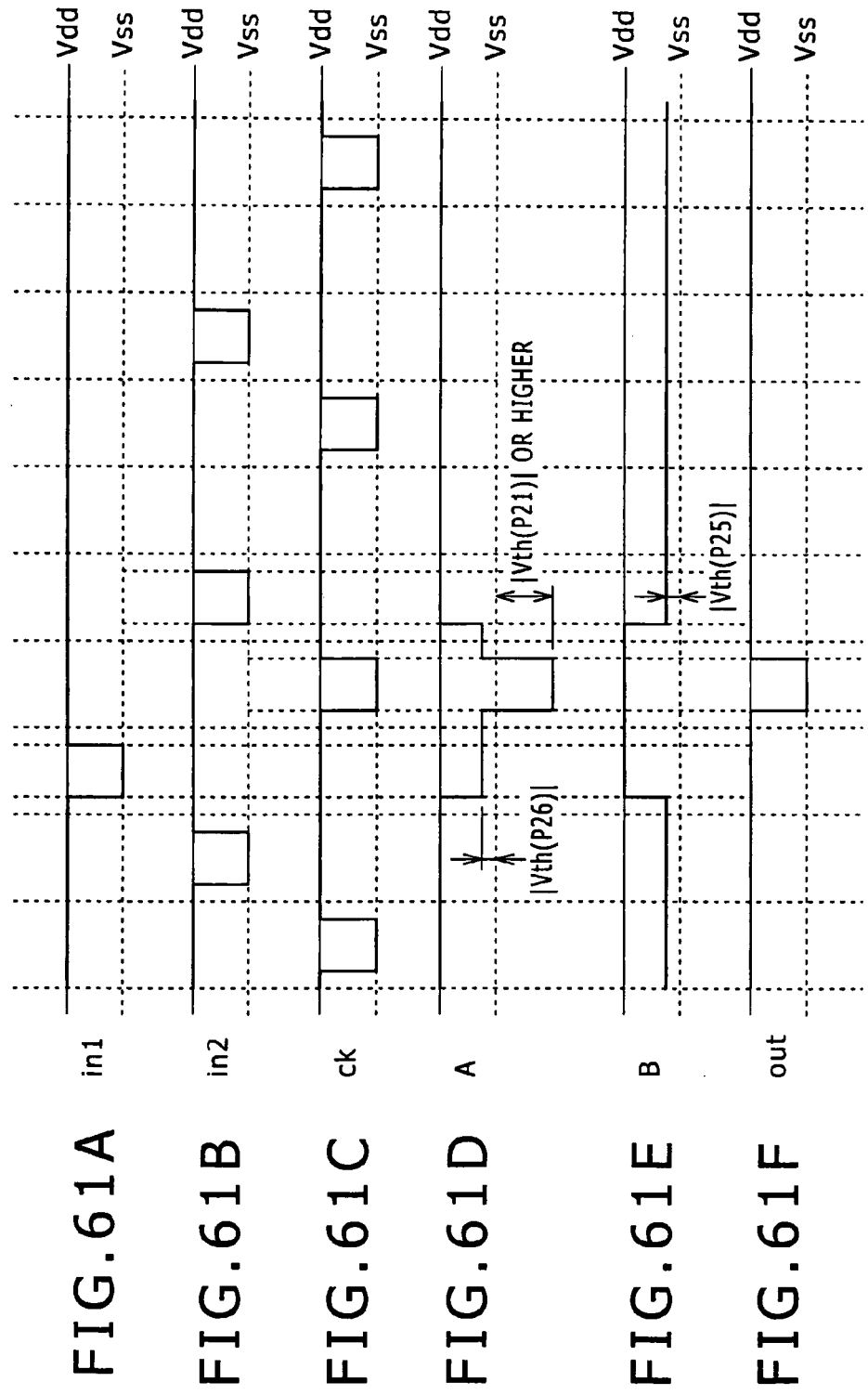
FIG. 61 is a diagram showing drive waveforms of a shift stage when the connection form shown in FIG. 57 is employed (PMOS type)

FIG. 61 shows the drive waveforms corresponding to each shift stage. The drive waveforms of FIGS. 61A to 61F correspond to those of FIGS. 28A to 28F, respectively.

The largest difference in the drive waveforms between FIGS. 61 and 28 is that the clock pulse is periodically input (specifically, with a 3H-cycle) to the second input terminal in2 as shown in FIG. 61B.

This clock pulse input means that the L-level potential (lower potential VSS) can be periodically supplied to the node B. Therefore, in the shift register circuit according to this form example, an advantage that the floating-state period of the node B can be shortened can be expected.

The shortening of the floating-state period of the node B means that the potentials of the nodes A and B in the period other than the output timing of the output pulse can be so kept as to have the normal potential relationship. Thus, this is effective for enhancement in the reliability of the drive operation, such as prevention of the output of the output pulse at an erroneous timing.

(B-8) Eighth Form Example of Shift Stage

Figure 62:
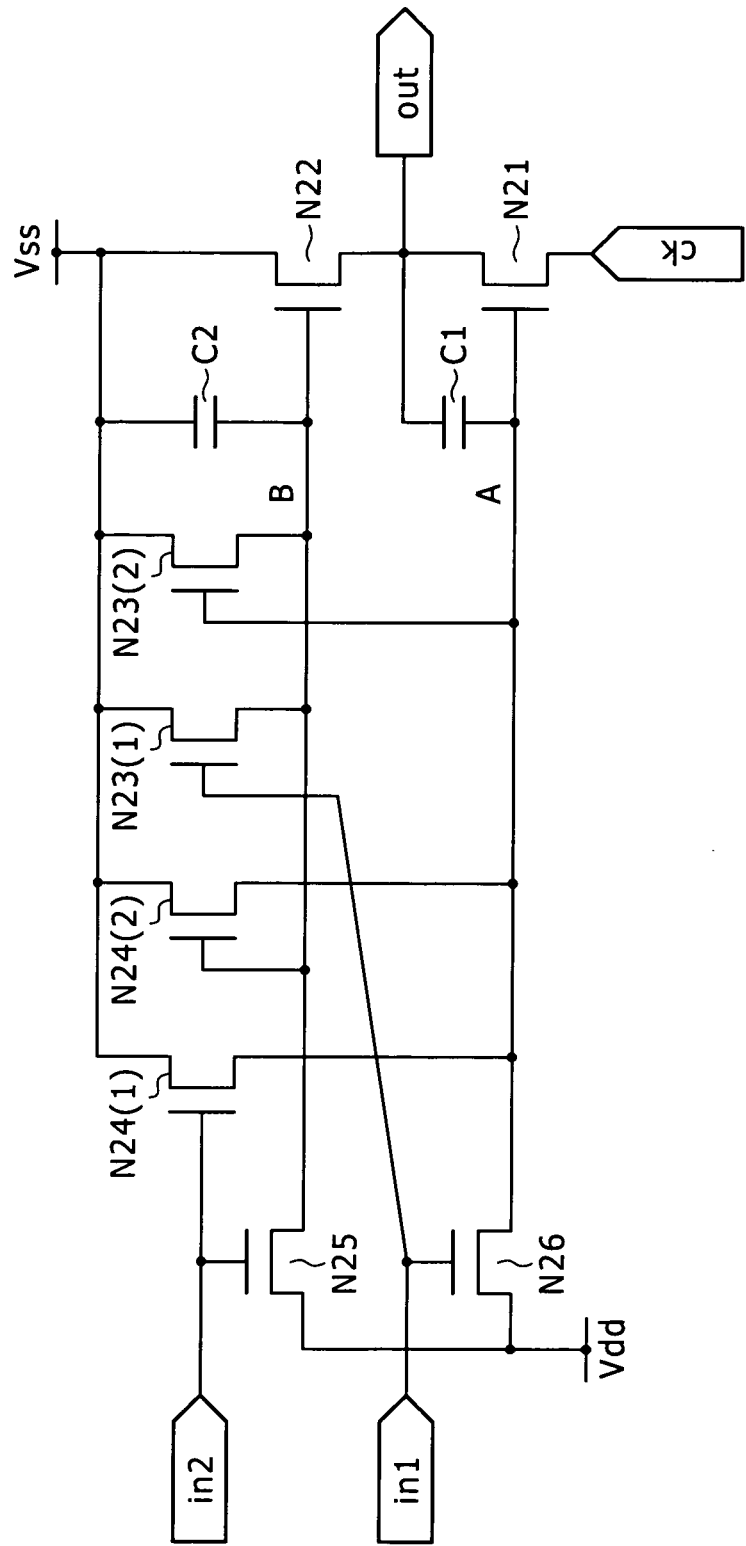
FIG. 62 is a diagram showing a circuit example of the shift stage according to the form example (NMOS type)

In each of the shift stages according to the above-described first to seventh form examples, as shown in FIG. 62, the first input terminal in1 is connected to the gate electrode of the thin film transistor N26, and the second input terminal in2 is connected to the gate electrode of the thin film transistor N25.

Figure 63:
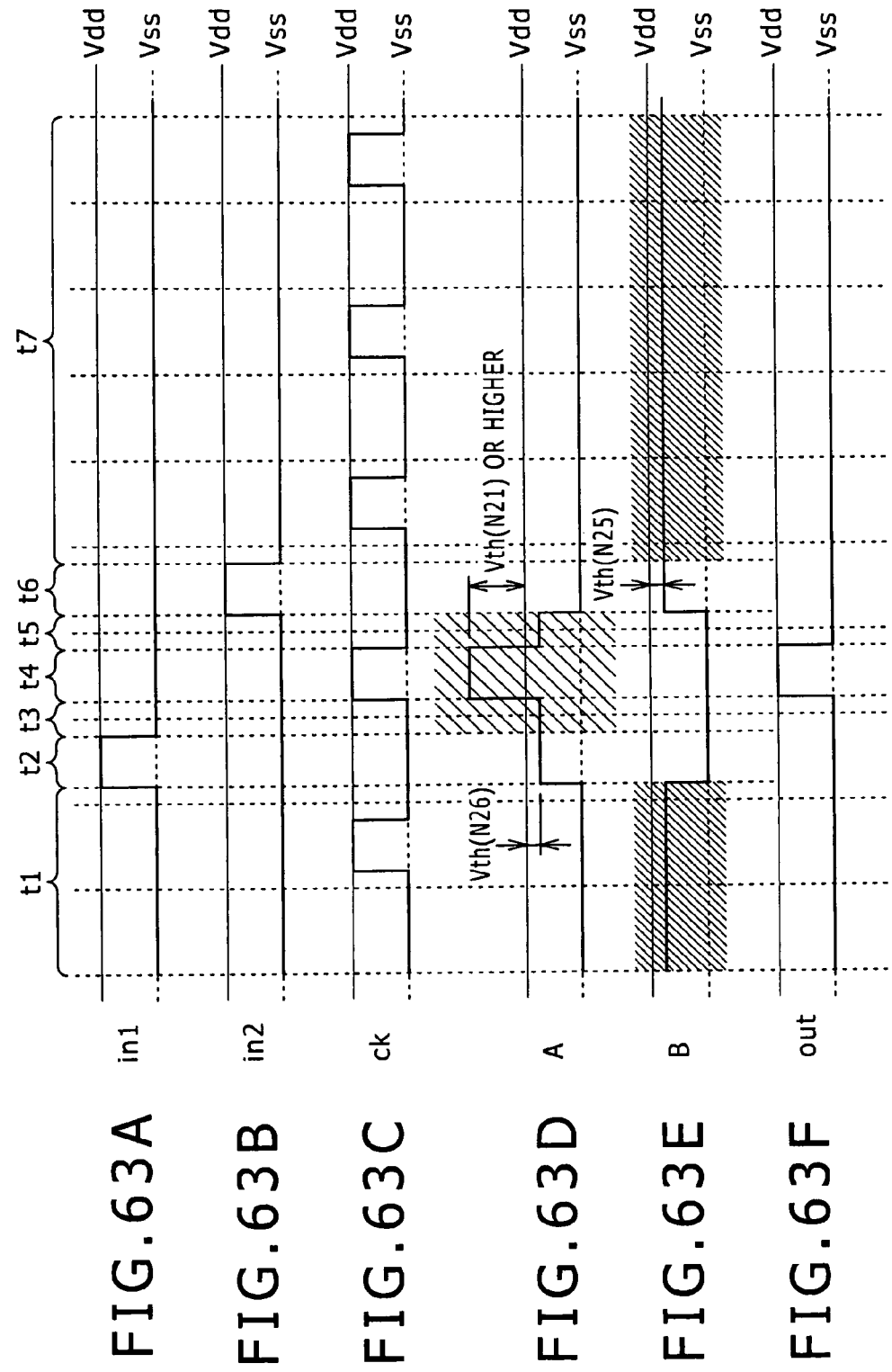
FIG. 63 is a diagram showing drive waveforms of the shift stage shown in FIG. 62.

Due to this connection structure, as shown in FIG. 63, the potentials of the node A and the node B are lower than the higher potential Vdd by the threshold voltages Vth(N25) and Vth(N26) of the thin film transistors N25 and N26.

The cause of this state is that the thin film transistors N25 and N26 become the diode-connected state when the higher potential Vdd is applied to the first and second input terminals in1 and in2.

Figure 64:
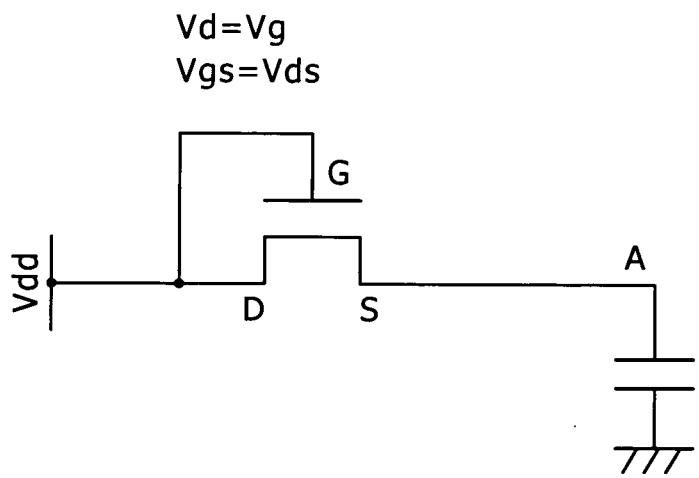
Figure 65:
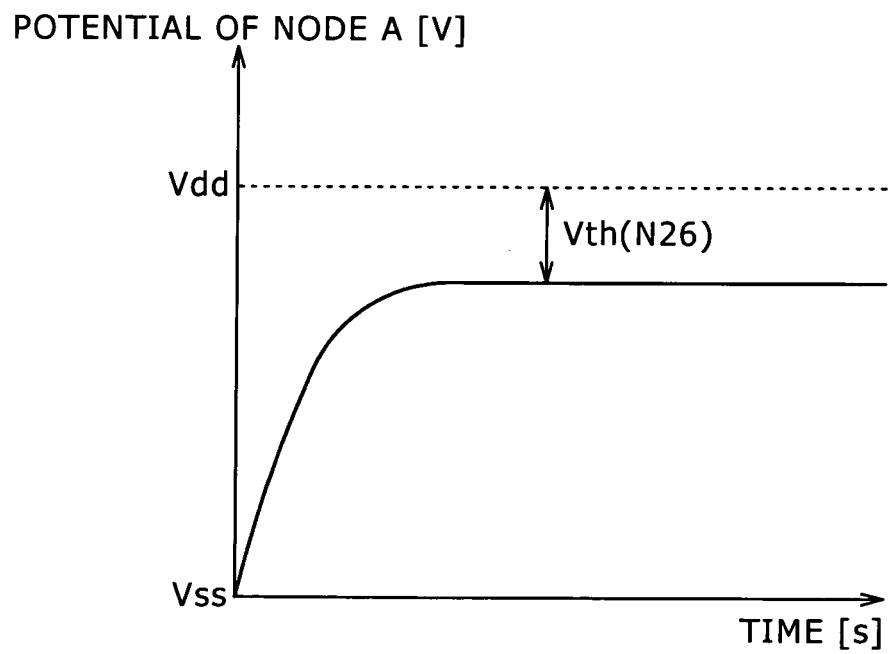
FIG. 65 is a diagram for explaining change in a node potential in driving with the equivalent circuit shown in FIG. 64.

FIG. 64 shows the equivalent circuit of the thin film transistor N26 when the higher potential Vdd is applied. Via this diode-connected thin film transistor N26, the node A is charged from the lower potential VSS toward the higher potential Vdd. However, as shown in FIG. 65, the charging of the node A progresses merely to such a degree that the relationship Vgs=Vds=Vth is obtained.

The reason for this is that the diode-connected thin film transistor N26 operates in the saturation region.

In the diode connection of FIG. 64, the source region of the thin film transistor N26 is connected to the node A. Therefore, the source potential Vs also rises up along with the charging of the node A. Specifically, the charging of the node A (the increase in the source potential Vs) acts to decrease the drain-source voltage Vds (i.e. Vgs).

Figure 66:
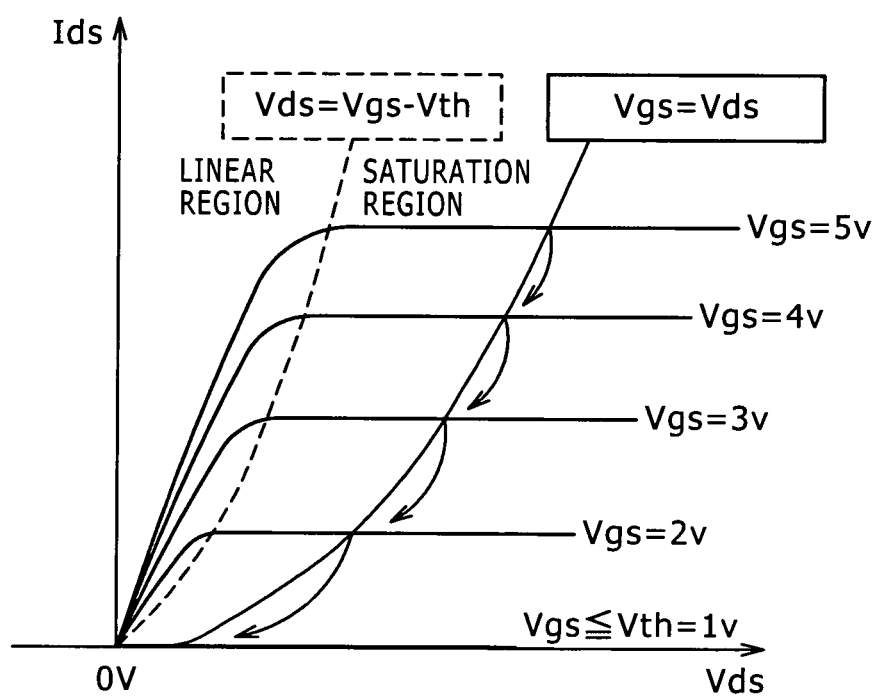
FIG. 66 is a diagram for explaining an operation principle.

The decrease in the drain-source voltage Vds acts to decrease the drain current Ids as shown in FIG. 66. Specifically, as the potential of the node A increases, the on-resistance of the thin film transistor N26 also increases. In due course, the thin film transistor N26 is turned off at the timing when the relationship Vgs=Vds=Vth(N26) is obtained. This is the reason why the node A may not be charged to the higher potential Vdd.

The operation of the thin film transistors N25 and N26 as the diode-connected elements is carried out at the timing of the switching between periods t1 and t2 in FIG. 63 (i.e. the timing of the switching of the potential of the node A) and at the timing of the switching between periods t5 and t6 (i.e. the timing of the switching of the potential of the node B).

The speed of the rising of the node potential at these timings depends on the on-resistance of the thin film transistors N25 and N26 and the parasitic capacitance of the node.

As described above, the on-resistance of the thin film transistors N25 and N26 increases along with potential increase of the nodes A and B. Therefore, the speed of the rising of the node potential becomes lower.

The switching between the periods t1 and t2 in FIG. 63 (i.e. the switching of the potential of the node A) is preparatory operation for bootstrap operation. Therefore, it is desired to decrease the on-resistance of the thin film transistor N21 as much as possible. Thus, it is the best to surely cut off the thin film transistor N26.

On the other hand, the switching between the periods t5 and t6 in FIG. 63 (i.e. the switching of the potential of the node B) is to end the shift operation, and the potential of the node A needs to have fallen down by the time the clock signal rises up to the H level next time. If the potential of the node A has not fallen down, erroneous transfer occurs.

That is, the transient of this potential switching (rising speed) defines the drive frequency. Enhancing the speed of this potential switching allows driving at a higher frequency.

The function of the thin film transistors N23(2) and N24(2) for fixing the potentials of the nodes A and B at the lower potential VSS is mostly suppressed by the thin film transistors N23(1) and N24(1).

(a) NMOS Type

Figure 67:
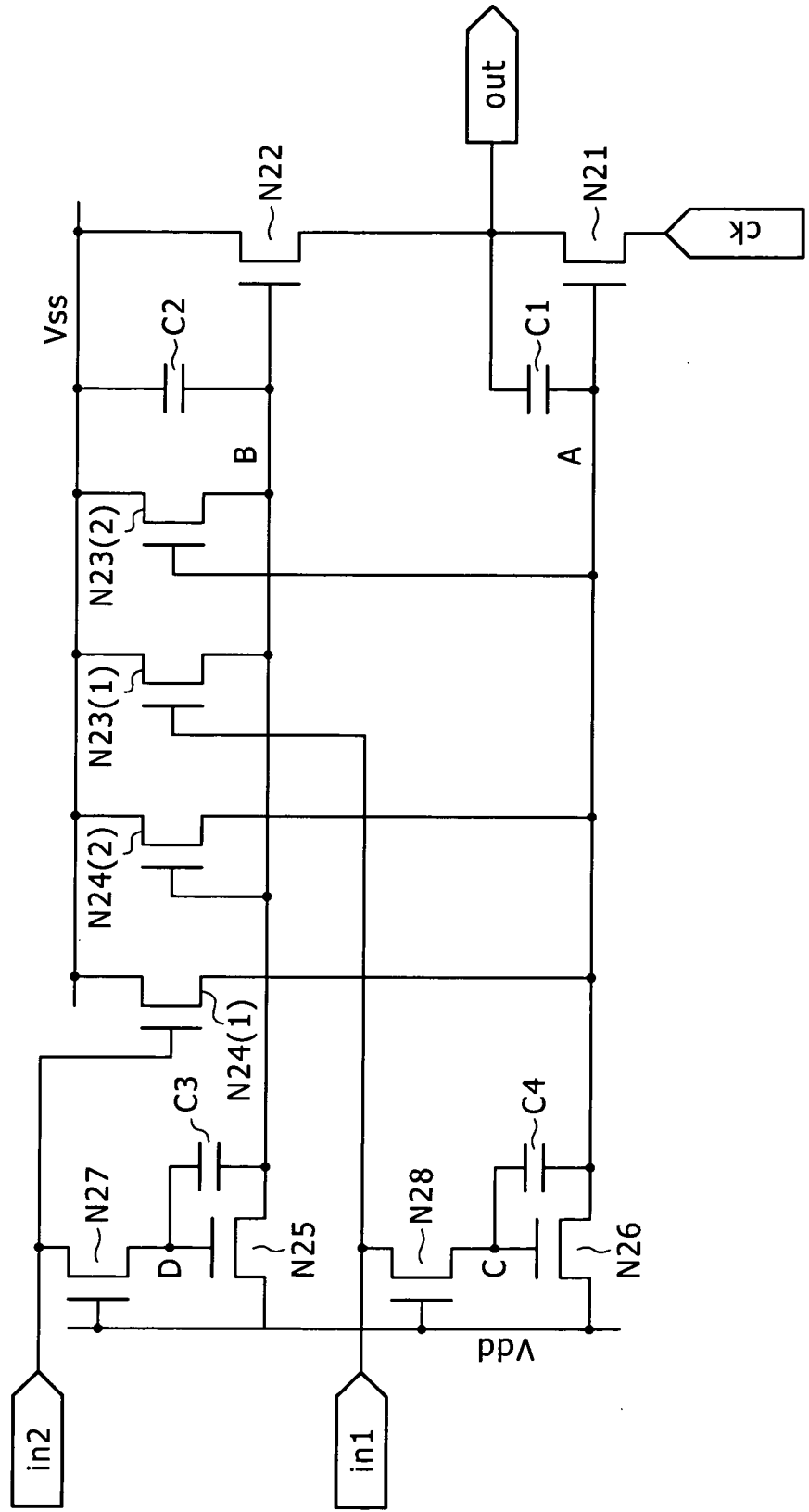
FIG. 67 is a diagram showing a circuit example of a shift stage according to a form example (NMOS type)

FIG. 67 shows an eighth form example of a shift stage suitable for high-frequency driving. FIG. 68 shows the corresponding drive waveforms.

The same parts in FIG. 67 as those in the shift stages according to the above-described respective form examples are given the same symbols.

As the configuration specific to this form example, thin film transistors N27 and N28 and complementary capacitors C3 and C4 are added so that the gate potentials of the thin film transistors N25 and N26 may be raised by bootstrap operation. That is, this form example is defined in that the thin film transistors N25 and N26 can be utilized in the linear region.

Specifically, the gate electrode of the thin film transistor N25 is connected to the second input terminal in2 via the thin film transistor N27. Furthermore, the complementary capacitor C3 for complementing bootstrap operation is connected between the gate electrode of the thin film transistor N25 and the main electrode thereof closer to the node B.

Naturally, the complementary capacitor C3 is unnecessary if the gate capacitor of the thin film transistor N25 has sufficiently-high capacitance for the bootstrap operation.

The gate electrode of the newly-added thin film transistor N27 is connected to the second power supply (Vdd). Due to this connection, the thin film transistor N27 is typically kept at the on-state. Therefore, the power is typically supplied to the gate electrode of the thin film transistor N25 (i.e. to a node D).

Similarly, in this form example, the gate electrode of the thin film transistor N26 is connected to the first input terminal in1 via the thin film transistor N28. Furthermore, the complementary capacitor C4 for complementing bootstrap operation is connected between the gate electrode of the thin film transistor N26 and the main electrode thereof closer to the node A.

Naturally, the complementary capacitor C4 is unnecessary if the gate capacitor of the thin film transistor N26 has sufficiently-high capacitance for the bootstrap operation.

The gate electrode of the newly-added thin film transistor N28 is also connected to the second power supply (Vdd). Due to this connection, the thin film transistor N28 is typically kept at the on-state. Therefore, the power is typically supplied to the gate electrode of the thin film transistor N26 (i.e. to a node C).

FIG. 68 shows the drive waveforms of the shift stage according to this form example. FIG. 68A shows the input waveform of the first input terminal in1. FIG. 68B shows the input waveform of the second input terminal in2. FIG. 68C shows the input waveform of the clock signal ck. FIG. 68D shows the drive waveform of the node C. FIG. 68E shows the drive waveform of the node D. FIG. 68F shows the drive waveform of the node A. FIG. 68G shows the drive waveform of the node B. FIG. 68H shows the signal waveform of the output pulse that appears at the output node OUT.

The basic drive timings and the operation of potential switching at the nodes A and B in this form example are the same as those in the other form examples. Specifically, as in the other form examples, the potential of the node A rises up to the H level at the timing when the H-level potential (Vdd) is input to the first input terminal in1, and the potential of the node A falls down to the L level at the timing when the H-level potential (Vdd) is input to the second input terminal in2.

In the following, the operation of the thin film transistors N25 and 26, which is specific to this form example, will be mainly described below.

As described above, the addition of the thin film transistors N27 and N28 allows the gate potentials of the thin film transistors N25 and N26 to be raised by bootstrap operation.

This makes it possible to utilize the thin film transistors N25 and N26 in the linear region. In this case, the thin film transistors N25 and N26 can be equivalently regarded as a resistive element as shown in FIGS. 69A and 69B. The resistance of this resistive element depends on the H-level potential of the nodes C and D obtained due to the bootstrap operation.

Figure 70:
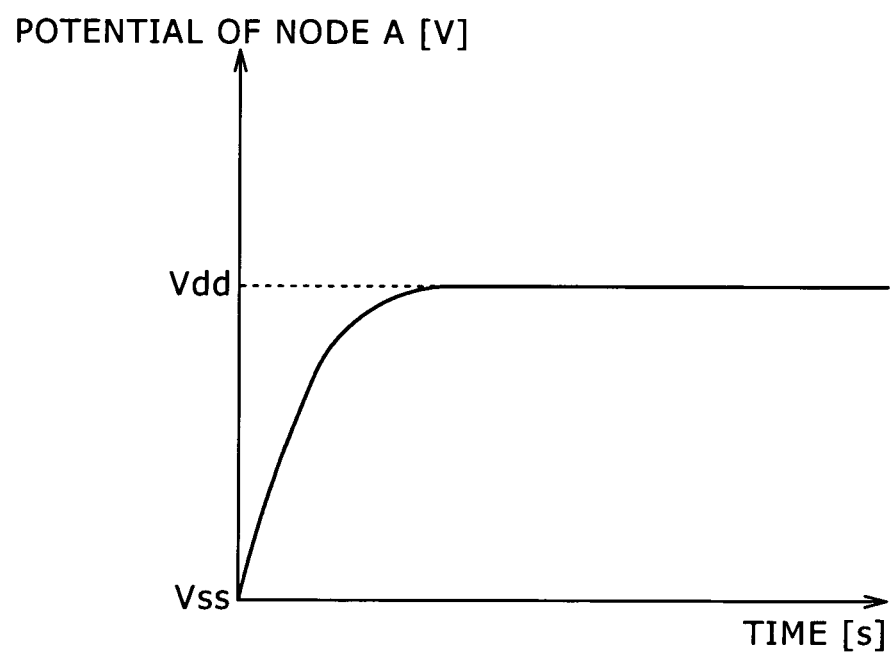
FIG. 70 is a diagram for explaining change in a node potential in driving with the equivalent circuit shown in FIG. 69.

Therefore, by setting the H-level potential of the node C (FIG. 68D) equal to or higher than the potential obtained by adding the threshold voltage Vth(N26) of the thin film transistor N26 to Vdd, the H-level potential of the node A can be raised to Vdd as shown in FIG. 70.

Similarly, by setting the H-level potential of the node D (FIG. 68E) equal to or higher than the potential obtained by adding the threshold voltage Vth(N25) of the thin film transistor N25 to Vdd, the H-level potential of the node B can be raised to Vdd as shown in FIG. 70.

The equivalent resistance of the thin film transistors N25 and N26 depends on the relationship between the H-level potential of the nodes C and D and the higher potential Vdd. Thus, the thin film transistors N25 and N26 are not turned off even when the potential of the nodes A and B is increased.

As above, in the shift stage according to this form example, the nodes A and B can be charged to the higher potential Vdd rapidly due to the bootstrap operation of the nodes C and D. Therefore, this form example is advantageous in high-frequency operation.

Furthermore, the potential of the node A (FIG. 68F) in the periods t2 and t3 in FIG. 68 is set to Vdd (maximum potential). That is, the potential of the node A before the bootstrap operation thereof can be set higher than that in the above-described other form examples.

Thus, the bootstrap amount desired for the thin film transistor N21 can be lowered. As a result, size reduction or elimination of the complementary capacitor C1 can be achieved. This allows the layout area to be decreased compared with the shift stages according to the other form examples.

Moreover, in this form example, the H-level potential held by the node B (FIG. 68G) can also be raised to Vdd. Thus, the margin of the leakage time can be widened.

The above-described features allow the shift stage according to this form example to offer a shift stage and a shift register circuit that are excellent in high-speed operation and operation stability and have small layout area.

It is also possible to use the configuration of this shift stage in combination with the configuration of any of the shift stages according to the above-described respective form examples.

(b) PMOS Type

Also for a PMOS-type shift register circuit, the same connection form as that of the NMOS-type shift register circuit can be employed. The potential relationship of the drive waveforms is opposite to that of the NMOS-type shift register circuit, similarly to the other form examples.

Figure 71:
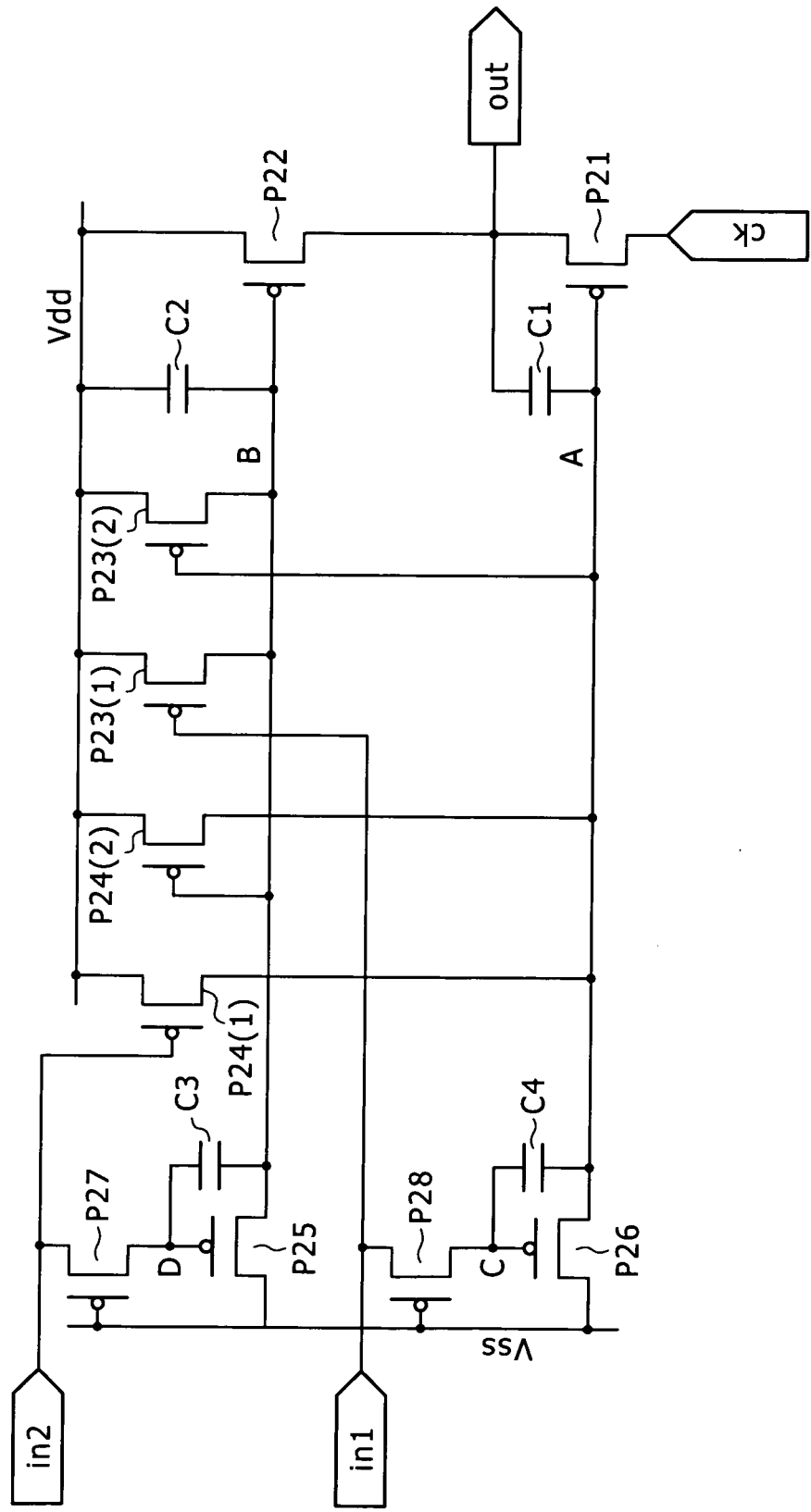
FIG. 71 is a diagram showing a circuit example of a shift stage according to a form example (PMOS type)
Figure 72:
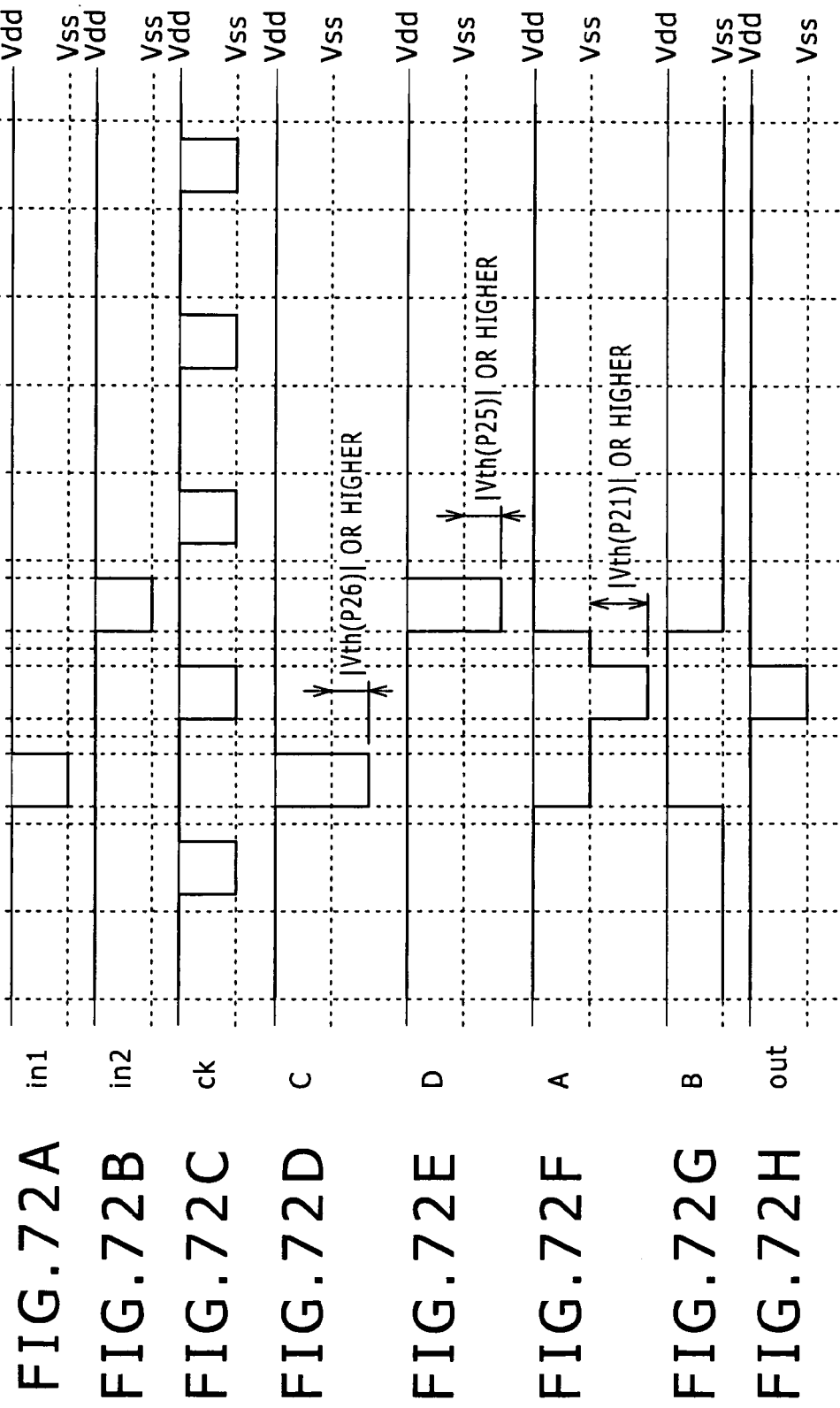
FIG. 72 is a diagram showing drive waveforms of the shift stage shown in FIG. 71.

FIG. 71 shows the eighth form example of a shift stage suitable for high-frequency driving. FIG. 72 shows the corresponding drive waveforms.

As shown in FIG. 71, in the PMOS-type shift stage, thin film transistors P27 and P28 and the complementary capacitors C3 and C4 are newly added so that the gate potentials of the thin film transistors P25 and P26 may be raised by bootstrap operation. This feature allows the thin film transistors P25 and P26 to operate in the linear region.

The details of the drive waveforms shown in FIG. 72 are as follows. FIG. 72A shows the input waveform of the first input terminal in1. FIG. 72B shows the input waveform of the second input terminal in2. FIG. 72C shows the input waveform of the clock signal ck. FIG. 72D shows the drive waveform of the node C. FIG. 72E shows the drive waveform of the node D. FIG. 72F shows the drive waveform of the node A. FIG. 72G shows the drive waveform of the node B. FIG. 72H shows the signal waveform of the output pulse that appears at the output node OUT.

As shown in FIG. 72, in the shift stage according to this form example, the nodes A and B can be discharged to the lower potential VSS rapidly due to the bootstrap operation of the nodes C and D. Therefore, this form example is advantageous in high-frequency operation.

Furthermore, the potential of the node A (FIG. 72F) in the periods t2 and t3 in FIG. 72 is set to VSS (minimum potential). That is, the potential of the node A before the bootstrap operation thereof can be set lower than that in the above-described other form examples.

Thus, the bootstrap amount desired for the thin film transistor P21 can be lowered. As a result, size reduction or elimination of the complementary capacitor C1 can be achieved. This allows the layout area to be decreased compared with the shift stages according to the other form examples.

Moreover, in this form example, the L-level potential held by the node B (FIG. 72G) can also be lowered to VSS. Thus, the margin of the leakage time can be widened.

The above-described features allow the shift stage according to this form example to offer a shift stage and a shift register circuit that are excellent in high-speed operation and operation stability and have small layout area.

It is also possible to use the configuration of this shift stage in combination with the configuration of any of the shift stages according to the above-described respective form examples.

(C) Other Form Examples (C-1) Other Display Panels

The above description of the form examples is premised on application to an organic EL panel. In particular, the above description is premised on application to a control line driver that transfers a control pulse in the vertical direction.

However, the above-described shift register circuit can be applied also to a signal line driver that gives the timings of application of the signal potential Vsig to the signal line DTL.

Furthermore, the drive circuit including the above-described shift register circuit can be applied also to display panels other than the organic EL panel.

For example, the above-described shift register circuit can be applied also to drive circuits in inorganic EL panels, LED panels, and other panels. In addition, it can be applied also to drive circuits in plasma display panels. In addition, it can be applied also to drive circuits in field emission displays. Moreover, it can be applied also to drive circuits in liquid crystal display panels. Furthermore, when the light source of the backlight of a liquid crystal display panel is LEDs, the shift register circuit described for the form examples can be used for the drive circuit of the LEDs. For example, in the case of varying the ratio of the lighting period in a one-field period, the shift register circuit is suitable if the lighting period in the one-field period is divided into plural lighting periods and the lengths and positions of the individual lighting periods are varied.

(C-2) Product Examples of Display Panels (a) Appearance Form

In this specification, the display panel encompasses not merely a panel module obtained by forming a pixel array part and drive circuits on an insulating substrate by using a semiconductor process but also one obtained by manufacturing drive circuits as circuits on a separate substrate (e.g. application-specific ICs) and mounting this substrate on an insulating substrate on which a pixel array part is formed.

Figure 73:
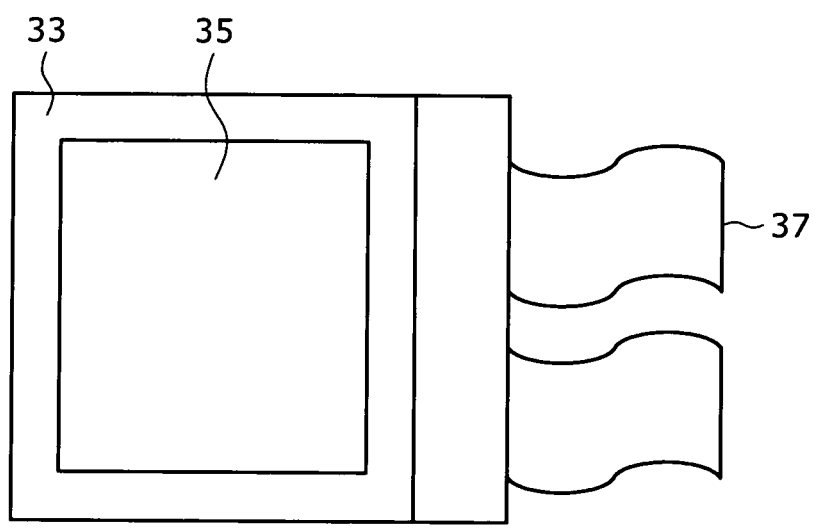
FIG. 73 is a diagram showing an appearance configuration example of a display panel.

FIG. 73 shows an appearance configuration example of a display panel. A display panel 31 has a structure obtained by bonding a counter substrate 35 to the formation area of a pixel array part of a support substrate 33.

The support substrate 33 is composed of glass, plastic, or another insulating base material (insulating substrate).

The counter substrate 35 is also composed of glass, plastic, or another insulating base material (insulating substrate).

The transmittance of the substrate differs depending on the kind of the display panel. For example, for a liquid crystal display panel, both the substrates need to have high transmittance. On the other hand, for a self-luminous display, it is sufficient that high transmittance is ensured for the substrate on the light beam output side.

In the display panel 31, a flexible printed circuit (FPC) 37 for input of external signals and drive power is disposed.

(b) Form of Mounting in Electronic Apparatus

Figure 74:
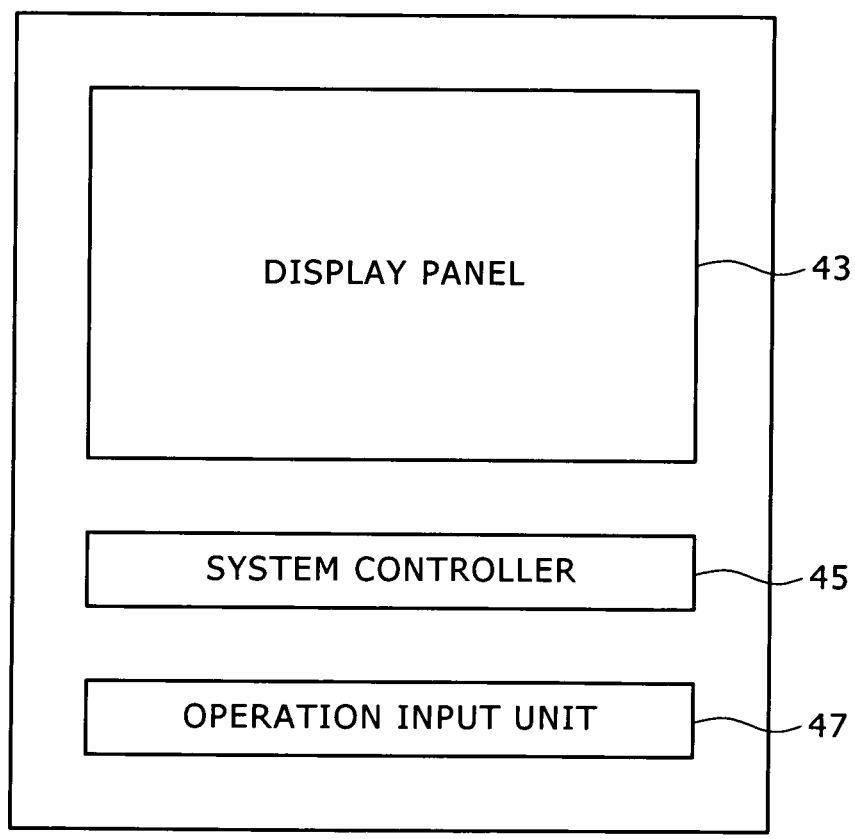
FIG. 74 is a diagram showing a functional configuration example of electronic apparatus.

The above-described display panel is also distributed in a form of being mounted in various kinds of electronic apparatus. FIG. 74 shows a conceptual configuration example of electronic apparatus 41. The electronic apparatus 41 includes a display panel 43 including the above-described drive circuit, a system controller 45, and an operation input unit 47. The processing executed by the system controller 45 differs depending on the commercial product form of the electronic apparatus 41. The operation input unit 47 is a device that accepts operation inputs to the system controller 45. As the operation input unit 47, e.g. a mechanical interface such as a switch and a button or a graphic interface is used.

Figure 75:
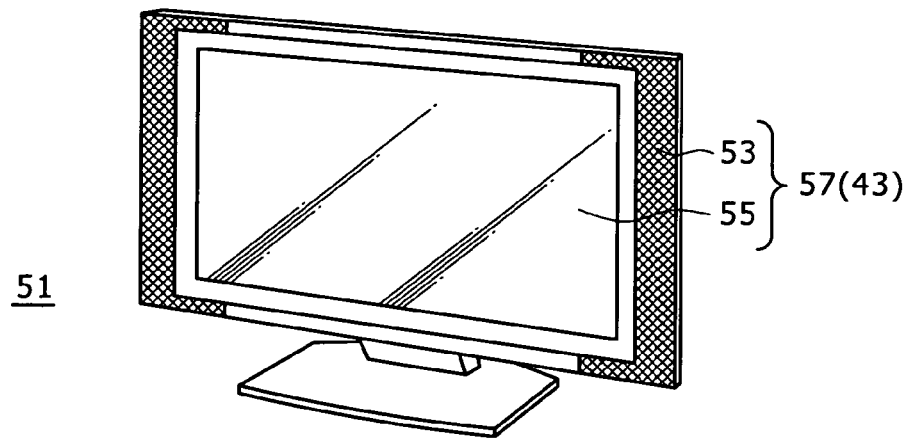
FIG. 75 is a diagram showing a commercial product example of the electronic apparatus.

FIG. 75 shows an appearance example of a television receiver as an example of the electronic apparatus. On the front face of the case of a television receiver 51, a display screen 57 composed of a front panel 53, a filter glass 55, and so on is disposed. The display screen 57 corresponds to the display panel 43 of FIG. 74.

Figure 76A:
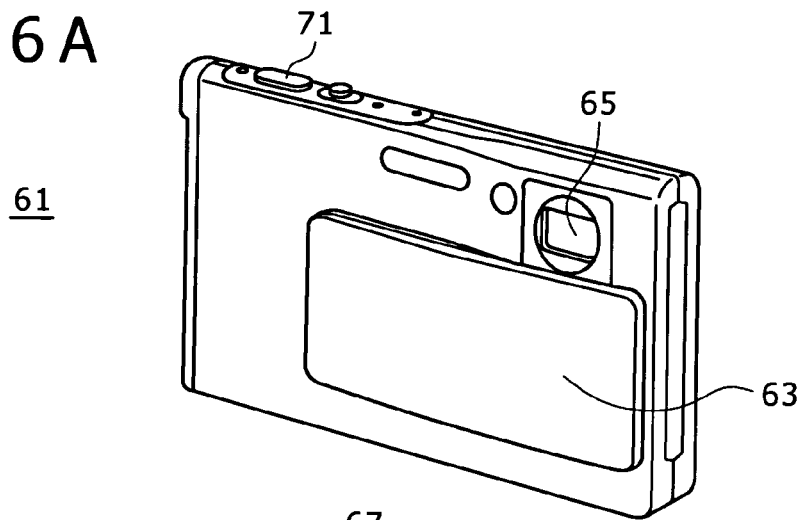
FIGS. 76A and 76B are diagrams showing a commercial product example of the electronic apparatus.
Figure 76B:
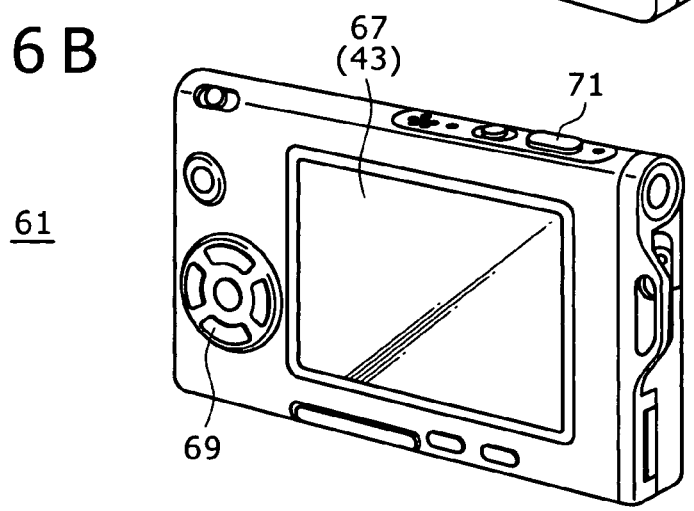

Furthermore, e.g. a digital camera is available as this kind of electronic apparatus. FIG. 76 shows an appearance example of a digital camera 61. FIG. 76A shows an appearance example of the front-face side (subject side), and FIG. 76B shows an appearance example of the back-face side (photographer side).

The digital camera 61 includes a protective cover 63, an imaging lens unit 65, a display screen 67, a control switch 69, and a shutter button 71. The display screen 67 corresponds to the display panel 43 of FIG. 74.

Figure 77:
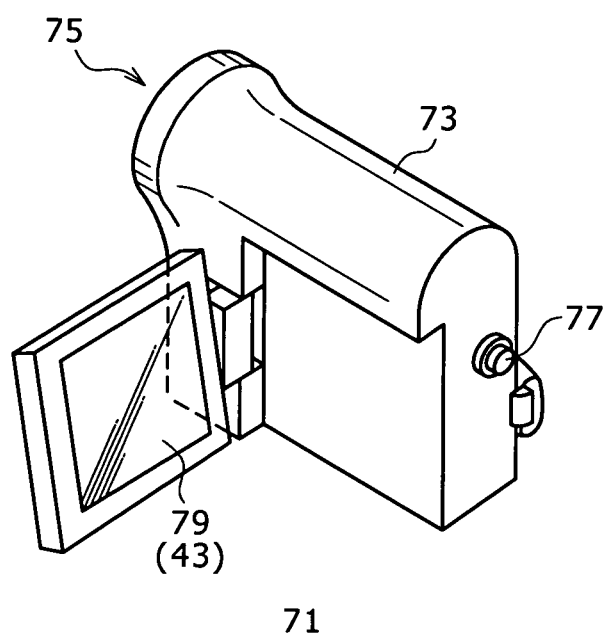
FIG. 77 is a diagram showing a commercial product example of the electronic apparatus.

Furthermore, e.g. a video camera is available as this kind of electronic apparatus. FIG. 77 shows an appearance example of a video camera 71.

The video camera 71 includes an imaging lens 75 that is disposed on the front side of a main body 73 and used to capture an image of a subject, a start/stop switch 77 for imaging, and a display screen 79. The display screen 79 corresponds to the display panel 43 of FIG. 74.

Figure 78A:
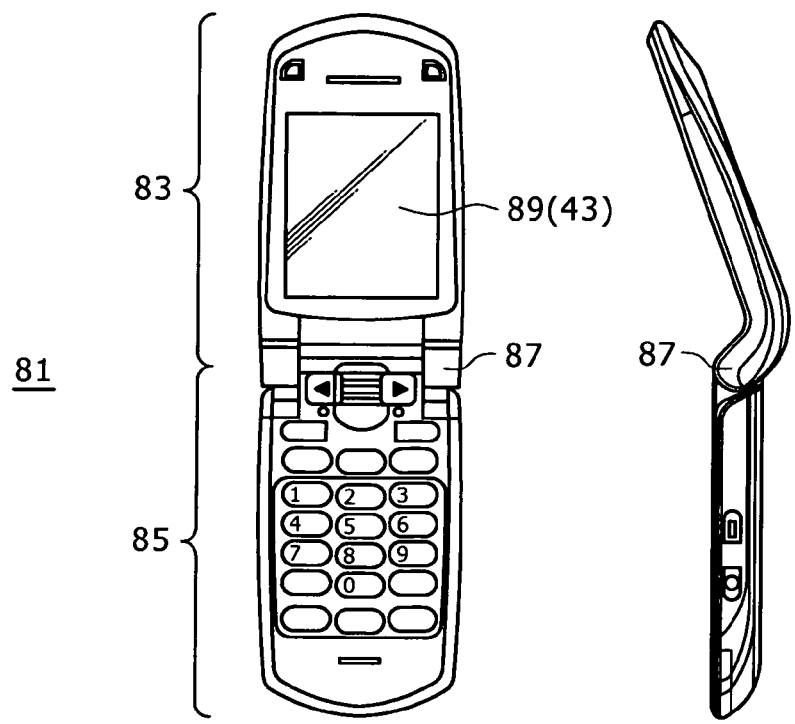
FIGS. 78A and 78B are diagrams showing a commercial product example of the electronic apparatus.
Figure 78B:
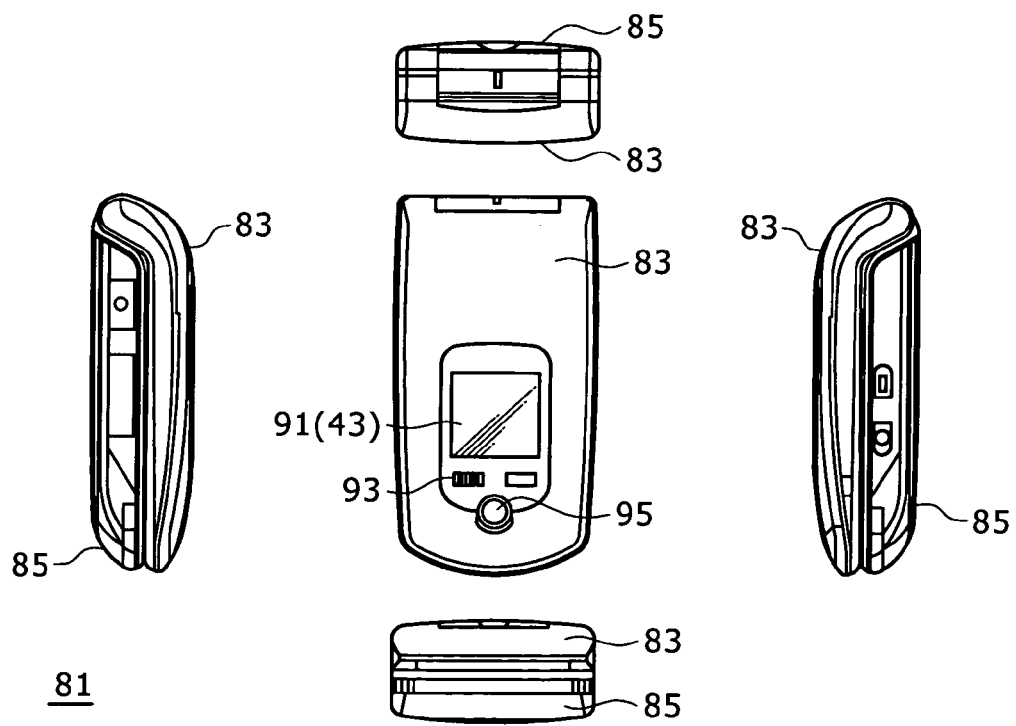

Furthermore, e.g. a portable terminal device is available as this kind of electronic apparatus. FIG. 78 shows an appearance example of a cellular phone 81 as the portable terminal device. The cellular phone 81 shown in FIG. 78 is a foldable type. FIG. 78A shows an appearance example of the opened state, and FIG. 78B shows an appearance example of the folded state.

The cellular phone 81 includes an upper case 83, a lower case 85, a connection (hinge, in this example) 87, a display screen 89, an auxiliary display screen 91, a picture light 93, and an imaging lens 95. The display screen 89 and the auxiliary display screen 91 correspond to the display panel 43 of FIG. 74.

Figure 79:
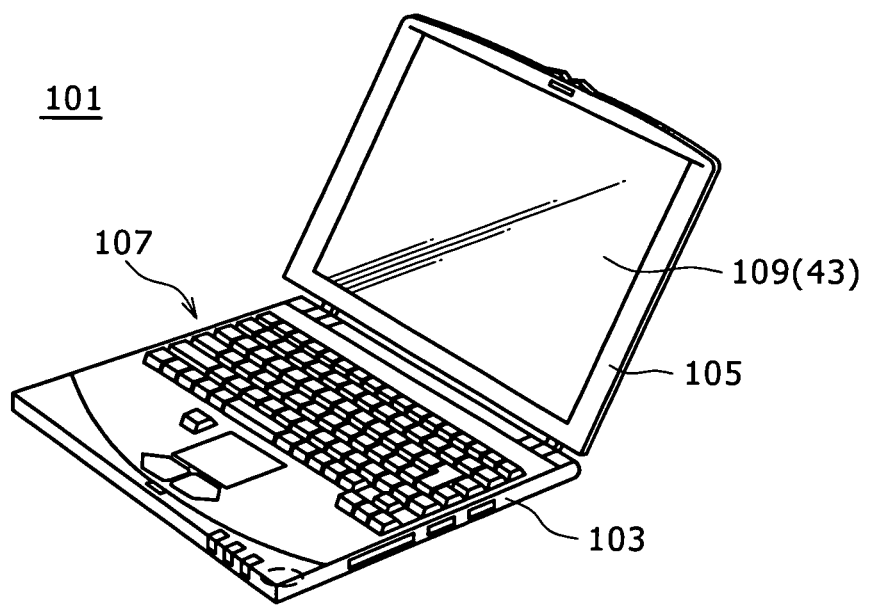
FIG. 79 is a diagram showing a commercial product example of the electronic apparatus.

Furthermore, e.g. a computer is available as this kind of electronic apparatus. FIG. 79 shows an appearance example of a notebook computer 101.

The notebook computer 101 includes a lower case 103, an upper case 105, a keyboard 107, and a display screen 109. The display screen 109 corresponds to the display panel 43 of FIG. 74.

Besides the above-described devices, an audio reproduction device, a game machine, an electronic book, an electronic dictionary, and so on are available as the electronic apparatus.

(C-3) Application to Devices other than Drive Circuit in Display Panel

In the above description, the shift register circuit is applied to a drive circuit that transfers a control pulse in the vertical direction of the display panel.

However, this shift register circuit can be applied also to transferring of the control pulse in the horizontal direction. Furthermore, it can be applied to all of the shift register circuits used on a display panel. In addition, the shift register circuit is a basic circuit having high versatility and therefore can be applied to all of semiconductor devices including a shift register circuit.

The present application contains subject matter related to that disclosed in Japanese Priority Patent Application JP 2008-096716 filed in the Japan Patent Office on Apr. 3, 2008, the entire contents of which is hereby incorporated by reference.

(C-4) Others

Various modifications might be incorporated into the above-described form examples without departing from the scope of the present invention. In addition, various modifications and applications that are created or combined based on the description of the present specification are also possible.

What is claimed is:

1. A shift register circuit that is formed on an insulating substrate with thin film transistors having channels of the same conductivity type and includes shift stages, each of the shift stages comprising:

a first thin film transistor configured to have one main electrode connected to a clock input terminal and the other main electrode connected to an output terminal;

a second thin film transistor configured to have one main electrode connected to the output terminal and the other main electrode connected to a first power supply;

a 3(1)-th thin film transistor configured to have one main electrode connected to the first power supply and the other main electrode connected to a control interconnect of the second thin film transistor;

a 3(2)-th thin film transistor configured to have one main electrode connected to the first power supply, the other main electrode electrically connected to the control interconnect of the second thin film transistor, and a control electrode electrically connected to a control interconnect of the first thin film transistor;

a 4(1)-th thin film transistor configured to have one main electrode connected to the first power supply and the other main electrode electrically connected to the control interconnect of the first thin film transistor;

a 4(2)-th thin film transistor configured to have one main electrode connected to the first power supply, the other main electrode connected to the control interconnect of the first thin film transistor, and a control electrode electrically connected to the control interconnect of the second thin film transistor;

a fifth thin film transistor configured to have one main electrode connected to a second power supply, the other main electrode connected to the control interconnect of the second thin film transistor, and a control electrode electrically connected to a control interconnect of the 4(1)-th thin film transistor and a second input terminal; and a sixth thin film transistor configured to have one main electrode connected to the second power supply, the other main electrode connected to the control interconnect of the first thin film transistor, and a control electrode connected to a control interconnect of the 3(1)-th thin film transistor and a first input terminal.

2. The shift register circuit according to claim 1, wherein for each of the shift stages except the first shift stage and the final shift stage, the output terminal of the previous shift stage is connected to the first input terminal and the output terminal of the subsequent shift stage is connected to the second input terminal, a start pulse is input to the first input terminal of the first shift stage, an end pulse is input to the second input terminal of the final shift stage, and signal amplitude of the start pulse and the end pulse is smaller than signal amplitude of a clock signal output from the output terminal of each of the shift stages.

3. The shift register circuit according to claim 2, wherein control electrodes are formed on both sides of a channel layer in the first thin film transistor.

4. The shift register circuit according to claim 3, wherein W/L (W denotes channel width and L denotes channel length) of the fifth thin film transistor is equal to or larger than W/L of the 3(1)-th and 3(2)-th thin film transistors.

5. The shift register circuit according to claim 3, wherein the control electrode is formed on merely one side of a channel layer in the fifth thin film transistor, control electrodes are formed on both sides of a channel layer in each of the 3(1)-th and 3(2)-th thin film transistors.

6. The shift register circuit according to claim 3, wherein source-shield length of the fifth thin film transistor is smaller than source-shield length of the 3(1)-th and 3(2)-th thin film transistors.

7. The shift register circuit according to claim 4, wherein length of a lightly doped drain (LDD) region of the fifth thin film transistor is smaller than length of a lightly doped drain (LDD) region of the 3(1)-th and 3(2)-th thin film transistors.

8. The shift register circuit according to claim 1, wherein a start pulse is input to the first input terminal of the first shift stage of the shift stages, and the first input terminal of each of the shift stages except the first shift stage is connected to the output terminal of the previous shift stage, and two kinds of clock signals having phases adjacent to each other, of three kinds of clock signals having phases different from each other, are supplied to the clock input terminal and the second input terminal of each of the shift stages in such a way that phase combination of the two kinds of clock signals is cyclically shifted on a stage-by-stage basis.

9. A shift register circuit that is formed on an insulating substrate with thin film transistors having channels of the same conductivity type and includes shift stages, each of the shift stages comprising:

a first thin film transistor configured to have one main electrode connected to a clock input terminal and the other main electrode connected to an output terminal;

a second thin film transistor configured to have one main electrode connected to the output terminal and the other main electrode connected to a first power supply;

a third thin film transistor configured to have one main electrode connected to the first power supply, the other main electrode electrically connected to a control interconnect of the second thin film transistor, and a control electrode electrically connected to a control interconnect of the first thin film transistor;

a fourth thin film transistor configured to have one main electrode connected to the first power supply, the other main electrode connected to the control interconnect of the first thin film transistor, and a control electrode connected to the control interconnect of the second thin film transistor;

a fifth thin film transistor configured to have one main electrode connected to a second power supply, the other main electrode connected to the control interconnect of the second thin film transistor, and a control electrode electrically connected to a second input terminal; and a sixth thin film transistor configured to have one main electrode connected to the second power supply, the other main electrode connected to the control interconnect of the first thin film transistor, and a control electrode electrically connected to a first input terminal.

10. An electronic apparatus including a system controller, an operation input unit for the system controller, a pixel array part formed on an insulating substrate with thin film transistors having channels of the same conductivity type, and a drive circuit formed on an insulating substrate with thin film transistors having channels of the same conductivity type, each of shift stages of a shift register circuit serving as at least a part of the drive circuit comprising:

a first thin film transistor configured to have one main electrode connected to a clock input terminal and the other main electrode connected to an output terminal;

a second thin film transistor configured to have one main electrode connected to the output terminal and the other main electrode connected to a first power supply;

a 3(1)-th thin film transistor configured to have one main electrode connected to the first power supply and the other main electrode connected to a control interconnect of the second thin film transistor;

a 3(2)-th thin film transistor configured to have one main electrode connected to the first power supply, the other main electrode electrically connected to the control interconnect of the second thin film transistor, and a control electrode electrically connected to a control interconnect of the first thin film transistor;

a 4(1)-th thin film transistor configured to have one main electrode connected to the first power supply and the other main electrode electrically connected to the control interconnect of the first thin film transistor;

a 4(2)-th thin film transistor configured to have one main electrode connected to the first power supply, the other main electrode connected to the control interconnect of the first thin film transistor, and a control electrode electrically connected to the control interconnect of the second thin film transistor;

a fifth thin film transistor configured to have one main electrode connected to a second power supply, the other main electrode connected to the control interconnect of the second thin film transistor, and a control electrode connected to a control interconnect of the 4(1)-th thin film transistor and a second input terminal; and a sixth thin film transistor configured to have one main electrode connected to the second power supply, the other main electrode connected to the control interconnect of the first thin film transistor, and a control electrode connected to a control interconnect of the 3(1)-th thin film transistor and a first input terminal.

* * * * *